United States Patent
Yamazaki et al.

(10) Patent No.: US 6,549,047 B2
(45) Date of Patent: *Apr. 15, 2003

(54) VARIABLE DELAY CIRCUIT AND SEMICONDUCTOR INTEGRATED CIRCUIT DEVICE

(75) Inventors: Masafumi Yamazaki, Kawasaki (JP); Hiroyoshi Tomita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/945,618

(22) Filed: Sep. 5, 2001

(65) Prior Publication Data

US 2002/0008560 A1 Jan. 24, 2002

Related U.S. Application Data

(60) Continuation of application No. 09/635,666, filed on Aug. 10, 2000, now Pat. No. 6,304,117, which is a division of application No. 09/089,397, filed on Jun. 3, 1998, now Pat. No. 6,181,184.

(30) Foreign Application Priority Data

Jul. 29, 1997 (JP) ............................................. 9-203315

(51) Int. Cl.[7] ................................................. H03L 7/06
(52) U.S. Cl. ....................................... 327/158; 327/161
(58) Field of Search ................................ 327/149, 158, 327/161, 277, 285, 281; 331/1 A, 17, 25; 375/376

(56) References Cited

U.S. PATENT DOCUMENTS

| 4,894,791 A |   | 1/1990 | Jiang et al. ................ 364/570 |
|---|---|---|---|
| 5,185,540 A |   | 2/1993 | Boudry ........................ 307/603 |
| 5,416,436 A |   | 5/1995 | Rainard ....................... 327/270 |
| 5,497,263 A |   | 3/1996 | Masuda et al. .............. 327/278 |
| 5,939,913 A | * | 8/1999 | Tomita ........................ 327/158 |
| 5,944,933 A |   | 8/1999 | Yamanaka et al. .......... 327/158 |
| 5,946,268 A |   | 8/1999 | Iwamoto et al. ............ 365/233 |
| 5,963,069 A |   | 10/1999 | Jefferson et al. ........... 327/158 |
| 6,049,239 A | * | 4/2000 | Eto et al. .................... 327/158 |
| 6,125,157 A |   | 9/2000 | Donnelly et al. ........... 375/371 |
| 6,342,796 B2 | * | 1/2002 | Jung .......................... 327/141 |

FOREIGN PATENT DOCUMENTS

| DE | 43 30 600 A1 | 3/1994 |
|---|---|---|
| EP | 0 474 534 A1 | 3/1992 |
| EP | 0 539 832 A1 | 5/1993 |
| EP | 0 589 763 A1 | 3/1994 |
| WO | WO 93/16529 | 8/1993 |

* cited by examiner

Primary Examiner—Terry D. Cunningham
Assistant Examiner—Quan Tra
(74) Attorney, Agent, or Firm—Armstrong Westerman & Hattori, LLP

(57) ABSTRACT

A variable delay circuit includes a load on a signal transfer line, at least one transistor connected to the signal transfer line. Each transistor is controlled by a gate voltage thereof so that a signal on the signal transfer line is delayed in response to a magnitude of the gate capacitance connected thereto.

31 Claims, 44 Drawing Sheets

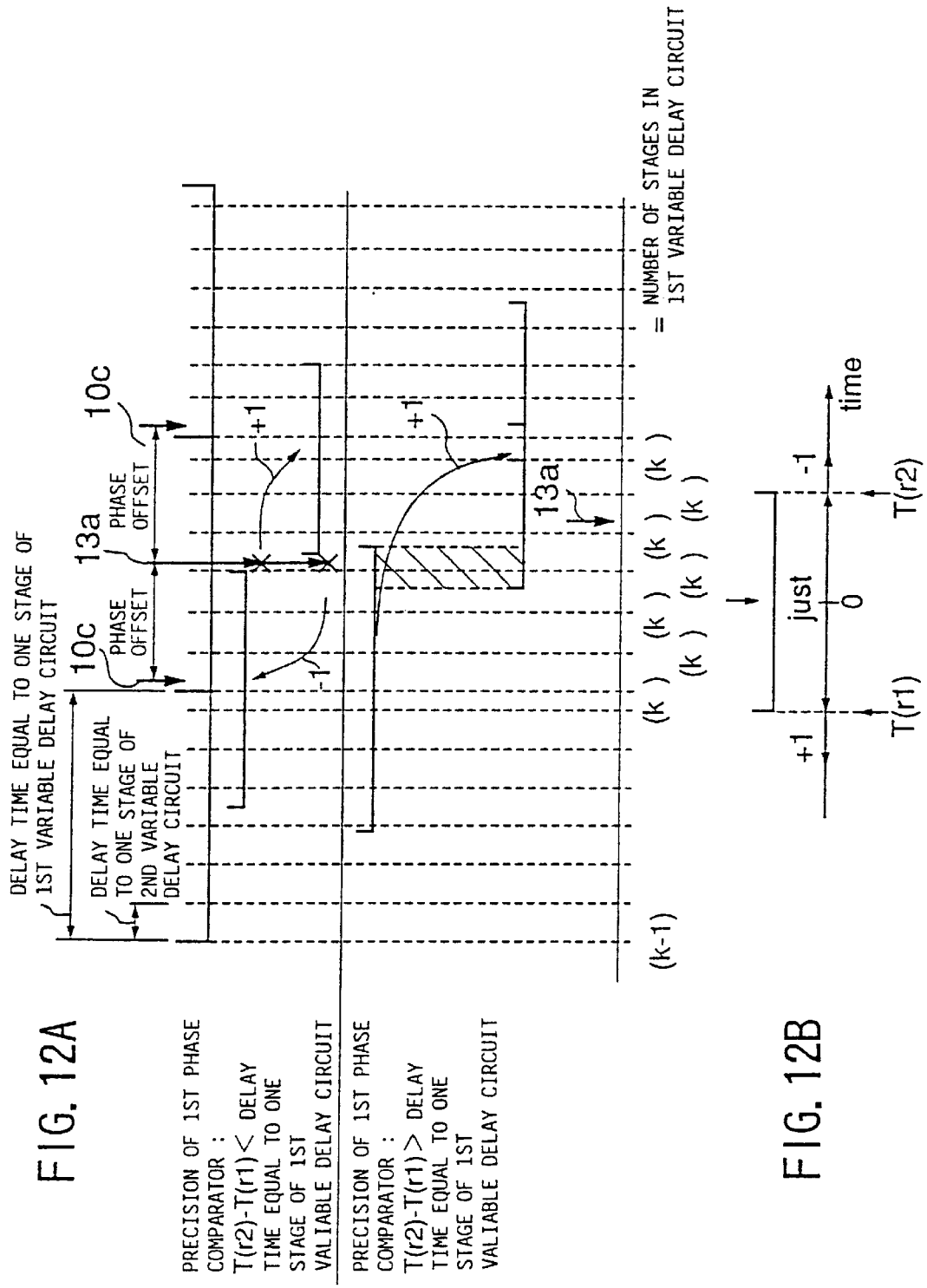

VARIABLE DELAY CIRCUIT AND SEMICONDUCTOR INTEGRATED CIRCUIT DEVICE

This application is a Continuation of prior application Ser. No. 09/635,666, filed Aug. 10, 2000, now U.S. Pat. No. 6,304,117 which is a Division of prior application Ser. No. 09/089,397 filed Jun. 3, 1998, now U.S. Pat. No. 6,181,184.

BACKGROUND OF THE INVENTION

1. Field of the Invention

The present invention relates to a variable delay circuit which controls a delay circuit provided on a transfer path to vary the delay time of the delay circuit and to a semiconductor integrated circuit device having such a delay circuit.

The circuit design mainstream utilizes clock synchronization due to the recent progress towards increasing of the operation speed and the integration density. Hence, it becomes important to suitably supply a given circuit with a clock that is synchronized with an external clock signal. The latest art uses a DLL (Delay Locked Loop) circuit having the minimum delay time unit equal to approximately 200 ps in order to generate an internal clock which is synchronism with the external clock. As the frequency of the internal clock is increased, it is required that a variable delay circuit using the DLL circuit has a higher precision.

2. The Description of the Related Art

A description will now be given, with reference to FIG. 1, of a conventional variable delay circuit.

The circuit shown in FIG. 1 has a four-stage delay circuit consisting of first, second, third and fourth delay circuits 201, 202, 203 and 204, respectively.

The first delay circuit 201 includes gates G201 and G202, and the second delay circuit 202 includes gates G203, G204 and G205. The third delay circuit 203 includes gates G206, G207 and G208, and the fourth delay circuit 204 includes gates G209, G210 and G211. The first through fourth delay circuits 201 through 204 are supplied with switch input signals via switch terminals (SW) P203 through P206. One of the switch input signals is switched to a high level (H), an input clock signal applied to an input terminal P201 is delayed by a delay time based on which one of the switch input signals is switched to the high level. A resultant delayed clock signal is output via an output terminal P202. Each of the gates G201–G211 has a unit delay time 1 td.

In the operation of the first delay circuit 201, the gate G201 is masked when the signal applied to the switch terminal P203 is at a low level (L). The output signal obtained at the output terminal 202 is always at the low level irrespective of whether the other input of the gate G201 is high or low. The gate 201 is released from the masked state when the signal applied to the switch terminal P203 is at the high level. If the potential of the other input of the gate G201 successively changes to the high level and the low level in this order, the output signal of the output terminal P202 is changed to the high level and the low level in this order. Hence, when the signal applied to the switch terminal P203 is at the high level, the delay time from the input terminal P201 to the output terminal P202 is equal to 2 td because the input signal passes through the two stages of gates therebetween.

In the operation of the second delay circuit 202, the gate G203 is masked when the signal applied to the switch terminal P204 is at the low level. The output signal of the output terminal P202 is always at the low level irrespective of whether the other input of the gate G203 is high or low. The gate 203 is released from the masked state when the signal applied to the switch terminal P204 is at the high level. If the potential of the other input of the gate G203 successively changes to the high level and the low level in this order, the output signal of the output terminal P202 is changed to the high level and the low level in this order. Hence, when the signal applied to the switch terminal P204 is at the high level, the delay time from the input terminal P201 to the output terminal P202 is equal to 4 td because the input signal passes through the four stages of gates therebetween.

Similarly, the output signal of the output terminal P202 obtained when the third delay circuit 203 or the fourth delay circuit 204 is activated by the switch signal applied to the switch terminal P205 or P206, respectively. If the switch signal applied to the switch terminal P205 is at the high level, the delay time provided from the input terminal P201 to the output terminal P202 is equal to 6 td, which corresponds to 6 gates. When the switch signal applied to the switch terminal P206 is at the high level, the delay time from the input terminal P201 to the output terminal P202 is equal to 8 td, which corresponds to 8 gates.

Hence, the conventional variable delay circuit having four stages of delay circuits is capable of providing the variable times equal to 2 td to 8 td.

A description will now be given, with reference to FIG. 2, of a conventional DLL circuit utilizing the above-mentioned conventional variable delay circuit.

Referring to FIG. 2, a conventional DLL circuit 210 includes a variable delay circuit 212, a phase comparator circuit 215, and a delay control circuit 216. The variable delay circuit 212 delays an external clock signal received by an input circuit 211 by a given delay time, and outputs the delayed external clock signal to an output circuit 213. The phase comparator circuit 215 compares the phase of a reference signal "ref" supplied from the input circuit 211 with the phase of a signal "in" output by a dummy circuit 214. The signal output by the dummy circuit 214 has a delay time equal to the sum of the delay times of the input circuit 211, the variable delay circuit 212 and the output circuit 213 and the delay times of wiring lines provided between the input circuit 211 and the output circuit 213. The conventional DLL circuit 210 thus configured functions to delay the clock signal from the input circuit 211 with a precision of approximately 200 ps so that the output clock signal having a predetermined phase relationship with the clock signal from the input circuit 211.

A description will now be given, with reference to FIG. 3, of a phase setting process of the DLL circuit 210. In FIG. 3, a symbol "ref" denotes the reference signal output by the input circuit 211, and a symbol "in" denotes the signal output by the dummy circuit 214. The DLL circuit 210 delays the external clock received via the input circuit 211 by a given delay time through the variable delay circuit 212. The output circuit 213 receives the delayed clock signal from the variable delay circuit 212 and supplies a circuit of the following stage with the clock signal which has been pulled in phase with the external clock signal.

The dummy circuit 214 supplies the phase comparator circuit 215 with the signal "in" having the same delay time as that equal to the sum of the delay times of the input circuit 211, the variable delay circuit 212 and the output circuit 213 and the delay times of the wiring lines provided therebetween (step S101). The input circuit 211 outputs, as the reference signal "ref", the external clock signal to the phase comparator circuit 215 (step S101). The phase comparator circuit 215 determines whether the signals "ref" and "in" are in phase (step S102). If the signals "ref" and "in" are out of phase, the relative phase relationship therebetween is determined (step S102).

If the signals "ref" and "in" are in phase ("just" at step S102), the delay control circuit 216 holds the current delay time of the variable delay circuit 212, and the phase comparator circuit 215 periodically performs the phase comparing operation.

If it is discerned, at step S102, that the signal "ref" from the input circuit 211 lags behind the signal "in" ("–1" at step S102), the phase comparator circuit 215 detects the phase difference therebetween. The delay control circuit 216 controls, based on the detected phase difference, the variable delay circuit 212 to reduce the delay time one stage by one stage (step S103). Then, the process returns to step S101 so that the steps S101 and S102 via step S103 are repeatedly carried out at predetermined intervals.

If it is discerned, at step S102, that the signal "in" from the dummy circuit 214 lags behind the signal "ref" ("+1" of step S102), the phase comparator circuit 215 detects the phase difference therebetween. The delay control circuit 216 controls, based on the detected phase difference, the variable delay circuit 212 to increase the delay time one stage by one stage (step S104). Then, the process returns to step S101 so that the steps S101 and S102 via step S104 are repeatedly carried out at predetermined intervals.

However, the conventional variable delay circuits as shown in FIG. 1 have a disadvantage in which a delay time shorter than the unit delay time 2 td, for example, a delay time 1 td cannot be obtained and the precision is restricted to 2 td.

SUMMARY OF THE INVENTION

It is a general object of the present invention to provide a variable delay circuit in which the above disadvantage is eliminated.

A more specific object of the present invention is to provide a variable delay circuit which has a shorter delay time and a capability of controlling the delay time with a higher precision.

The above objects of the present invention are achieved by a variable delay circuit comprising: a load on a signal transfer line, at least one transistor connected in parallel with the signal transfer line, wherein a gate capacitance of each of the above at least one transistor being controlled by a gate voltage thereof so that a signal on the signal transfer line is delayed in response to a magnitude of the gate capacitance connected thereto. A fine control of the gate capacitance can be realized by the gate voltage. Hence, the delay time by which the input signal is delayed can finely be varied.

The variable delay circuit may be configured so that there is provided, in the signal transfer line, a plurality of transistors connected in parallel, and the plurality of transistors provide delay times varied in arithmetical series. Hence, the input signal can be delayed by the delay time which is varied in arithmetical series.

The variable delay circuit may be configured so that there is provided, in the signal transfer line, a plurality of transistors connected in parallel, and the plurality of transistors provide delay times varied in geometrical series. Hence, the input signal can be delayed by the delay time which is varied in geometrical series.

The above objects of the present invention are also achieved by a variable delay circuit comprising: a delay circuit functioning as a load on a signal transfer line, the delay circuit being connected in parallel with the signal transfer line and comprised of a plurality of transistors connected in series, a gate capacitance of at least one of the plurality of transistor being controlled by a gate voltage thereof so that a signal on the signal transfer line can be delayed by a delay time varied based on the gate capacitance. A fine control of the gate capacitance can be realized by the gate voltage. Hence, the delay time by which the input signal is delayed can finely be varied.

The above objects of the present invention are also achieved by a variable delay circuit comprising: a plurality of delay circuits connected in parallel with a signal transfer line, each of the delay circuits functioning as a load on the signal transfer line, each of the delay circuits comprising a respective capacitor having a different capacitance, one of the delay circuits being connected so that the capacitor of the above one of the delay circuits is connected in parallel with the signal transfer line. Thus, the delay time can be varied by determining the delay circuit to be selected.

The above objects of the present invention are also achieved by a semiconductor integrated circuit device comprising: a first variable delay circuit having delay circuits each capable of delaying an input signal, the first variable delay circuit having a plurality of stages of delay circuits; a second variable delay circuit each having a signal delay function having a precision higher than that of the first variable delay circuit, the second variable delay circuit having a plurality of stages of delay circuits; first and second phase comparator circuits respectively performing comparing operations on an input clock signal and an output clock signal with respective precisions of the first and second variable delay circuits; first and second delay control circuits respectively controlling delay times of the first and second variable delay circuits on the basis of results of the phase comparing operations; and a number-of-stages setting circuit determining a number of stages of the second variable delay circuit on the basis of a first delay time obtained when the input clock signal passes through n stages of the second variable delay circuit and a second delay time obtained when the input clock signal passes through n+1 stages thereof.

The semiconductor integrated circuit device may be configured so that the number-of-stages setting circuit determines the number of stages so that a delay time equal to one stage of the first variable delay circuit is equal to or greater than the first delay time but equal to or less than the second delay time.

The semiconductor integrated circuit device may be configured so that the first and second variable delay circuits are connected in this order or vice versa.

The semiconductor integrated circuit device may be configured so that: the first and second delay control circuits control the first and second variable delay circuits to increase the number of stages of the first variable delay circuit by one and decrease the delay time of the second variable delay circuit in a case where there is a need to provide a delay time exceeding a maximum delay time of the second variable delay circuit; and the first and second delay control circuits control the first and second variable delay circuits to decrease the number of stages of the first variable delay circuit by one and increase the delay time of the second variable delay circuit in a case where there is a need to provide a delay time less than a minimum delay time of the second variable delay circuit.

The semiconductor integrated circuit device may be configured so that the delay time of one stage of the first variable delay circuit is adjusted by an external command.

The semiconductor integrated circuit device may be configured so that a time equal to the precision of the first phase comparator circuit is longer than the delay time of one stage of the first variable delay circuit.

The semiconductor integrated circuit device may be configured so that the first phase comparator circuit has a reference for varying the delay time, the reference being located within a range equal to one stage of the first variable delay circuit, the period starting from a rising edge of one of the input and output clock signals.

The semiconductor integrated circuit device may be configured so that the second phase comparator circuit has a reference for varying the delay time, the reference being located within a range equal to one stage of the second variable delay circuit, the period starting from a rising edge of one of the input and output clock signals.

The semiconductor integrated circuit device may be configured so as to further comprise a timing generating circuit which defines a timing for the phase comparing operations of the first and second phase comparator circuits.

The semiconductor integrated circuit device may further comprise first and second shift signal generating circuits which generate first and second shift signals which instruct the first and second delay control circuits to vary the delay times of the first and second variable delay circuits on the basis of results of the phase comparing operations by the first and second phase comparator circuits.

The semiconductor integrated circuit device may be configured so that the first and second shift signal generating circuits instruct the first and second delay control circuits to vary the delay times at respective timings.

The semiconductor integrated circuit device may further comprise a frequency dividing circuit which frequency-divides an external clock signal so that a reference signal used in the phase comparing operations by the first and second phase comparator circuits can be generated.

The semiconductor integrated circuit device may be configured so that the frequency dividing circuit has a frequency dividing ratio which is increased when the results of the phase comparing operations of the first and second phase comparator circuits show that there is no need to vary the delay times of the first and second variable delay circuits and which is decreased when the result of the phase comparing operation of the first phase comparator circuit shows that there is a need to vary the delay time of the first variable delay circuit.

The semiconductor integrated circuit device may be configured so that the frequency dividing circuit has a frequency dividing ratio which is decreased when the result of the phase comparing operation of the second phase comparator circuit shows there is a need to vary the delay time of the second variable delay circuit and change the number of stages thereof in an identical direction a plurality of number of times.

The semiconductor integrated circuit device may be configured so that the plurality of number of times is set by an external command.

The semiconductor integrated circuit device may be configured so that it further comprises: a frequency dividing circuit which frequency-divides an external clock signal; and a third phase comparator circuit comparing the external clock signal with a clock signal from the first or second variable delay circuit and instructing the frequency dividing circuit to successively change a frequency dividing ratio on the basis of a result of a phase comparing operation of the third phase comparator circuit.

The semiconductor integrated circuit device may be configured so that the third phase comparator circuit instructs the frequency dividing circuit to increase the frequency dividing ratio when the third phase comparator circuit judges that there is no need to vary the delay times of the first and second variable delay circuits.

The semiconductor integrated circuit device may be configured so that the third phase comparator circuit instructs the frequency dividing circuit to decrease the frequency dividing ratio when the third phase comparator circuit judges that there is a need to vary the delay times of the first and second variable delay circuits.

The semiconductor integrated circuit device may be configured so that the third phase comparator circuit instructs the frequency dividing circuit to decrease the frequency dividing ratio when the third phase comparator circuit judges that there is a need to vary the delay times of the first and second variable delay circuits and successively change the number of stages thereof in an identical direction a plurality of number of times.

The semiconductor integrated circuit device may be configured so that the plurality of number of times is set by an external command.

The semiconductor integrated circuit device may be configured so that the frequency dividing circuit has a frequency dividing ratio which is decreased at the time of power on.

The semiconductor integrated circuit device may be configured so that the first variable delay circuit has a predetermined delay time at the time of power on.

The semiconductor integrated circuit device may be configured so that the second phase comparator circuit stops operating while the number of stages of the first variable delay circuit is being adjusted on the basis of the result of the phase comparing operation of the first phase comparing circuit.

The semiconductor integrated circuit device may further comprise an input circuit outputting an internal clock signal synchronized with an external clock signal, the internal clock signal being applied to an internal circuit of the semiconductor integrated circuit device.

The semiconductor integrated circuit device may further comprise a low-pass filter via which electricity is supplied to the internal circuit.

The semiconductor integrated circuit device may further comprise a power supply voltage generating circuit which steps down an external power supply voltage, a resultant step-down voltage being applied to a DLL circuit having the first and second variable delay circuits, the first and second phase comparing circuits, the first and second delay control circuits and the number-of-stages setting circuit.

The semiconductor integrated circuit device may further comprise a low-pass filter via which the DLL circuit is grounded.

The semiconductor integrated circuit device may further comprise a capacitor connected in parallel with the DLL circuit.

The semiconductor integrated circuit device may further comprise a pad for making an external connection to the low-pass filter, so that the low-pass filter is grounded via the pad.

The semiconductor integrated circuit device may further comprise a pad specifically used to supply external electricity to the power supply voltage generating circuit.

The semiconductor integrated circuit device may further comprise a first pad specifically provided for grounding the power supply voltage generating circuit and a second pad specifically provided for grounding the low-pass filter.

BRIEF DESCRIPTION OF THE DRAWINGS

Other objects, features and advantages of the present invention are achieved by the following detailed description when read in conjunction with the accompanying drawings, in which:

FIGS. 12A and 12B are diagrams showing the phase setting process;

DESCRIPTION OF THE PREFERRED EMBODIMENTS

Figure 4:
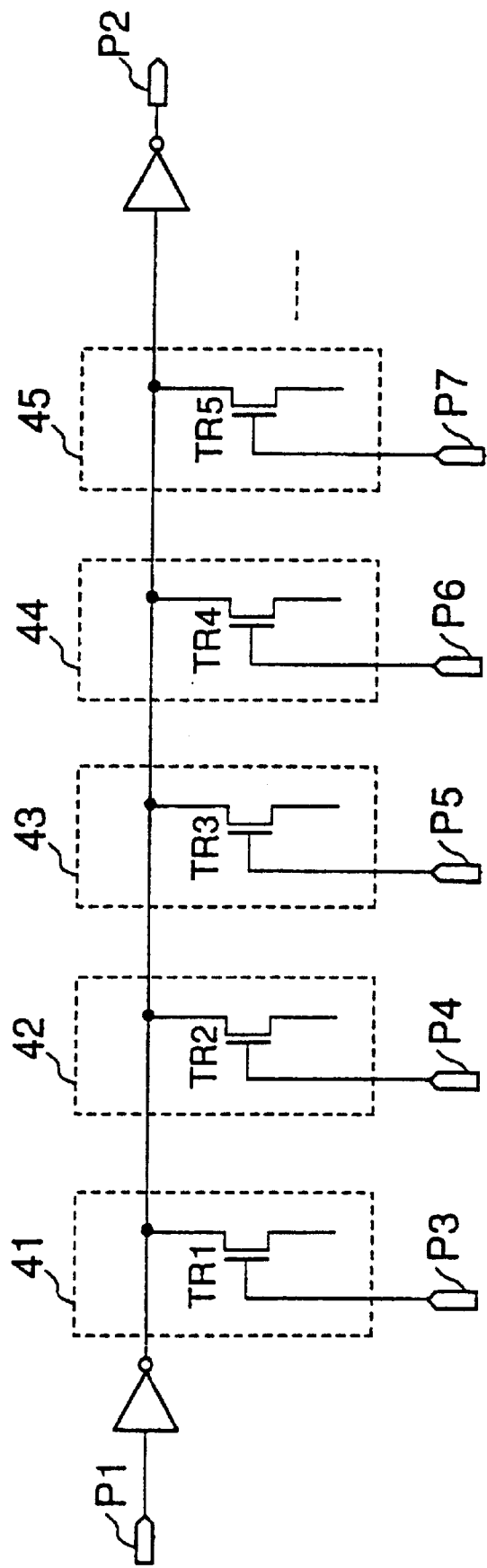
FIG. 4 is a circuit diagram of a first structure of a variable delay circuit according to the present invention.

FIG. 4 is a circuit diagram of a variable delay circuit according to an embodiment of the present invention. The variable delay circuit shown in FIG. 4 is connected to a transfer path extending from an input terminal P1 to an output terminal P2, and includes a plurality of delay circuits connected in parallel with the transfer path. The circuit configuration shown in FIG. 4 includes five delay circuits 41, 42, 43, 44 and 45. The delay time of the variable delay circuit can be controlled by controlling the variable delay circuits 41–45. The number of stages of the variable delay circuit is not limited to five as shown in FIG. 4 but may be equal to an arbitrary number.

The first through fifth delay circuits 41–45 include transistors TR1–TR5, respectively. The drains of the transistors TR1–TR5 are open, and the gates thereof receive switch signals via switch terminals P3–P7, respectively. The sources of the transistors TR1–TR5 are connected to the transfer path. The delay time of the variable delay circuit shown in FIG. 4 can be changed by varying the gate capacitance of at least one of the transistors TR1–TR5 by controlling the gate voltage.

The variable delay circuit shown in FIG. 4 has a small size and a capability of, varying the delay time with a high precision by controlling the gate capacitances of the transistors TR1–TR5. The transistors TR1–TR5 can be configured so as to have delay times in arithmetical series in which the delay times respectively implemented by each of the transistors TR1–TR5 are equal to each other. Alternatively, it is possible to arrange the transistors TR1–TR5 so as to have delay times in geometrical series in which the ratios of the delay times implemented by the individual transistors are equal to each other.

Figure 5:
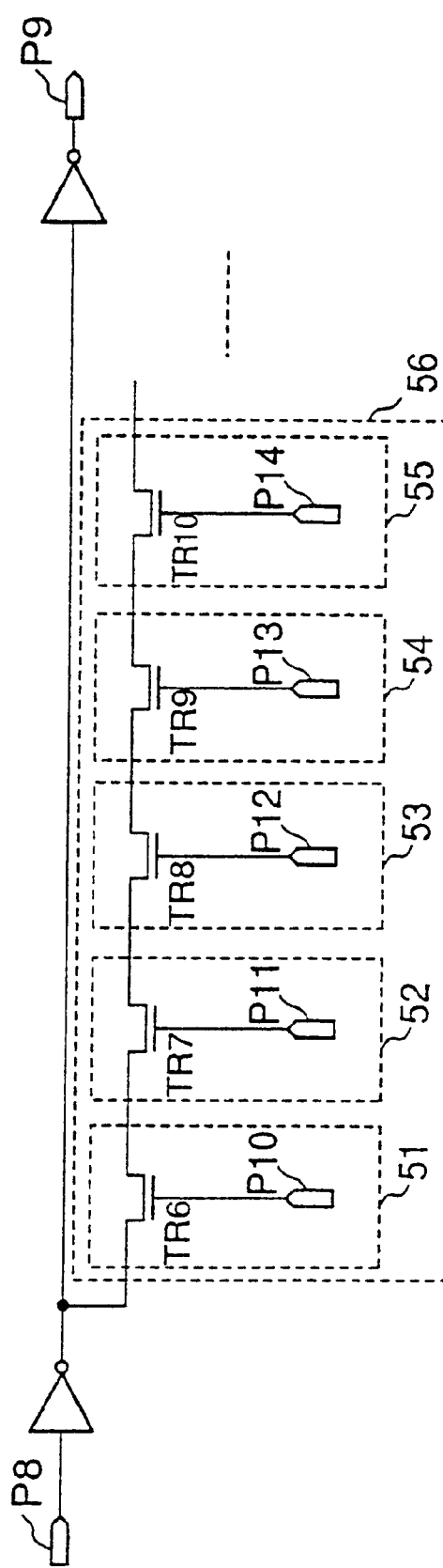
FIG. 5 is a circuit diagram of a second structure of the variable delay circuit according to the present invention.

Referring to FIG. 5, there is illustrated a configuration of the variable delay circuit according to another embodiment of the present invention. The variable delay circuit shown in FIG. 5 is connected to a transfer path extending from an input terminal P8 to an output terminal P9, and includes a delay circuit group 56 connected in parallel with the transfer path. The delay time of the variable delay circuit can be varied by controlling the delay circuit group 56, which includes five stages of delay circuits in FIG. 5. However, the delay circuit group 56 can have an arbitrary number of stages.

The delay circuit group 56 shown in FIG. 5 includes first through fifth delay circuits 51–55. The first delay circuit 51 includes a transistor TR6 having a source connected to the transfer path, a drain connected to the second delay circuit 52, and a gate to which a switch signal is applied via a switch terminal P10. The second delay circuit 52 includes a transistor TR7 having a source connected to the first delay circuit 51, a drain connected to the third delay circuit 53, and a gate to which a switch signal is applied via a switch terminal P11. The third delay circuit 53 includes a transistor TR8, which has a source connected to the second delay circuit 52, a drain connected to the fourth delay circuit 54, and a gate to which a switch signal is applied via a switch terminal P12. The fourth delay circuit 54 has a transistor TR9, which has a source connected to the third delay circuit 53, a drain connected to the fifth delay circuit 55 and a gate to which a switch signal is applied via a switch terminal P13. The fifth delay circuit 55 includes a transistor TR10, which has a source connected to the fourth delay circuit 54, a drain which is in the open state, and a gate to which a switch signal is applied via a switch terminal P14. The gate capacitance of at least one of the transistors TR6–TR10 can be changed by controlling the gate voltage starting from the switch terminal P10, so that the delay time of the variable delay circuit can be controlled. Thus, the variable delay circuit shown in FIG. 5 has a small size and a capability of varying the delay time with a high precision without increasing the circuit size.

Figure 6:
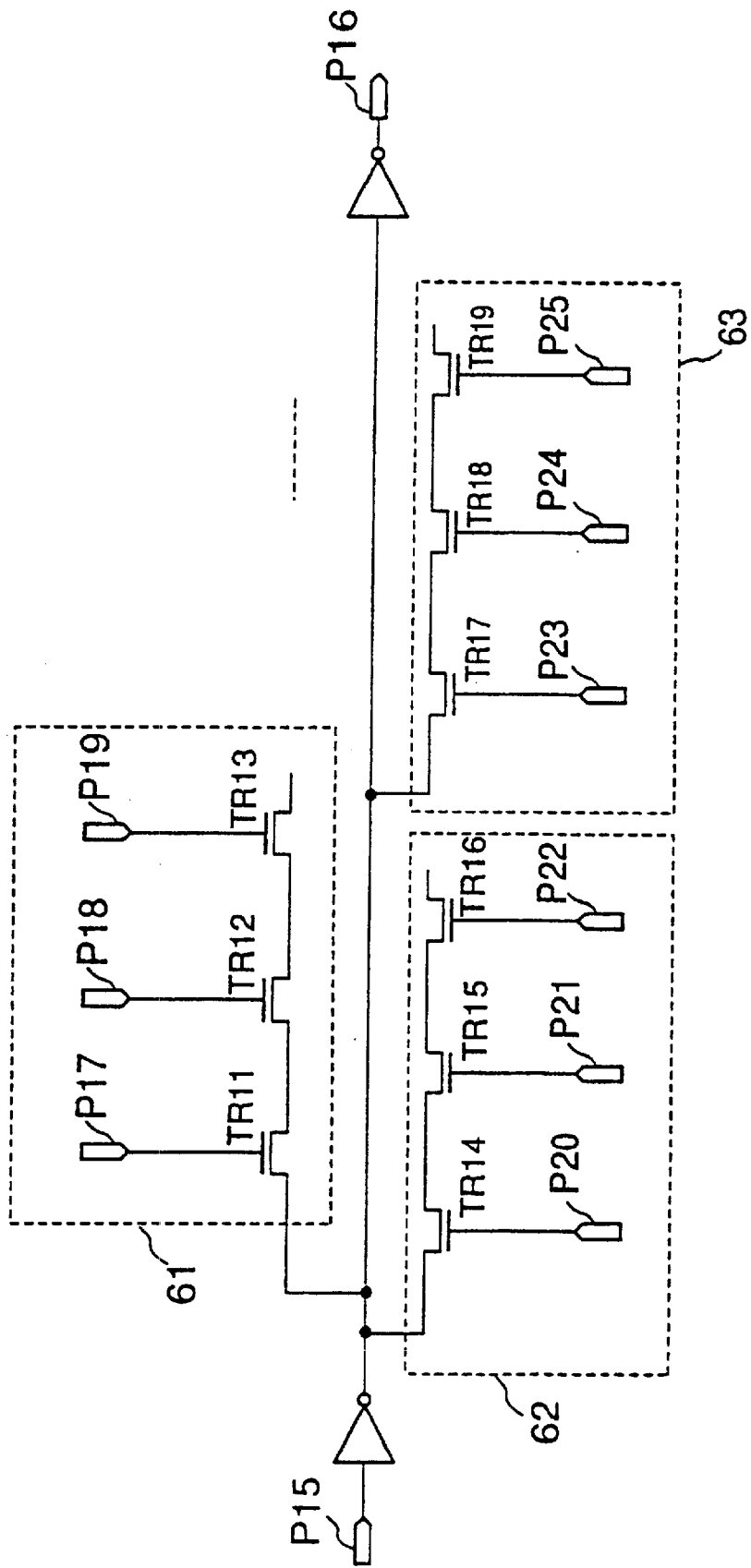
FIG. 6 is a circuit diagram of a third structure of the variable delay circuit according to the present invention.

FIG. 6 is a circuit diagram of the configuration of the variable delay circuit according to yet another embodiment of the present invention.

The variable delay circuit shown in FIG. 6 is connected to a transfer path extending from an input terminal P15 to an output terminal P16, and includes a first delay circuit group 61, a second delay circuit group 62, and a third delay circuit group 63. The delay time of the variable delay circuit can be varied by controlling any of the groups 61–63. The configuration shown in FIG. 6 is not limited to three but may include an arbitrary number of groups.

Each of the delay circuit groups 61, 62 and 63 is configured so as to have the same configuration as that of the delay circuit group 56 shown in FIG. 5. The first group 61 includes three transistors TR11, TR12 and TR13, which receive switch signals via switch terminals P17, P18 and P19, respectively. The second group 62 includes three transistors TR14, TR15 and TR16, which receive switch signals via switch terminals P20, P21 and P22, respectively. The third group 63 includes three transistors TR17, TR18 and TR19, which receive switch signals via switch terminals P23, P24 and P25, respectively. At least one of the three transistors in each group can be controlled starting from the respective first transistor connected to the transfer path, so that the delay time by which the signal on the transfer path is delayed by the variable delay circuit can be varied. Thus, the variable delay circuit shown in FIG. 6 has a small size and a capability of varying the delay time with a high precision.

Figure 7:
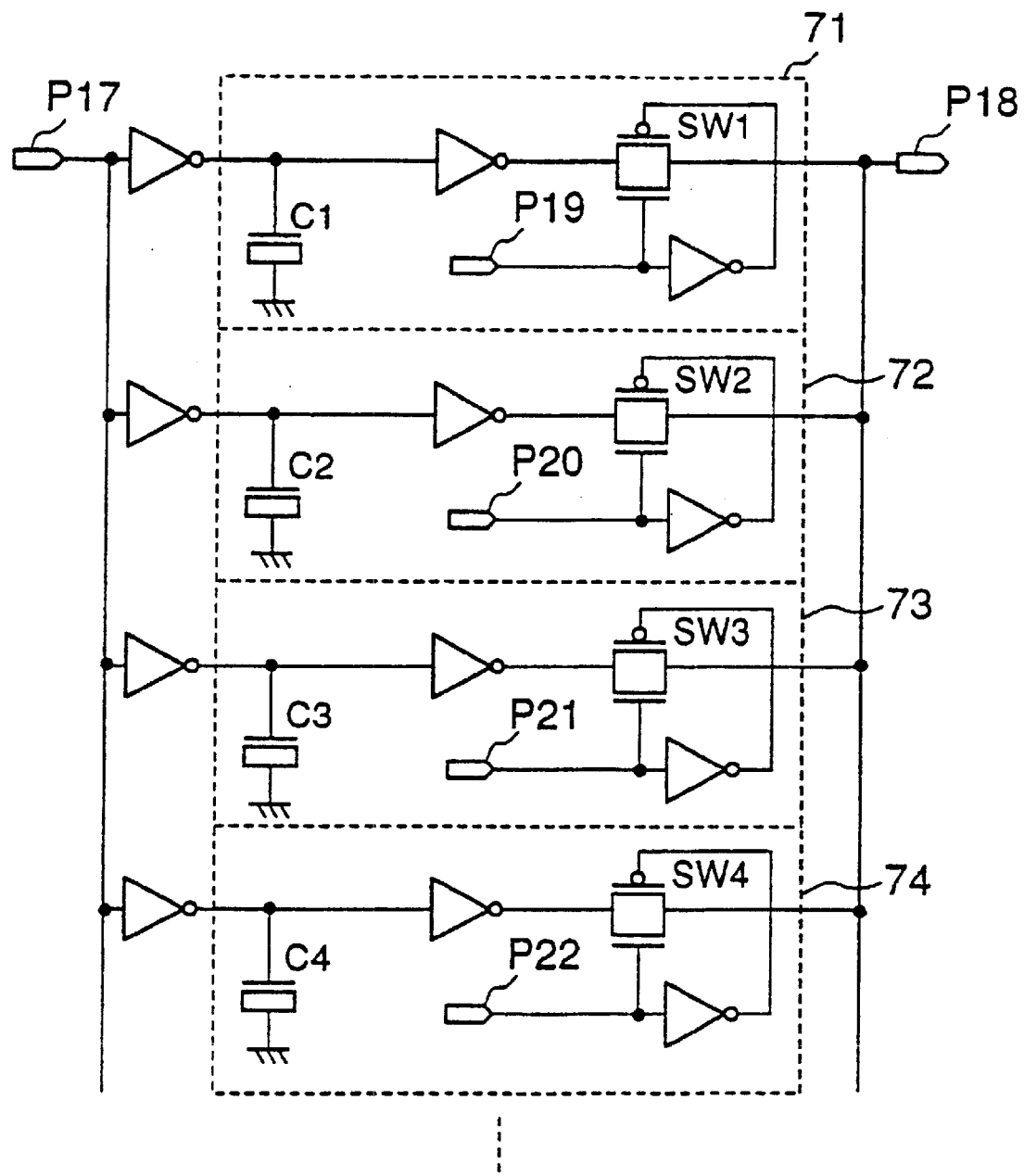
FIG. 7 is a circuit diagram of a fourth structure of the variable delay circuit according to the present invention.

FIG. 7 is a circuit diagram of a variable delay circuit according to a further embodiment of the present invention.

The variable delay circuit shown in FIG. 7 includes four transfer paths, each extending from an input terminal P17 to an output terminal P18, and four delay circuits 71, 72, 73 and 74 provided in the respective transfer paths. One of the delay circuits 71–74 can be selected to control the delay time. The configuration shown in FIG. 7 is limited to the four delay circuits 71–74, but may be equipped with an arbitrary number of delay circuits.

The delay circuits 71–74 respectively include capacitors C1–C4 respectively having different capacitance values, switches SW1–SW4 provided in series in the respective transfer lines, and switch terminals P19–P22 for controlling the switches SW1–SW4. Hence, the variable delay circuit shown in FIG. 7 has a small size and a capability of varying the delay time with a high precision by selecting at least one of the delay circuits 71—74.

Figure 8:
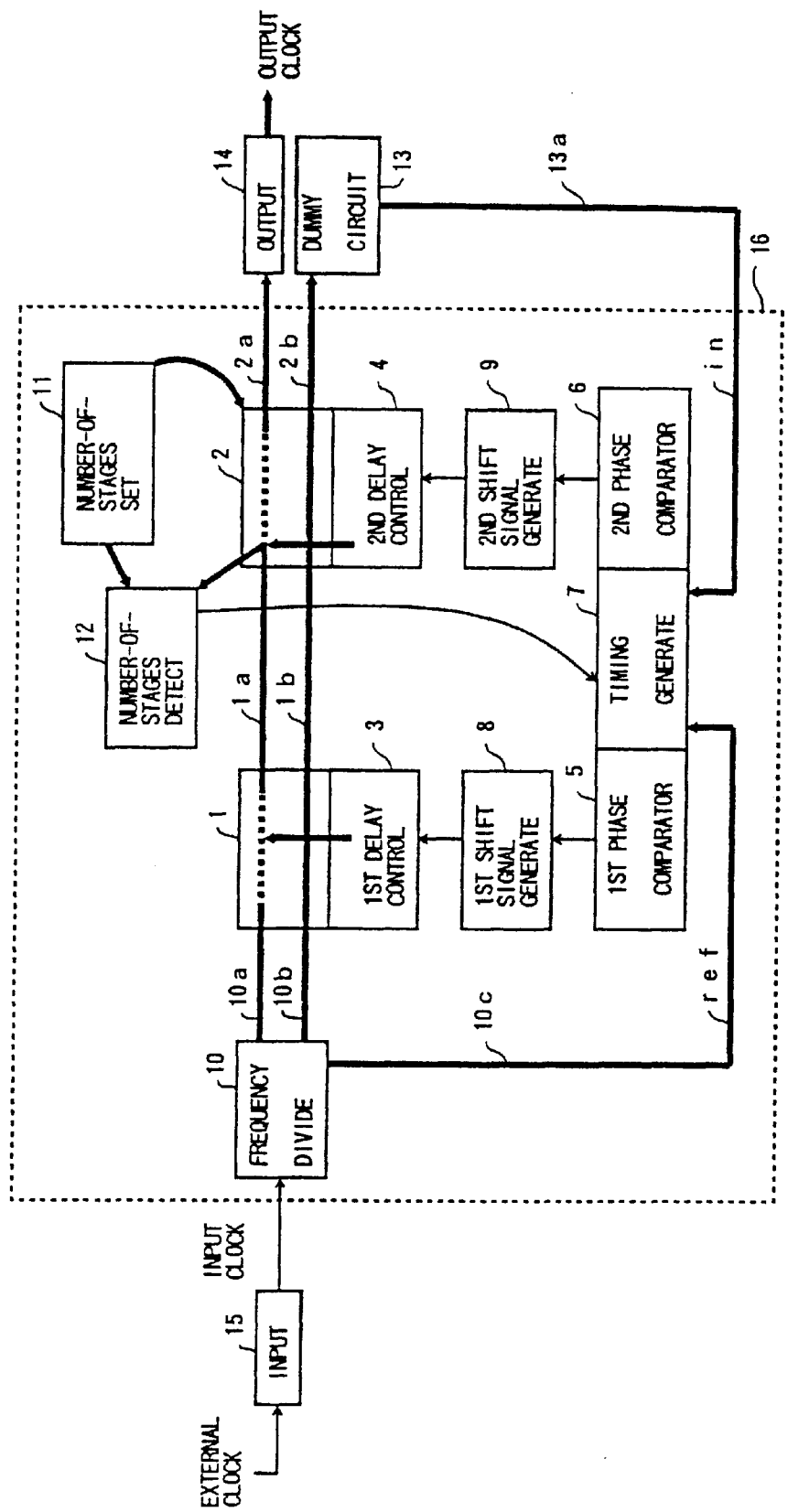
FIG. 8 is a block diagram of a DLL circuit according to the present invention.

FIG. 8 is a block diagram of a DLL circuit using the variable delay circuit of the present invention, which may have any of the configurations shown in FIGS. 4 through 7.

A DLL circuit 16 shown in FIG. 8 includes a first variable delay circuit 1, a second variable delay circuit 2, a first delay control circuit 3, a second delay control circuit 4, a first phase comparator circuit 5, a second phase comparator circuit 6, a timing generating circuit 7, a first shift signal generating circuit 8, a second shift signal generating circuit 9, a frequency dividing circuit 10, a number-of-stages setting circuit 11, and a number-of-stages detecting circuit 12. The DLL circuit 16 thus configured delays an input clock signal so that a delayed clock signal which is output as an output clock signal from an output circuit 14 has a predetermined phase relationship with the external clock signal.

Figure 1:
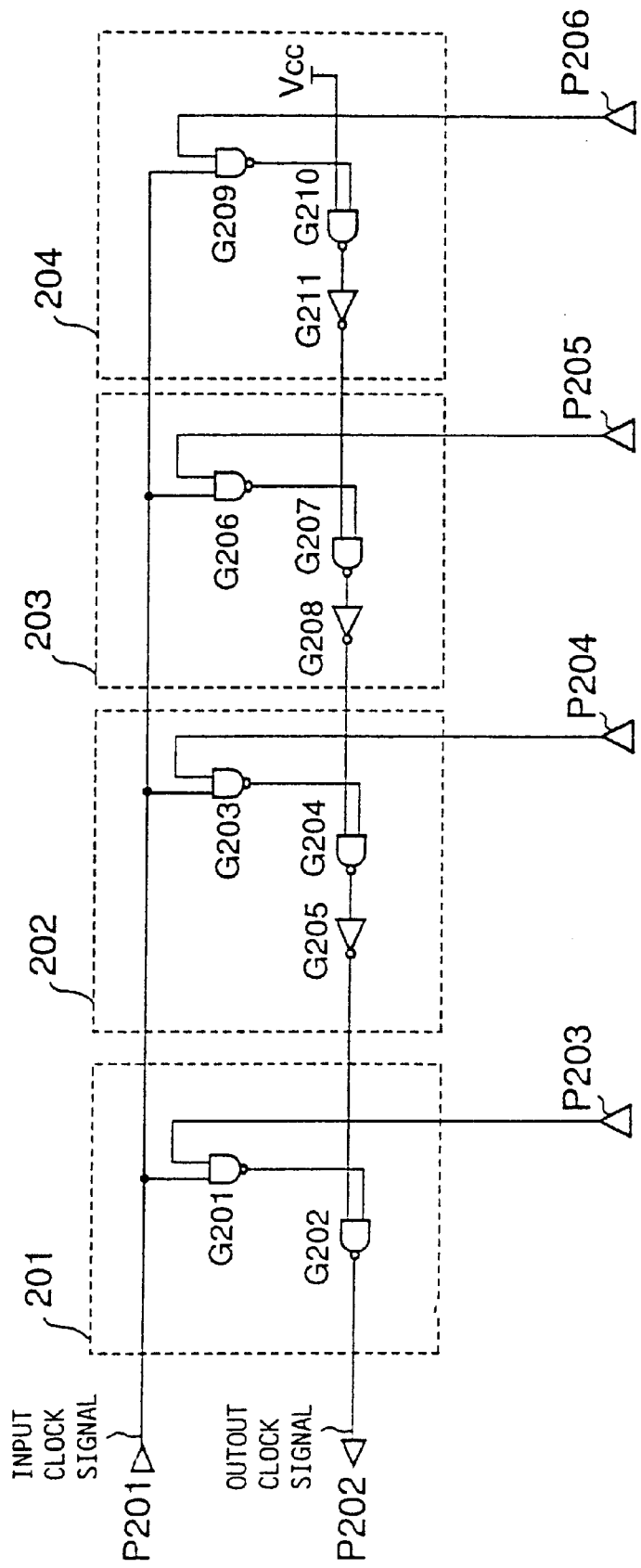
FIG. 1 is a circuit diagram of a conventional variable delay circuit.
Figure 2:
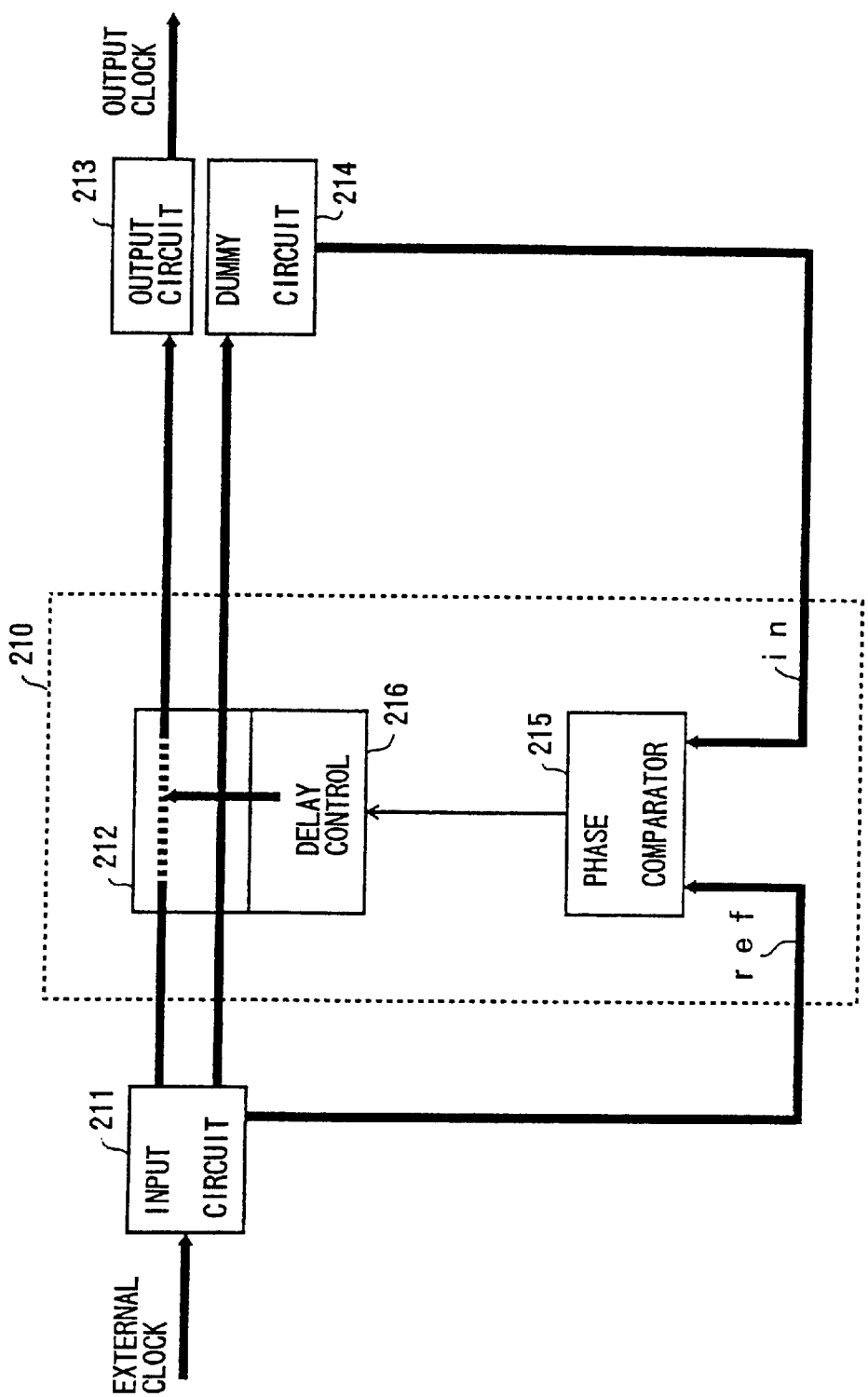
FIG. 2 is a block diagram of a conventional DLL circuit.
Figure 3:
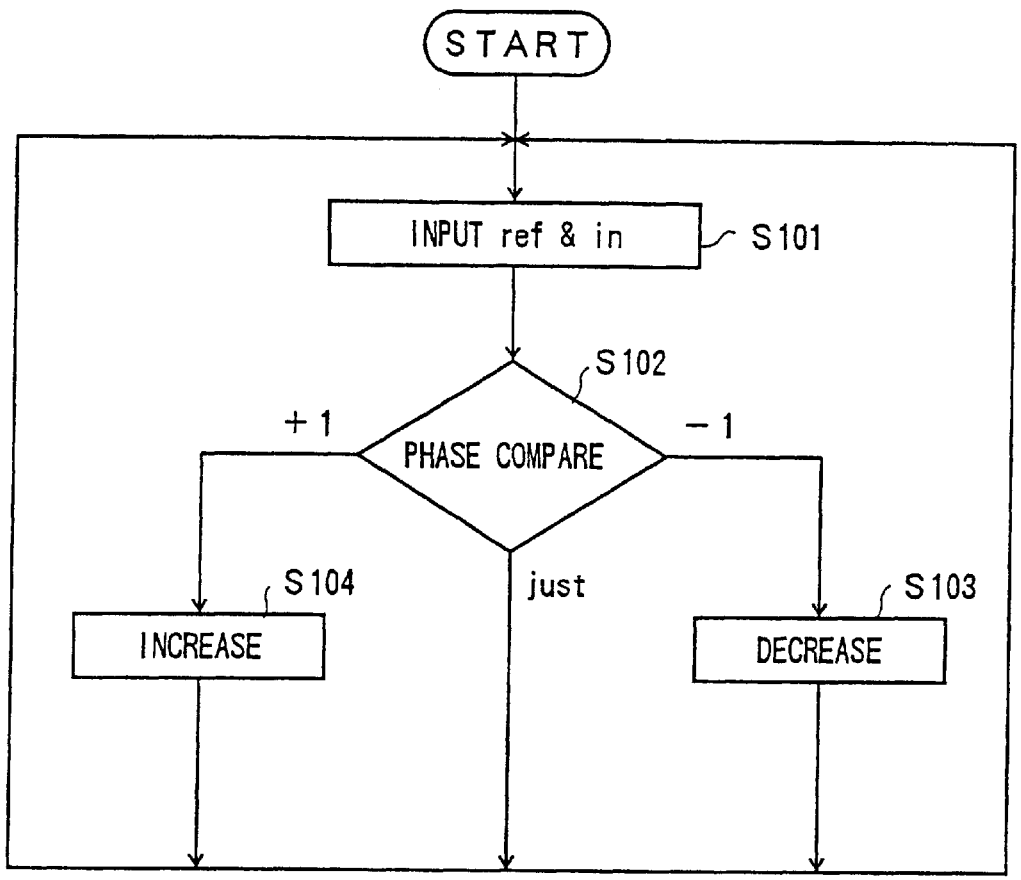
FIG. 3 is a flowchart of a conventional phase setting process.

The first variable delay circuit 1 may be configured as shown in FIG. 1, and more particularly controls the delay time with a comparatively low precision equal to, for example, 200 ps. The delay time can be varied in stepwise formation by changing the number of stages of delay circuits provided in the circuit 1.

The second variable delay circuit 2 can be configured according to the present invention and may have the same configuration as that shown in FIG. 4. The second variable delay circuit 2 is capable of controlling the delay time with a comparatively high precision. The term "comparatively high precision" means that the second variable delay circuit 2 has a higher precision than that of the first variable delay circuit 1. The delay time of the second variable delay circuit 2 can be varied by changing the gate capacitance of the built-in transistor or transistors by controlling the gate voltage or voltages. The second variable delay circuit 2 may be replaced by any of the circuits shown in FIGS. 5, 6 and 7.

The first delay control circuit 3 determines the number of stages of delay circuits with a comparatively low precision equal to, for example, 200 ps so that the output signal obtained by delaying the input clock signal has a given phase relationship with the external clock signal.

The second delay control circuit 4 determines, with a precision higher than that of the first delay control circuit 3, a delay time by which the output signal of the first variable delay circuit 1 is delayed by the second variable delay circuit 2, whereby the output signal obtained by delaying the clock signal from the circuit 1 has a given phase relationship with the external clock signal.

The first phase comparator circuit 5 compares, with a comparatively low precision, the phase of a reference signal "ref" obtained by dividing the frequency of the input clock signal with a given frequency dividing ratio in the frequency dividing circuit 10 with the phase of an output signal "in" from a dummy circuit 13, and detects a phase difference therebetween. The output signal "in" has a delay time equal to the sum of the delay times of the input circuit 15, the DLL circuit 16 and the output circuit 14.

The second phase comparator circuit 6 compares, with a comparatively high precision, the phase of the reference signal "ref" with the output signal "in", and detects a phase difference therebetween.

The timing generating circuit 7 generates a timing for writing of the output signals of the first and second phase comparing circuits 5 and 6 and an enable signal which allows updating of the first and second variable delay circuits 1 and 2.

The first shift signal generating circuit 8 functions to instruct, based on the phase difference detected by the first phase comparator circuit 5, the first delay control circuit 3 to increase or decrease the number of stages of delay circuits of the first variable delay circuit 1.

The second shift signal generating circuit 9 functions to instruct, based on the phase difference detected by the second phase comparator circuit 6, the second delay control circuit 4 to increase or decrease the delay time of the second variable delay circuit 2.

The frequency dividing circuit 10 divides the frequency of the input clock signal, and generates timings for execution of the phase comparing operations of the first and second phase comparing circuits 5 and 6.

The number-of-stages setting circuit 11 repeatedly compares the delay time of the input clock signal which has passed an arbitrary number n of stages with the delay time of the input clock signal which has passed the number (n+1) of stages, and determines the number n of stages so that the delay time of the input clock signal which has passed one stage of the first variable delay circuit 1 falls within the range between the delay time obtained when the input clock signal has passed n stages of the second variable delay circuit 2 and the delay time obtained when the input clock signal has passed (n+1) stages thereof.

The number-of-stages setting circuit 12 detects the number of stages of delay circuits in the second variable delay circuit 2, and outputs a detection signal when the maximum or minimum number of stages is detected.

The DLL circuit 16 thus configured operates as follows when a power supply is initiated.

When the circuit shown in FIG. 8 is supplied with electricity, the DLL circuit 16 controls the first variable delay circuit 1 to have a predetermined number of stages of delay circuits on the basis of a circuit delay time tin of the input circuit 15, circuit delay times t1 and t2 of the first and second variable delay circuits 1 and 2 and a circuit delay time tout of the output circuit 14. Hence, it is possible to reduce the number of times that the number of stages of delay circuits in the first variable delay circuit 1 is repeatedly increased or decreased based on the output of the first phase comparator circuit 5. The above predetermined number of stages of delay circuits in the first variable delay circuit 1 is selected so that the output clock signal having a given phase relationship with the input clock signal can be output when the input clock signal (more particularly, the external clock signal) is delayed by the sum of tin, t1, t2, tout and T where T is the delay time of the first variable delay circuit 1 corresponding to the predetermined number of stages of delay circuits therein. The delay time of one stage of the first variable delay circuit 1 can be set by a command externally supplied to the DLL circuit 16.

The external clock signal is delayed by the delay time tin in the input circuit 15 and is applied to the DLL circuit 16.

The frequency dividing circuit 10 of the DLL circuit 16 supplies the first variable delay circuit 1 with a signal 10a having the same frequency of that of the input clock signal. In the following description, the frequency dividing circuit 10 is neglected for the sake of convenience. The first variable delay circuit 1 supplies the second variable delay circuit 2 with a clock signal 1a having the time delay equal to the sum of t1 and T.

The second variable delay circuit 2 receives the clock signal 1a and delays it by the delay time t2. The delayed clock signal 1a is supplied to the output circuit 14 as a clock signal 2a. At the time of power on, the second variable delay circuit 2 is set so that the clock signal does not pass through any delay circuit stage. Hence, the clock signal is delayed by only the circuit delay time t2 of the second variable delay circuit 2.

The output circuit receives the clock 2a, which is delayed by the circuit delay time tout, and is then output as the output clock signal. As described above, the DLL circuit 16 delays the input clock signal by the sum of the delay times t1, T and t2.

At the time of power on, the maximum number n of stages of delay circuits in the second variable delay circuit 2 is not determined. The number-of-stages setting circuit 11 performs a predetermined process for determining the maximum number n of stages. In the above predetermined process, the number-of-stages setting circuit 11 calculates the delay time obtained when the clock signal has passed through an arbitrary number x of stages of the second variable delay circuit 2, and calculates the delay time obtained when the clock signal has passed through the (n+1) stages. The number-of-stages setting circuit 11 determines whether the delay time of one stage of the first variable delay circuit 1 is equal to or greater than the delay time equal to the n stages of the second variable delay circuit 2 but smaller than the delay time equal to the (n+1) stages. When the number-of-stages setting circuit 11 detects the value of x, it determines the value of x as being the maximum number n of stages of the second variable delay circuit. The above determination is repeatedly carried out until the value of x which meets the above condition is detected. Then, the number-of-stages setting circuit 11 notifies the second variable delay circuit 2 of the maximum number n of stages.

The maximum number of stages of delay circuits of the second variable delay circuit 2 can automatically be determined by the above-mentioned manner.

A description will now be given, with reference to FIG. 10, of a phase setting operation of the DLL circuit 16 in which the output signal is obtained which has a given phase relationship with the input clock signal from the input circuit 15.

Figure 10:
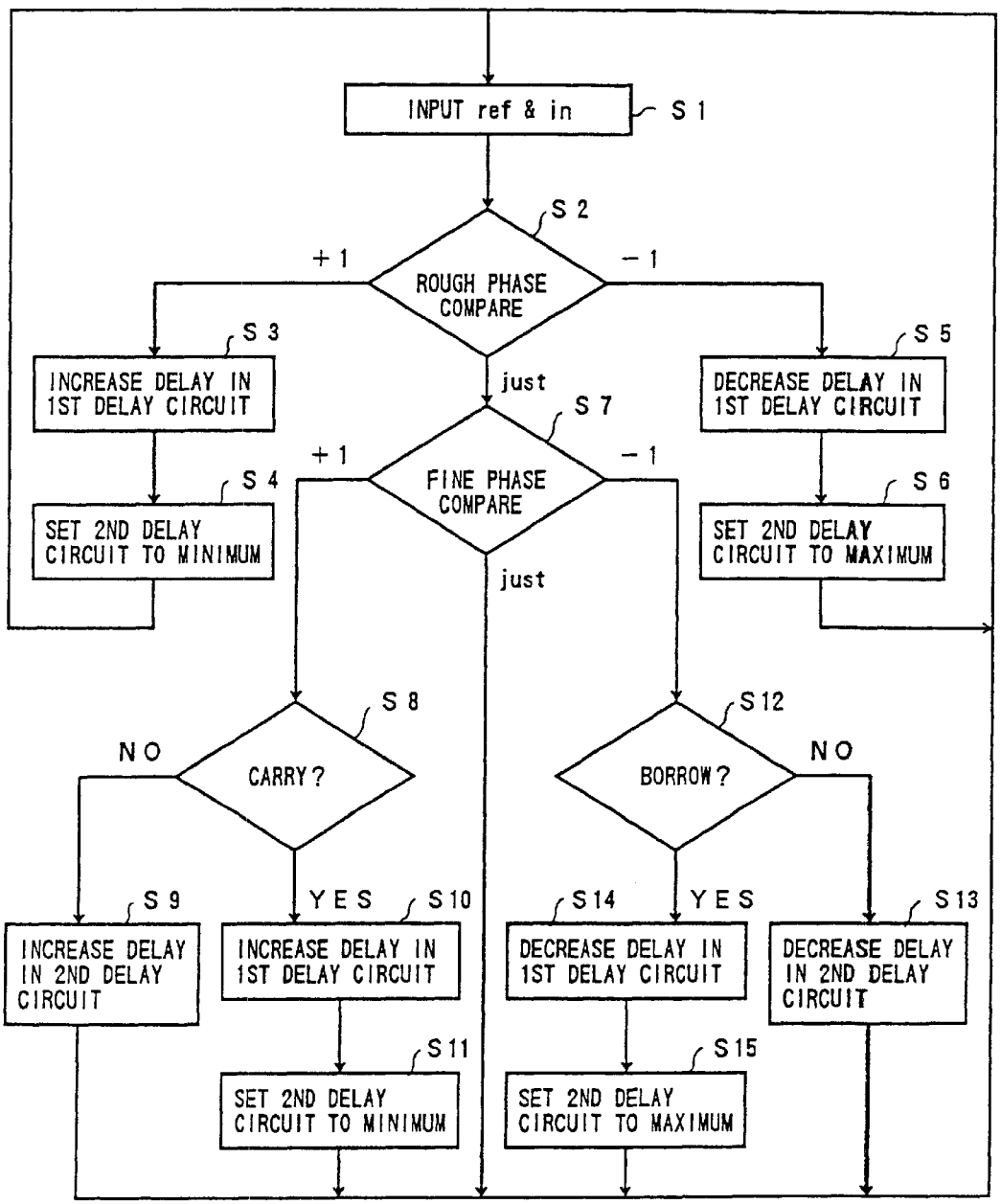
FIG. 10 is a flowchart of a phase setting process carried out in the DLL circuit shown in FIG. 8.

The following operation is carried out at step S1 shown in FIG. 10. The frequency dividing circuit 10 outputs a clock signal 10b obtained by dividing the frequency of the input clock signal to the first variable delay circuit 1 at the same time as the clock signal 10a is output to the first variable delay circuit 1. Further, the frequency dividing circuit 10 supplies the first phase comparator circuit 5, the second phase comparator circuit 6 and the timing generating circuit 7 with a signal 10c obtained by dividing the frequency of the input clock signal. The above signal 10c serves as the reference signal "ref". At the time of power on, the frequency dividing circuit 10 has a comparatively low frequency dividing ratio so that an increased number of times that the phase comparing operations are repeatedly carried out. Hence, it is possible to rapidly determine the initial delay times of the first and second variable delay circuits 1 and 2 at the time of power on.

Further, at step S1, the first variable delay circuit 1 delays the received clock signal 10b by the sum of t1 and T as in the case of the clock signal 10a, and outputs a resultant clock signal 1b to the second variable delay circuit 2. The second variable delay circuit 2 delays the clock signal 1b by the circuit delay time t2 as in the case of the clock signal 1a, and outputs a resultant clock signal 2b to the dummy circuit 13. The dummy circuit 13 delays the clock signal 2b by the sum of the circuit delay times tin and tout of the input circuit 15 and output circuit 14, and outputs a resultant clock signal 13a, which serves as the output signal "in".

At step S2, the first phase comparator circuit 5 performs a comparatively "rough" phase comparing operation. More particularly, the first phase comparing circuit 5 compares the phase of the signal 10c with the phase of the signal 13a at the timing of the rising edge of the input clock signal. While the first phase comparator circuit 5 is performing the phase comparing operation and the number of stages in the first variable delay circuit 1 is being determined, the second phase comparing circuit 6 is in the disabled state in order to reduce power consumed therein.

The result of the phase comparing operation at step S2 shows that there is no phase difference between the signals 10c and 13a ("just" at step S2), the first phase comparing circuit 5 completes the phase comparing operation. Then, the second phase comparing circuit 6 starts a phase comparing operation on the signals 10c and 13a at step S7.

If the first phase comparing circuit 5 determines at step S2 that the signal 10c leads to the signal 13a ("+1" at step S2), it notifies, at the timing generated by the timing generating circuit 7, the first shift signal generating circuit 8 that the signal 10c leads to the signal 13a. Then, the first shift signal generating circuit 8 supplies the first delay control circuit 3 with an instruction which is based on the phase difference detected by the first phase comparing circuit 5 and causes the number of stages in the first variable delay circuit 1 to be increased by 1 at a given timing. At this given timing, the second variable delay circuit 2 outputs the rising edge of the input clock signal that is next the rising edge thereof at which the phase comparing operation was carried out at step S2. Hence, it is possible to prevent the number of stages in the first variable delay circuit 1 from being increased or decreased while the input clock signal is passing through the first and second variable delay circuits 1 and 2.

At step S3, the first delay control circuit 3 receives the above notification and increases the number of stages of the first variable delay circuit 1 by one with a rough or low precision equal to approximately 200 ps towards the given phase relationship with the input clock signal. At this time, the minimum number (0) of stages in the second variable delay circuit 2 is set at step S4.

The first phase comparing circuit 5 receives the signals 10c and 13a at step S1, and then compares the phases thereof with each other at the next timing for comparison at step S2.

The first phase comparing circuit 5 continues to perform the phase comparing operation on the signals 10c and 13a until there is no phase difference therebetween. When it is determined that the signals 10c and 13a do not have any phase difference, the phase comparing operation is ended and instead the second phase comparing circuit 5 starts the phase comparing operation on the signals 10c and 13a at step S7.

If the result of step S2 shows that the signal 13a leads to the signal 10c ("−1" at step S2), the first phase comparing circuit 5 notifies, at the timing generated by the timing generating circuit 7, the first shift signal generating circuit 8 that the signal 13a leads to the signal 10c. Then, the first shift signal generating circuit 8 supplies the first delay control circuit 3 with an instruction which is based on the phase difference detected by the first phase comparing circuit 5 and causes the number of stages in the first variable delay circuit 1 to be decreased by 1 at the given timing.

At step S5, the first delay control circuit 3 receives the above notification and decreases the number of stages of the first variable delay circuit 1 by one with the low precision equal to approximately 200 ps towards the given phase relationship with the input clock signal. At this time, the maximum number n of stages in the second variable delay circuit 2 is set at step S6.

Then, the first phase comparing circuit 5 receives the signals 10c and 13a at step S1, and then compares the phases thereof with each other at the next timing for comparison at step S2.

The first phase comparing circuit 5 continues to perform the phase comparing operation on the signals 10c and 13a until there is no phase difference therebetween. When it is determined that the signals 10c and 13a do not have any phase difference, the phase comparing operation is ended and instead the second phase comparing circuit 5 starts the phase comparing operation on the signals 10c and 13a at step S7.

In the phase setting process by the first phase comparing circuit 5, the first shift signal generating circuit 8, the first delay control circuit 3 and the first variable delay circuit 1, the first phase comparing circuit 5 is controlled to have a precision that the period corresponding to the precision is longer than the delay time of one stage of the first variable delay circuit 1. The reason for the above will be described with reference to FIGS. 12A and 12B.

As shown in FIG. 12A, it will now be assumed that the external clock signal and the output clock signal are in phase in a case where the first and second variable delay circuits 1 and 2 are set so as to provide the delay times equal to the respective one stages, and the first variable delay circuit 1 is set at the kth stage.

At the phase comparing operation of the first phase comparing circuit 5 at step S2 shown in FIG. 10, the first phase comparing circuit 5 makes a decision that the two signals are in phase ("just") and there is no need to increase or decrease the delay time, if the timing (edge) of the signal 13a with respect to that of the signal 10c is located within the range from time T(r1) to time T(r2), as shown in FIG. 12B. If the timing of the signal 13a with respect to that of the signal 10c is delayed over the time T(r1), the first phase comparing circuit 5 makes a decision that the delay time should be increased ("+1"). If the timing of the signal 13a with respect to that of the signal 10c is advanced over the time T(r2), the first phase comparing circuit 5 makes a decision that the delay time should be decreased ("−1").

In the above situation, if the signal 13a has a phase difference with respect to the signal 10c as shown in FIG. 12(A) in the case where the first phase comparing circuit 5 has a precision such that the in-phase decision period (T(r2)−T(r1)) is shorter than the delay time of one stage of the first variable delay circuit 1, the first delay control circuit 3 controls the first variable delay circuit 1 to increase the delay time by the time equal to one stage on the basis of the decision result "+1" provided by the first phase comparing circuit 5. However, at the next phase setting timing, the first delay control circuit 3 controls the first variable delay circuit 1 to decrease the delay time by the time equal to one stage on the basis of the decision result "−1" provided by the first phase comparing circuit 5. That is, if the first phase comparing circuit 5 has a precision so that the in-phase decision period is longer than the delay time of one stage of the first variable delay circuit 1, the delay time increasing and decreasing operations are alternatively executed indefinitely, so that the number of stages in the first variable delay circuit cannot be determined for ever.

As described above, the precision of the first variable delay circuit 1 can be determined without the alternative switching when the first phase comparing circuit 5 has a precision corresponding to the in-phase decision period longer than the delay time of one stage of the first variable delay circuit 1. In this case, as shown by a hatched area in FIG. 12(A), there is provided a period during which it is possible to make a decision as to whether the delay time provided by the kth stage should be maintained or the number of stages should be increased by one to increase the delay time by one stage. A reference for making the above decision is defined so as to be located at the center of the delay time of one stage of the first variable delay circuit 1.

After the phase setting operation on the first variable delay circuit 1 is completed, at step S7 shown in FIG. 10, the second phase comparing circuit 6 performs a comparatively fine phase comparing operation on the signal 10c from the frequency dividing circuit 10 and the signal 13a from the dummy circuit 13 at the timing of the rising edge of the input clock signal.

If the result of step S7 shows that there is no phase difference between the signals 10c and 13a ("just" at step S7), the DLL circuit 16 ends the phase setting process, and the delay times thus obtained are set in the first and second variable delay circuits 1 and 2. Then, the first and second phase comparing circuits 5 and 6 wait for the next timing (step S1) for phase comparison. It should be noted that the DLL circuit 16 outputs the output clock signal having the given phase relationship with the input clock signal when it is determined that there is no phase difference on the signals 10c and 13a.

If it is determined, at step S7, that the signal 10c leads to the signal 13a ("+1" at step S7), the timing generating circuit 7 determines, at step S8, whether the step-up process with a carry in the first variable delay circuit 1 occurs before increasing the number of stages in the second variable delay circuit 2 by one on the basis of the detection result output by the number-of-stages detection circuit 12. The number-of-stages detection circuit detects the current number of stages in the second variable delay circuit 2, and notifies the timing generating circuit 7 of the detected number of stages. In the decision made by the timing generating circuit 7, the step-up process occurs when the second phase comparing circuit 6 determines that the signal 10c leads to the signal 13a and the second variable delay circuit 2 is set so as to have a predetermined number of stages, for example, the maximum number thereof. In other cases, the step-up process does not occur.

If it is determined, at step S8, that the step-up process does not occur, the second phase comparing circuit 6 notifies, at the timing defined by the timing generating circuit 7, the second shift signal generating circuit 9 that the signal 10c leads to the signal 13a. Then, the second shift signal generating circuit 9 supplies, on the basis of the phase difference detected by the second phase comparing circuit 6, the second delay control circuit 4 with an instruction to increase the number of stages in the second variable delay circuit 2 by one at the given timing. At this given timing, the second variable delay circuit 2 outputs the rising edge of the input clock signal that is next the rising edge thereof at which the phase comparing operation was carried out at step S2. Hence, it is possible to prevent the number of stages in the first variable delay circuit 1 from being increased or decreased while the input clock signal is passing through the second variable delay circuit 2.

In response to the above notification, the second delay control circuit 4 increases, at step S9, the number of stages of delay circuits in the second variable delay circuit 2 with the fine precision higher than the precision of the first variable delay circuit 1 so that the clock signal 2a having the predetermined phase relationship with the input clock signal can be output.

The second phase comparing circuit 6 and the first phase comparing circuit 5 receive the signal 10c and 13a at step S1, and the first phase comparing circuit 5 executes the phase comparing operation on the signals 10c and 13a at step S2.

The DLL circuit 16 sequentially executes steps S1, S2, S7–S9 so that the number of stages in the second variable delay circuit 2 is increased one by one until it is determined at step S2 that there is no phase difference between the signals 10c and 13a ("just") and it is determined at step S7 that there is no phase difference between the signals 10c and 13a ("just").

Then, the DLL circuit 16 ends the phase setting process so that the delay times thus obtained are set in the first and second variable delay circuits 1 and 2. Then, the first and second phase comparing circuits 5 and 6 wait for the next timing for phase comparison. At the time when it is determined there is no phase difference between the signals 10c and 13a, the DLL circuit 16 outputs the output signal having the predetermined phase relationship with the input clock signal.

If the timing generating circuit 7 determines, at step S8, that the step-up process occurs, the second phase comparing circuit 6 notifies, at the timing defined by the timing generating circuit 7, the first shift signal generating circuit 8 of the occurrence of the step-up process. In response to the notification, the first shift signal generating circuit 8 supplies the first delay control circuit 3 with an instruction to increase the number of stages in the first variable delay circuit 1 by one. In response to the notification, the first delay control circuit 3 controls the first variable delay circuit 1 to increase the number of stages by one at step S10. At this time, the second delay control circuit 4 sets the number of stages in the second variable delay circuit 2 to zero (minimum number of stages) at step S11. Hence, the DLL circuit 16 can perform the phase setting based on the delay unit of one stage of the second variable delay circuit 2.

The second phase comparing circuit 6 and the first phase comparing circuit 5 receive the signals 10c and 13a at step S1, and the first phase comparing circuit 5 executes the phase comparing operation thereon at the next timing for phase comparison.

The DLL circuit 16 sequentially executes steps S1, S2, S7–S9 so that the number of stages in the second variable delay circuit 2 is increased one by one until it is determined at step S2 that there is no phase difference between the signals 10c and 13a ("just") and it is determined at step S7 that there is no phase difference between the signals 10c and 13a ("just").

Then, the DLL circuit 16 ends the phase setting process so that the delay times thus obtained are set in the first and second variable delay circuits 1 and 2. Then, the first and second phase comparing circuits 5 and 6 wait for the next timing for phase comparison. At the time when it is determined there is no phase difference between the signals 10c and 13a, the DLL circuit 16 outputs the output signal having the predetermined phase relationship with the input clock signal.

If the second phase comparing circuit 6 determines, at step S7, that the signal 13a leads to the signal 10c, the timing generating circuit 7 determines, at step S12, whether a step-down process with a borrow occurs in the first variable delay circuit 1 before decreasing the number of stages in the second variable delay circuit 2 on the basis of the detection result output by the number-of-stages detection circuit 12. The number-of-stages detection circuit 12 detects the current number of stages of the second variable delay circuit 2, and informs the timing generating circuit 7 of the detected number of stages. The timing generating circuit 7 judges that the step-down process occurs when the second phase comparator circuit 6 determines that the signal 13a leads to the signal 10c and the second variable delay circuit 2 is set to a predetermined number of stages, for example, the minimum number of stages. In other cases, the step-down process does not occur.

When the step-down process does not occur by the judgment of the timing generating circuit 7, the second phase comparator circuit 6 informs, at the timing defined by the timing generating circuit 7, the second shift signal generating circuit 9 that the signal 13a leads to the signal 10c. In response to the notification, the second shift signal generating circuit 9 supplies the second delay control circuit 4 with an instruction which causes the number of stages in the second variable delay circuit 2 to be increased by one on the basis of the phase difference detected by the second phase comparator circuit 6. At this given timing, the second variable delay circuit 2 outputs the rising edge of the input clock signal that is next the rising edge thereof at which the phase comparing operation was carried out at step S2. Hence, it is possible to prevent the number of stages in the second variable delay circuit 2 from being increased or decreased while the input clock signal is passing through the first variable delay circuit 1 and the second variable delay circuit 2.

In response to the above notification, the second delay control circuit 4 controls, at step S13, the second variable delay circuit 2 to decrease the number of stages by one with the precision higher than that of the first variable delay circuit 1 so that the output signal having the predetermined phase relationship with the input clock signal is output.

Then, the second phase comparator circuit 6 receives the signal 10c from the frequency dividing circuit 10 and the signal 13a from the dummy circuit 13 at step S1, and compares the phase comparing operation thereon at the next timing for phase comparison.

The DLL circuit 16 sequentially executes steps S1, S2, S7–S9 so that the number of stages in the second variable delay circuit 2 is increased one by one until it is determined at step S2 that there is no phase difference between the signals 10c and 13a ("just") and it is determined at step S7 that there is no phase difference between the signals 10c and 13a ("just").

Then, the DLL circuit 16 ends the phase setting process so that the delay times thus obtained are set in the first and second variable delay circuits 1 and 2. Then, the first and second phase comparing circuits 5 and 6 wait for the next timing for phase comparison. At the time when it is determined there is no phase difference between the signals 10c and 13a, the DLL circuit 16 outputs the output signal having the predetermined phase relationship with the input clock signal.

If the step-down process occurs by the judgment of the timing generating circuit 7 at step S12, the second phase comparator circuit 6 informs, at the timing defined by the timing generating circuit 7, the first shift signal generating circuit 8 of the occurrence of the step-down process. In response to the above notification, the first shift signal generating circuit 8 supplies the first delay control circuit 3 with an instruction which the number of stages in the first variable delay circuit 1 to be decreased by one. In response to the above notification, the first delay control circuit 3 controls the first variable delay circuit 1 to reduce the number of stages by one at step S14. At this time, the second delay control circuit 4 sets the second variable delay circuit 2 to the maximum number n of stages at step S15. Hence, the DLL circuit 16 can perform the phase setting based on the delay time of one stage of the second variable delay circuit 2 even when the step-down process occurs in the first variable delay circuit 1.

The second phase comparator circuit 6 receives the signals 10c and 13a at step S1 and executes the phase comparing operation thereon at step S2 at the next timing for phase comparison.

The DLL circuit 16 sequentially executes steps S1, S2, S7–S9 so that the number of stages in the second variable delay circuit 2 is reduced one by one until it is determined at step S2 that there is no phase difference between the signals 10c and 13a ("just") and it is determined at step S7 that there is no phase difference between the signals 10c and 13a ("just").

Then, the DLL circuit 16 ends the phase setting process so that the delay times thus obtained are set in the first and second variable delay circuits 1 and 2. Then, the first and second phase comparing circuits 5 and 6 wait for the next timing for phase comparison. At the time when it is determined there is no phase difference between the signals 10c and 13a, the DLL circuit 16 outputs the output signal having the predetermined phase relationship with the input clock signal.

If there is no need to increase or decrease the delay time in the phase comparing operations of the first and second phase comparator circuits 5 and 6, the frequency dividing circuit 10 is controlled to increase the frequency dividing ratio in order to reduce the number of times that the phase comparing operations are repeatedly carried out. If the first phase comparator circuit 5 determines that the delay time should be increased or decreased and the second phase comparator circuit 6 determines that the delay time should be successively increased or decreased in the identical direction a plurality of number of times, the frequency dividing circuit 10 is controlled to reduce the frequency dividing ratio in order to increase the number of times that the phase comparing operations are repeatedly carried out. The number of times that the delay time is repeatedly increased or reduced in the identical direction can be set from the outside of the DLL circuit 16. The above control contributes to reducing the number of times that the phase comparing operations are carried out and reducing the power consumption.

As has been described previously, the reference for judgment in the second phase comparator circuit 6 is set to the position corresponding to half the delay time equal to one stage of the first variable delay circuit 1.

The phase setting process in the DLL circuit 16 shown in FIG. 8 will be described in more detail with reference to FIGS. 13A and 13B.

Figure 13A:
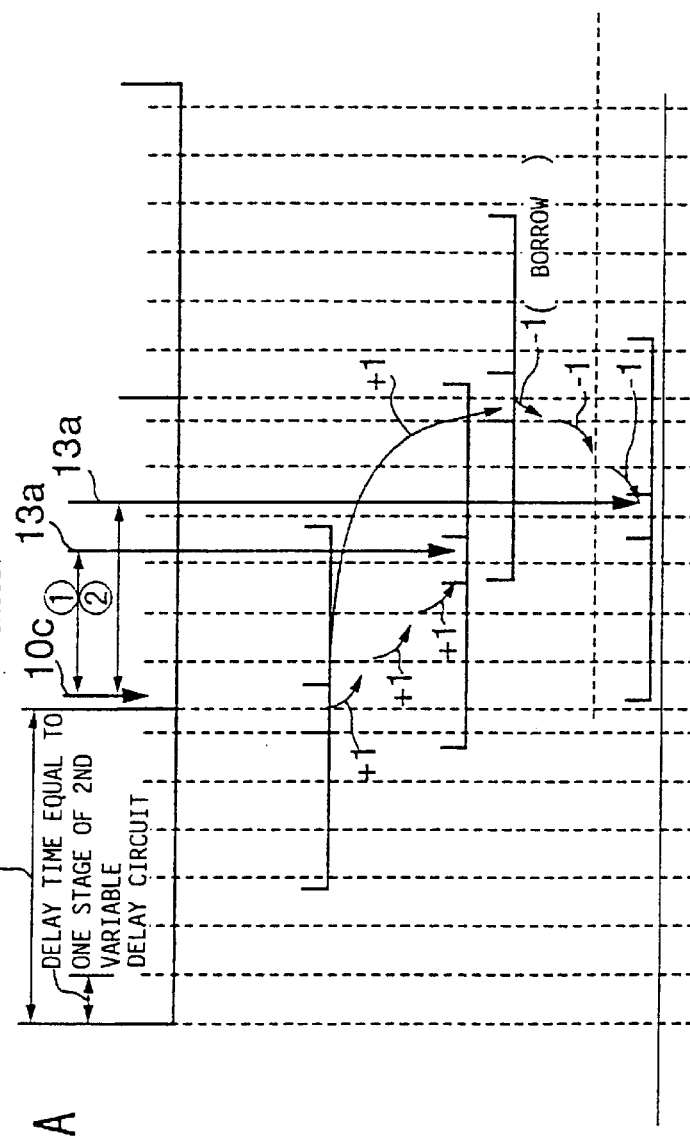
FIGS. 13A and 13B are diagrams showing the phase setting process.

It will now be assumed that the delay time equal to one stage of the first variable delay circuit 1 and the delay time equal to one stage of the second variable delay circuit 2 are set therein, as shown in FIG. 13A. Further, it will be assumed that the first variable delay circuit 1 is set at the kth stage of the delay circuit, and the second variable delay circuit 2 is set at the zeroth stage (minimum stage) of the delay circuit. In the case, the external clock signal and the output clock signal are in phase. In the following description, the numbers of stages of the first and second variable delay circuits 1 and 2 are indicated by coordinates (a, b) where "a" denotes the number of stages in the first variable delay circuit 1, and "b" denotes the number of stages in the second variable delay circuit 2.

In the phase comparing operations at steps S2 and S7 shown in FIG. 10, the first and second phase comparator circuits 5 and 6 detect the phase differences between the signals 10c and 13a.

Figure 13B:
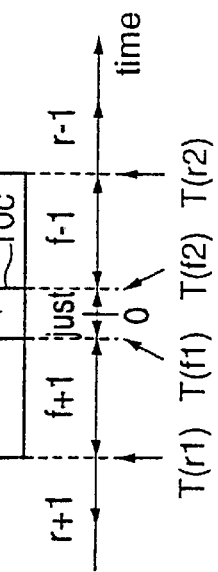

As shown in FIG 13B, the first and second phase comparator circuits 5 and 6 judge that the signals 10c and 13a are in phase ("just") if the phase differences respectively detected fall within the range between T(f1) and T(f2). In this case, there is no need to increase or decrease the numbers of stages of the first and second phase comparator circuits 5 and 6.

If the phase difference detected by the first phase comparator circuit 5 falls within the range between T(r1) and T(r2) and the phase difference detected by the second phase comparator circuit 6 falls within T(f2) and T(r2), the second phase comparator circuit 6 judges the phase difference as "−1" so that the number of stages in the second variable delay circuit 2 is decreased by one.

If the phase difference detected by the first phase comparator circuit 5 falls within the range between T(r1) and T(r2) and the phase difference detected by the second phase comparator circuit 6 falls within the range between T(r1) and T(f1), the second phase comparator circuit 6 judges the phase difference as "+1", so that the number of stages in the second variable delay circuit 2 is increased by one.

If the phase difference detected by the first phase comparator circuit 5 exceeds T(r2), the first phase comparator circuit 5 judges the phase difference as "−1", so that the number of stages in the first variable delay circuit 1 is decreased by one.

If the phase difference detected by the first phase comparator circuit 5 is less than T(r1), the first phase comparator circuit 5 judges the phase difference as "+1", so that the number of stages in the first variable delay circuit 1 is increased by one.

If the signal 13a has a phase difference ① (FIG. 13A) with respect to the signal 10c, the result of step S2 executed by the first phase comparator circuit 5 is "just", and the result of step S7 executed by the second phase comparator circuit 6 is "+1". Then, the DLL circuit 16 repeatedly performs the phase setting process shown in FIG. 10 three times. The first and second delay control circuits 3 and 4 controls the first and second variable delay circuits 1 and 2 to change the respective numbers of stages from (k, 0) to (k, 3). Hence, the numbers of stages of the first and second variable delay circuits 1 and 2 are changed as (k, 0)→(k, 1)→(k, 2)→(k, 3).

If the signal 13a has a phase difference ② (FIG. 13A) with respect to the signal 10c, the result of step S2 is "+1", the first delay control circuit 3 controls the first variable delay circuit 1 to change the number of stages from (k, 0) to (k+1, 0). The next result of step S2 will show "just", while the result of step S7 executed by the second phase comparator circuit 6 is "−1". Since the judgment of the phase comparing process by the second phase comparator circuit 6 is "−1" and the number of stages in the second variable delay circuit 3 is zero (minimum number), the step-down process occurs, so that the first and second delay control circuits 3 and 4 control the first and second variable delay circuits 1 and 2 to change the respective numbers of stages from (k+1, 0) to (k, 6). Further, the DLL circuit 16 repeatedly carries out the phase setting process shown in FIG. 10 twice. Thus, the first and second delay control circuits 3 and 4 control the first and second variable delay circuits 1 and 2 to change the respective numbers of stages from (k, 6) to (k, 4). Hence, the numbers of stages in the first and second variable delay circuits 1 and 2 are changed as (k, 0)→(k+1, 0)→(k, 6)→(k, 5)→(k, 4).

In the DLL circuit 16, the input clock signal is delayed by the first variable delay circuit 1 first, and is delayed by the second variable delay circuit 2 second. An alternative arrangement can be employed in which the input clock signal is delayed by the second and first variable delay circuits 2 and 1 in this order. Such an alternative arrangement is shown in FIG. 14.

Figure 14:
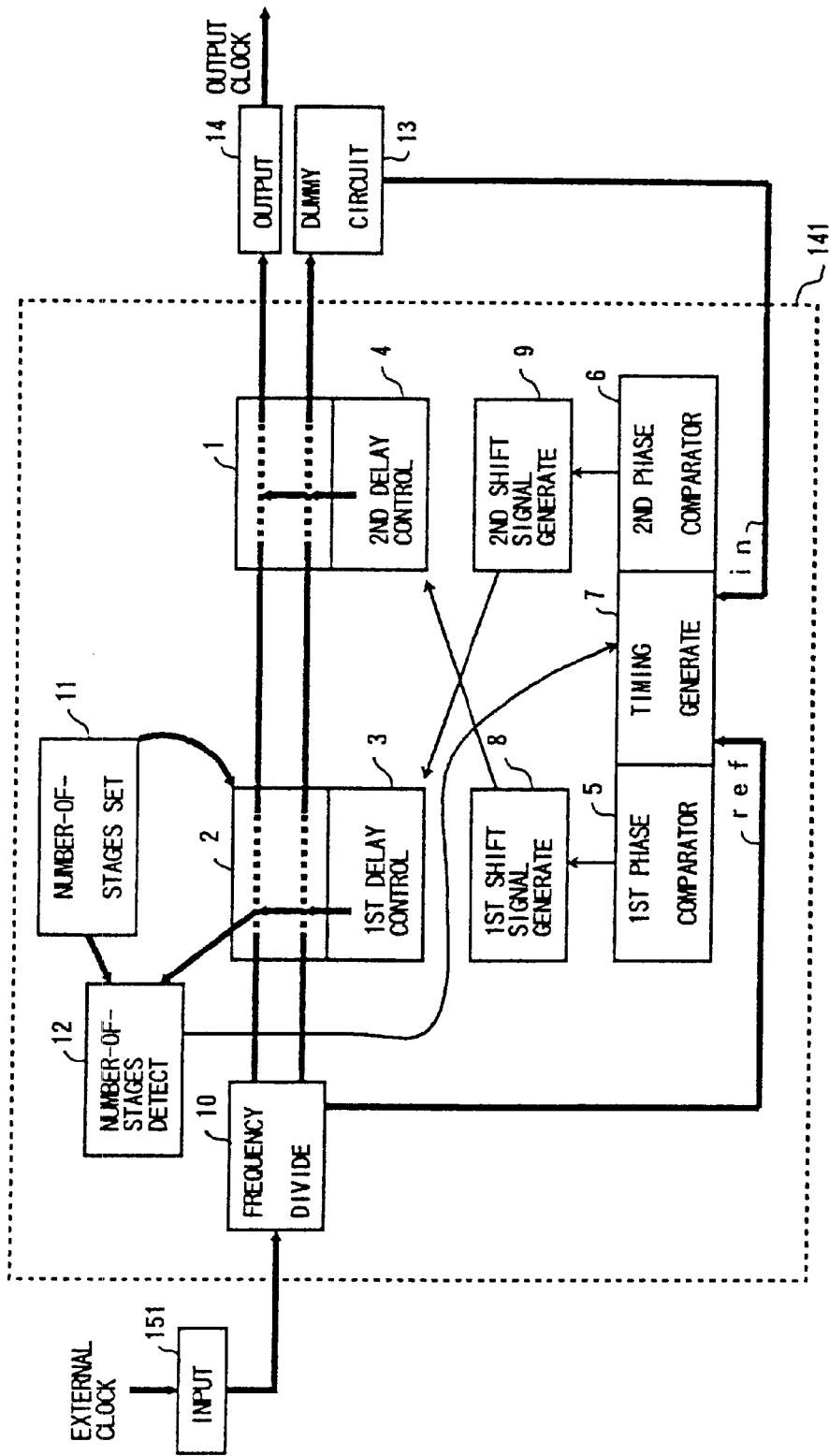
FIG. 14 is a block diagram of a variation of the structure shown in FIG. 8.

Referring to FIG. 14, a DLL circuit 141 is made up of the first variable delay circuit 1, the second variable delay circuit 2, the first delay control circuit 3, the second delay control circuit 4, the first phase comparator circuit 5, the second phase comparator circuit 6, the timing generating circuit 7, the first shift signal generating circuit 8, the second shift signal generating circuit 9, the frequency dividing circuit 10, the number-of-stages setting circuit 11 and the number-of-stages setting circuit 12. The input clock signal is delayed by the second and first variable delay circuits 2 and 1 in this order so that the output clock signal has a given phase relationship with the input clock signal. In FIG. 14, parts that are the same as those shown in the previously described figures are given the same reference numbers. In the configuration shown in FIG. 14, a process to be executed at the time of power on and a phase setting process are the same as corresponding those of the DLL circuit 16 shown in FIG. 8, and a description thereof will be omitted.

Figure 9:
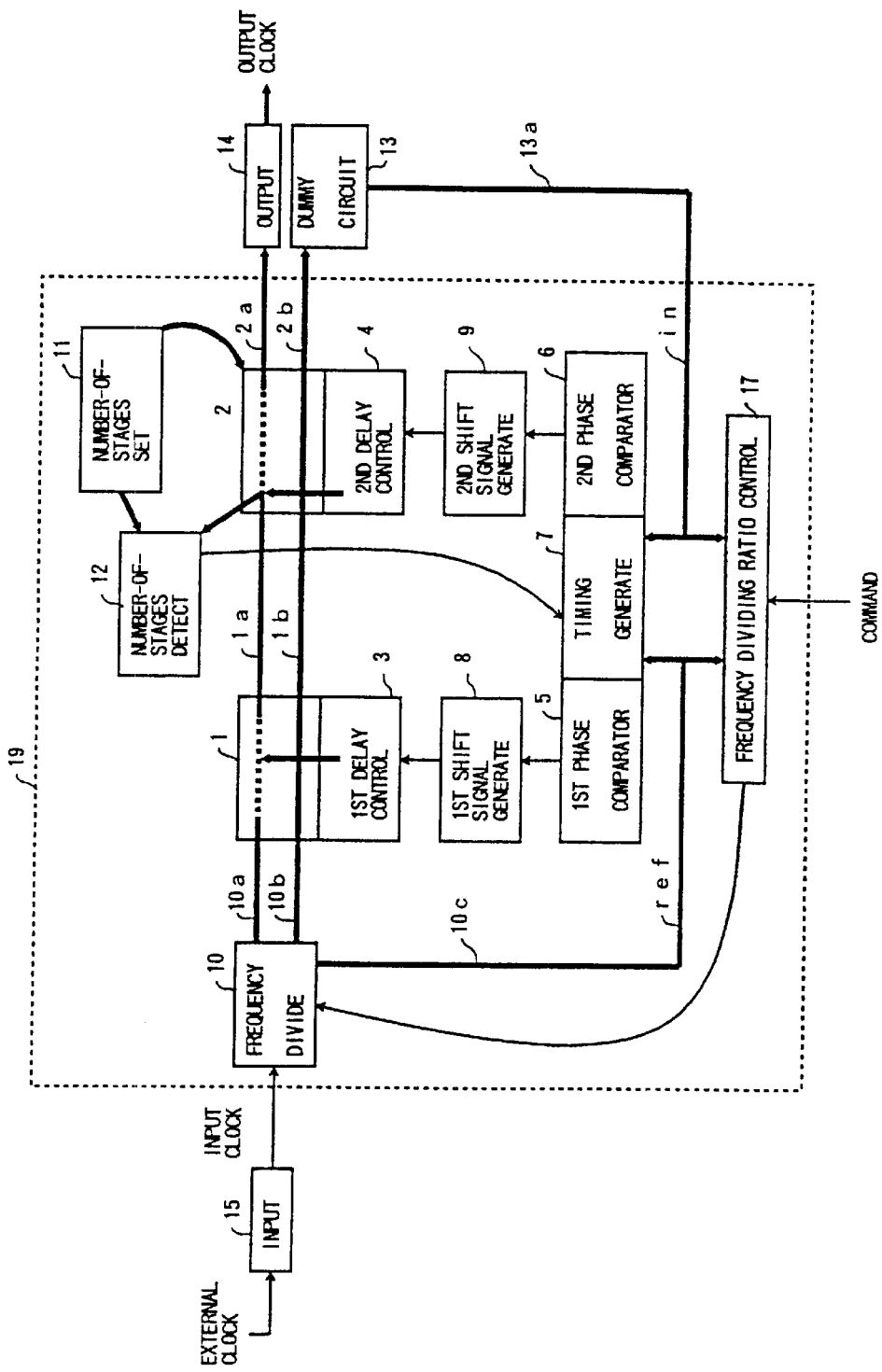
FIG. 9 is a block diagram of a modification of the structure shown in FIG. 8.

FIG. 9 shows a DLL circuit 19, which is configured by adding a frequency dividing control circuit 17 to the DLL circuit 16 shown in FIG. 8. In FIG. 9, parts that are the same as those in FIG. 8 are given the same reference numbers. The frequency dividing control circuit 17 serves as a third phase comparing circuit, which performs a phase comparing operation on the clock signal 10c from the frequency dividing circuit 10 and the clock signal 13a from the dummy circuit 13 separately from the first and second phase comparing circuits 5 and 6. The frequency dividing control circuit 17 instructs, based on a predetermined condition, to change the frequency dividing ratio. The changed frequency dividing ratio changes the number of times that the first and second phase comparing circuits 5 and 6 perform the respective phase comparing operations.

Figure 11:
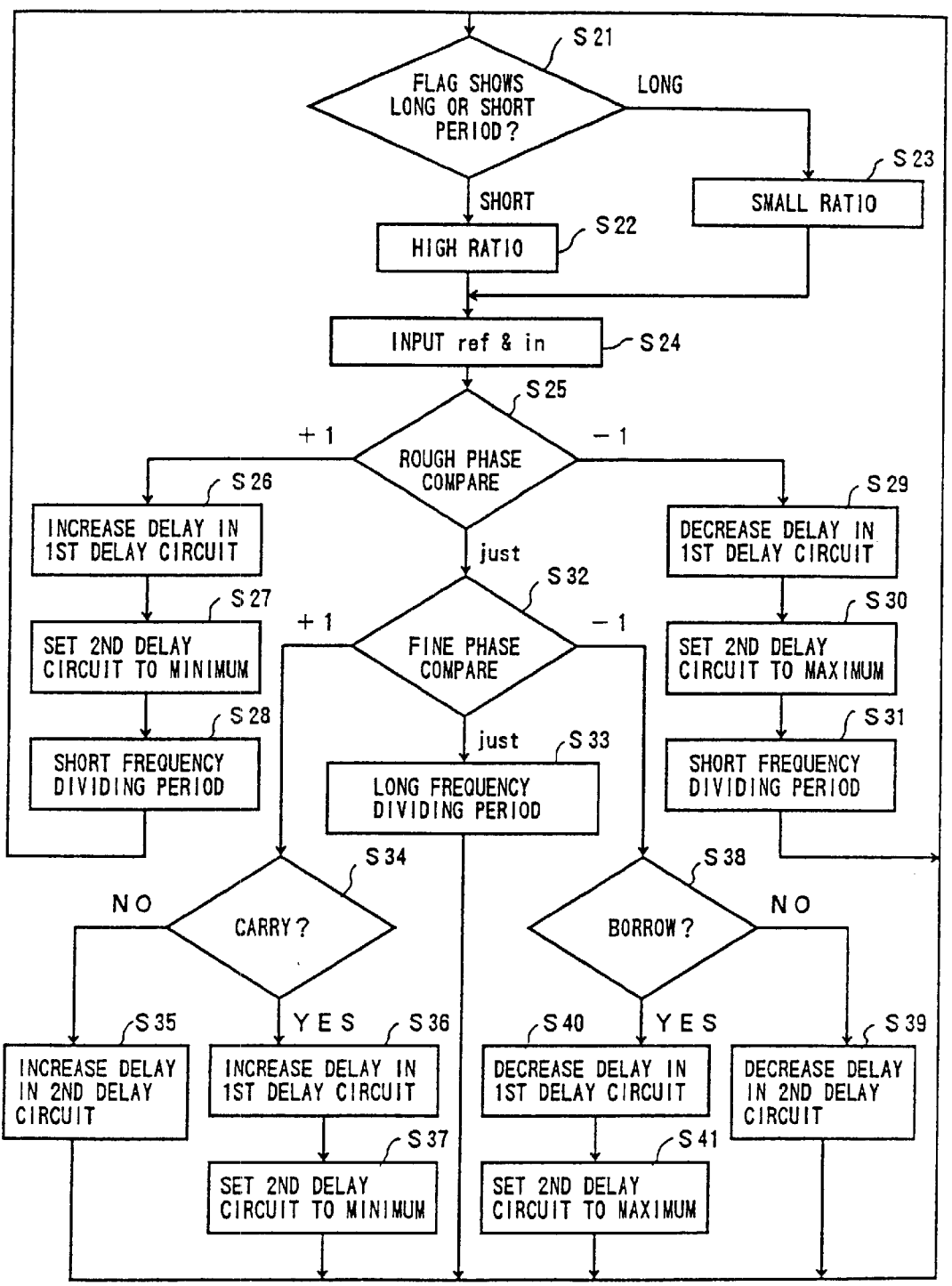
FIG. 11 is a flowchart of a phase setting process carried out in the DLL circuit shown in FIG. 9.

FIG. 11 is a flowchart of a phase setting operation of the DLL circuit 19 shown in FIG. 6.

When a power supply is initiated, the DLL circuit 19 sets the number of stages in the first variable delay circuit 1 to a predetermined number on the basis of the circuit delay time tin of the input circuit 15, the circuit delay time t1 of the first variable delay circuit 1, the circuit delay time t2 of the second variable delay circuit 2 and the circuit delay time tout of the output circuit 14. Hence, it is possible to reduce the initial delay time (stage) setting operation on the first variable delay circuit 1 carried out by the first phase comparing circuit 5 at the time of power on. The above-mentioned predetermined number of stages in the first variable delay circuit 1 corresponds to a number obtained by adding the delay time T of the first variable delay circuit 1 to the sum of tin, t1, t2 and tout. The delay time equal to one stage of the first variable delay circuit 1 is set beforehand by a command externally supplied from the outside of the DLL circuit 19.

The input circuit 15 receives the external clock signal, which is delayed by the circuit delay time tin and is then output, as the input clock signal, to the DLL circuit 19.

The frequency dividing circuit 18 of the DLL circuit 19 supplies the signal 10a to the first variable delay circuit 1 (the circuit delay time of the circuit 18 is neglected for the sake of convenience). Then, the first variable delay circuit 1 delays the input clock signal by the sum of t1 and T, and the delayed signal 1a thus obtained is supplied to the second variable delay circuit 2. The number of stages in the second variable delay circuit 2 at the time of power on is set equal to zero. Hence, the clock signal is delayed by the circuit delay time t2 only.

The output circuit 14 receives the clock 2a, which is delayed by the circuit delay time tout. The resultant delayed clock signal is output as the output clock signal. As described above, the DLL circuit 16 delays the input clock signal by the sum of the delay times t1, T and tw.

At the time of power on, the maximum number n of stages of delay circuits in the second variable delay circuit 2 is not determined. The number-of-stages setting circuit 11 performs a predetermined process for determining the maximum number n of stages. In the above predetermined process, the number-of-stages setting circuit 11 calculates the delay time obtained when the clock signal has passed through an arbitrary number x of stages of the second variable delay circuit 2, and calculates the delay time obtained when the clock signal has passed through the (n+1) stages. The number-of-stages setting circuit 11 determines whether the delay time of one stage of the first variable delay circuit 1 is equal to or greater than the delay time equal to the n stages of the second variable delay circuit 2 but smaller than the delay time equal to the (n+1) stages. When the number-of-stages setting circuit 11 detects the value of x, it determines the value of x as being the maximum number n of stages of the second variable delay circuit. The above determination is repeatedly carried out until the value of x which meets the above condition is detected. Then, the number-of-stages setting circuit 11 notifies the second variable delay circuit 2 of the maximum number n of stages.

The maximum number of stages of delay circuits of the second variable delay circuit 2 can automatically be determined by the above-mentioned manner.

Referring to FIG. 11, the phase setting operation of the DLL circuit 19 will be described below.

At step S21, the frequency dividing circuit 18 supplies, at the same time as the clock signal 10a is output, the first variable delay circuit 1 with the clock signal 10b obtained by dividing the frequency of the input clock signal according to instructions from the frequency dividing control circuit 17. Further, the frequency dividing circuit 18 supplies the first phase comparator circuit 5, the second phase comparator circuit 6, the timing generating circuit 7 and the frequency dividing control circuit 17 with the signal 10c generated by dividing the frequency of the input clock signal in accordance with instructions from the frequency dividing control circuit 17. At the time of power on, the frequency dividing circuit 18 is set, in accordance with the instructions from the frequency dividing control circuit 17, to a comparatively low frequency dividing ratio so as to increase the number of times that the phase comparing operation are repeatedly carried out ("short period" at step S21). With the comparatively low frequency dividing ratio, the phases can be set at a high speed at step S22 (hereinafter the above setting will be referred to as a short-period mode).

If the frequency dividing control circuit 17 judges that there is no need to increase or decrease the delay times of the first and second variable delay circuits 1 and 2, the circuit 17 instructs the frequency dividing circuit 18 to increase the frequency dividing ratio so that the number of times for phase comparison can be reduced ("long period" at step S21). With the comparatively high frequency dividing ratio, the number of times that the phase comparing operations are repeatedly carried out is reduced and a reduced amount of power is consumed in a reduced power mode (hereinafter the above setting will be referred to as a long-period mode).

When the frequency dividing control circuit 17 judges that the delay time of the first variable delay circuit 1 should be increased or decreased and further judges that the delay time of the second variable delay circuit 2 should successively be increased or decreased in an identical direction a plurality of times, the circuit 17 instructs the frequency dividing circuit 18 to reduce the frequency dividing ratio in order to increase the number of times that the phase comparing operations are repeatedly carried out (short period at step S21), and operates in the short-period mode at S22. At this time, the number of times that the delay time is increased or reduced can be set by a command externally supplied from the outside of the DLL circuit 19. Hence, the amount of power consumed in the DLL circuit 19 can be reduced.

At step S14, the first variable delay circuit 1 delays the received clock signal 10b by the sum of t1 and T as in the case of the clock signal 10a, and outputs the resultant clock signal 1b to the second variable delay circuit 2. The second variable delay circuit 2 delays the clock signal 1b by the circuit delay time t2 as in the case of the clock signal 1a, and outputs the resultant clock signal 2b to the dummy circuit 13. The dummy circuit 13 delays the clock signal 2b by the sum of the circuit delay times tin and tout of the input circuit 15 and output circuit 14, and outputs the resultant clock signal 13a, which serves as the output signal "in".

At step S25, the first phase comparator circuit 5 performs the comparatively rough phase comparing operation. More particularly, the first phase comparing circuit 5 compares the phase of the signal 10c with the phase of the signal 13a at the timing of the rising edge of the input clock signal. While the first phase comparator circuit 5 is performing the phase comparing operation and the number of stages in the first variable delay circuit 1 is being determined, the second phase comparing circuit 6 is in the disabled state in order to reduce power consumed therein.

The result of the phase comparing operation at step S25 shows that there is no phase difference between the signals 10c and 13a ("just" at step S25), the first phase comparing circuit 5 completes the phase comparing operation. Then, the second phase comparing circuit 6 executes the phase comparing operation on the signals 10c and 13a at step S32.

If the first phase comparing circuit 5 determines at step S25 that the signal 10c leads to the signal 13a ("+1"), it notifies, at the timing generated by the timing generating circuit 7, the first shift signal generating circuit 8 that the signal 10c leads to the signal 13a. Then, the first shift signal generating circuit 8 supplies the first delay control circuit 3 with the instruction which is based on the phase difference detected by the first phase comparing circuit 5 and causes the number of stages in the first variable delay circuit 1 to be increased by 1 at a given timing. At this given timing, the second variable delay circuit 2 outputs the rising edge of the input clock signal that is next the rising edge thereof at which the phase comparing operation was carried out at step S25. Hence, it is possible to prevent the number of stages in the first variable delay circuit 1 from being increased or decreased while the input clock signal is passing through the first and second variable delay circuits 1 and 2.

At step S26, the first delay control circuit 3 receives the above notification and increases the number of stages of the first variable delay circuit 1 by one with a rough or low precision equal to approximately 200 ps towards the given phase relationship with the input clock signal. At this time, the minimum number (0) of stages in the second variable delay circuit 2 is set at step S27. If the frequency dividing circuit 18 is set to the long-period mode, the frequency dividing control circuit 17 has judged that the delay time of the first variable delay circuit 1 should be increased, and thus instructs the frequency dividing circuit 18 to operate in the short-period mode at step S28.

The first phase comparing circuit 5 receives the signals 10*c* and 13*a* from the frequency dividing circuit 18 at step S24, and then compares, at step S25, the phases thereof with each other at the next timing for comparison (steps S21, S22) defined by the frequency dividing circuit 18 operating in the short-period mode.

The first phase comparing circuit 5 continues to perform the phase comparing operation on the signals 10*c* and 13*a* until there is no phase difference therebetween. When it is judged that the signals 10*c* and 13*a* do not have any phase difference, the phase comparing operation is ended and instead the second phase comparing circuit 5 starts the phase comparing operation on the signals 10*c* and 13*a* at step S32.

If the result of step S25 shows that the signal 13*a* leads to the signal 10*c* ("−1"), the first phase comparing circuit 5 notifies, at the timing generated by the timing generating circuit 7, the first shift signal generating circuit 8 that the signal 13*a* leads to the signal 10*c*. Then, the first shift signal generating circuit 8 supplies the first delay control circuit 3 with the instruction which is based on the phase difference detected by the first phase comparing circuit 5 and causes the number of stages in the first variable delay circuit 1 to be decreased by 1 at the given timing.

At step S29, the first delay control circuit 3 receives the above notification and decreases the number of stages of the first variable delay circuit 1 by one with the low precision equal to approximately 200 ps towards the given phase relationship with the input clock signal. At this time, the maximum number n of stages in the second variable delay circuit 2 is set at step S30. If the frequency dividing circuit 18 is set to the long-period mode, the frequency dividing control circuit 17 has judged that the delay time of the first variable delay circuit 1 should be increased, and thus instructs the circuit 18 to operate in the short-period mode at step S31.

Then, the first phase comparing circuit 5 receives the signals 10*c* and 13*a* at step S24, and then compares, at step S25, the phases thereof with each other at the next timing (steps S21, S22) for comparison defined by the frequency dividing circuit 18 operating in the short-period mode.

The first phase comparing circuit 5 continues to perform the phase comparing operation on the signals 10*c* and 13*a* until there is no phase difference therebetween. When it is determined that the signals 10*c* and 13*a* do not have any phase difference, the phase comparing operation is ended and instead the second phase comparing circuit 5 starts the phase comparing operation on the signals 10*c* and 13*a* at step S32.

In the phase setting process by the first phase comparing circuit 5, the first shift signal generating circuit 8, the first delay control circuit 3 and the first variable delay circuit 1, the first phase comparing circuit 5 is controlled to have a precision that the period corresponding to the precision is longer than the delay time of one stage of the first variable delay circuit 1. The reason for the above has been described with reference to FIGS. 12A and 12B.

After the phase setting operation on the first variable delay circuit 1 is completed, at step S32 shown in FIG. 11, the second phase comparing circuit 6 performs the comparatively fine phase comparing operation on the signal 10*c* from the frequency dividing circuit 10 and the signal 13*a* from the dummy circuit 13 at the timing of the rising edge of the input clock signal.

If the result of step S32 shows that there is no phase difference between the signals 10*c* and 13*a* ("just"), the DLL circuit 19 ends the phase setting process, and the delay times thus obtained are set in the first and second variable delay circuits 1 and 2. Then, the frequency dividing circuit 17 sets the frequency dividing circuit 18 to the long-period mode at step S33. Then, the first and second phase comparing circuits 5 and 6 wait for the next timing for phase comparison. It should be noted that the DLL circuit 19 outputs the output clock signal having the given phase relationship with the input clock signal when it is determined that there is no phase difference on the signals 10*c* and 13*a*.

If it is determined, at step S32, that the signal 10*c* leads to the signal 13*a* ("+1"), the timing generating circuit 7 determines, at step S34, whether the step-up process with a carry in the first variable delay circuit 1 occurs before increasing the number of stages in the second variable delay circuit 2 by one on the basis of the detection result output by the number-of-stages detection circuit 12. The number-of-stages detection circuit 12 detects the current number of stages in the second variable delay circuit 2, and notifies the timing generating circuit 7 of the detected number of stages. In the decision made by the timing generating circuit 7, the step-up process occurs when the second phase comparing circuit 6 determines that the signal 10*c* leads to the signal 13*a* and the second variable delay circuit 2 is set so as to have a predetermined number of stages, for example, the maximum number thereof. In other cases, the step-up process does not occur.

If it is determined, at step S34, that the step-up process does not occur (NO), the second phase comparing circuit 6 notifies, at the timing defined by the timing generating circuit 7, the second shift signal generating circuit 9 that the signal 10*c* leads to the signal 13*a*. Then, the second shift signal generating circuit 9 supplies, on the basis of the phase difference detected by the second phase comparing circuit 6, the second delay control circuit 4 with an instruction to increase the number of stages in the second variable delay circuit 2 by one at the given timing. At this given timing, the second variable delay circuit 2 outputs the rising edge of the input clock signal that is next the rising edge thereof at which the phase comparing operation was carried out. Hence, it is possible to prevent the number of stages in the first variable delay circuit 1 from being increased or decreased while the input clock signal is passing through the first and second variable delay circuits 1 and 2.

In response to the above notification, the second delay control circuit 4 increases, at step S35, the number of stages of delay circuits in the second variable delay circuit 2 with the fine precision higher than the precision of the first variable delay circuit 1 so that the clock signal 2*a* having the predetermined phase relationship with the input clock signal can be output.

The second phase comparing circuit 6 and the first phase comparing circuit 5 receive the signal 10*c* and 13*a* at step S24, and the first phase comparing circuit 5 executes the phase comparing operation on the signals 10*c* and 13*a* at step S25 at the next timing for phase comparison defined by the frequency dividing circuit 18 operating in the short-period mode (S21, S22).

The DLL circuit 19 sequentially executes steps S21–S25 and S32–S35 so that the number of stages in the second variable delay circuit 2 is increased one by one until it is determined at step S25 that there is no phase difference between the signals 10*c* and 13*a* ("just") and it is determined at step S32 that there is no phase difference between the signals 10*c* and 13*a* ("just").

Then, the DLL circuit 19 ends the phase setting process so that the delay times thus obtained are set in the first and second variable delay circuits 1 and 2. Then, the frequency dividing control circuit 17 sets the operation of the frequency dividing circuit 18 to the long-period mode at step S33. Then, the first and second phase comparing circuits 5 and 6 wait for the next timing for phase comparison. At the time when it is determined there is no phase difference between the signals 10c and 13a, the DLL circuit 19 outputs the output signal having the predetermined phase relationship with the input clock signal.

If it is determined at step S34 that the step-up process occurs by the judgment of the timing generating circuit 7 (YES), the second phase comparing circuit 6 notifies, at the timing defined by the timing generating circuit 7, the second shift signal generating circuit 8 of the occurrence of the step-up process. In response to the notification, the first shift signal generating circuit 8 controls the first delay control circuit 3 to cause the number of stages in the first variable delay circuit 1 to be increased by 1 at step S36. At this time, the second delay control circuit 4 sets the number of stages in the second variable delay circuit 2 to zero (minimum number of stages) at step S37. Hence, the DLL circuit 19 can perform the phase setting based on the delay unit of one stage of the second variable delay circuit 2.

The first and second phase comparator circuits 5 and 6 receive the signals 10c and 13a at step S24, and executes, at step S25, the phase comparing operation thereon at the next timing for phase comparison defined by the frequency dividing circuit 18 operating in the short-period mode (S21, S22).

The DLL circuit 19 sequentially executes steps S21–S25, S32, S34 and S35 so that the number of stages in the second variable delay circuit 2 is reduced one by one until it is determined at step S25 that there is no phase difference between the signals 10c and 13a ("just") and it is determined at step S32 that there is no phase difference between the signals 10c and 13a ("just").

Then, the DLL circuit 19 ends the phase setting process so that the delay times thus obtained are set in the first and second variable delay circuits 1 and 2. Then, the frequency dividing control circuit 17 sets the operation of the frequency dividing circuit 18 to the long-period mode at step S33. Then, the first and second phase comparing circuits 5 and 6 wait for the next timing for phase comparison. At the time when it is determined there is no phase difference between the signals 10c and 13a, the DLL circuit 19 outputs the output signal having the predetermined phase relationship with the input clock signal.

If the second phase comparing circuit 6 determines, at step S32, that the signal 13a leads to the signal 10c, the timing generating circuit 7 determines, at step S38, whether the step-down process with a borrow occurs in the first variable delay circuit 1 before decreasing the number of stages in the second variable delay circuit 2 on the basis of the detection result output by the number-of-stages detection circuit 12. The number-of-stages detection circuit 12 detects the current number of stages of the second variable delay circuit 2, and informs the timing generating circuit 7 of the detected number of stages. The timing generating circuit 7 judges that the step-down process occurs when the second phase comparator circuit 6 determines that the signal 13a leads to the signal 10c and the second variable delay circuit 2 is set to a predetermined number of stages, for example, the minimum number of stages. In other cases, the step-down process does not occur.

When the step-down process does not occur by the judgment of the timing generating circuit 7, the second phase comparator circuit 6 informs, at the timing defined by the timing generating circuit 7, the second shift signal generating circuit 9 that the signal 10c leads to the signal 13a. In response to the notification, the second shift signal generating circuit 9 supplies the second delay control circuit 4 with an instruction which causes the number of stages in the second variable delay circuit 2 to be increased by one on the basis of the phase difference detected by the second phase comparator circuit 6. At this given timing, the second variable delay circuit 2 outputs the rising edge of the input clock signal that is next the rising edge thereof at which the phase comparing operation was carried out at step S2. Hence, it is possible to prevent the number of stages in the second variable delay circuit 2 from being increased or decreased while the input clock signal is passing through the first variable delay circuit 1 and the second variable delay circuit 2.

In response to the above notification, the second delay control circuit 4 controls, at step S39, the second variable delay circuit 2 to decrease the number of stages by one with the precision higher than that of the first variable delay circuit 1 so that the output signal having the predetermined phase relationship with the input clock signal is output.

Then, the first and second phase comparator circuits 5 and 6 receive the signal 10c from the frequency dividing circuit 10 and the signal 13a from the dummy circuit 13 at step S24, and compares, at step S25, the phase comparing operation thereon at the next timing for phase comparison defined by the frequency dividing circuit 18 which is operating in the short-period mode (steps S21, S22).

The DLL circuit 19 sequentially executes steps S21–S25, S32, S38 and S39 so that the number of stages in the second variable delay circuit 2 is increased one by one until it is determined at step S2 that there is no phase difference between the signals 10c and 13a ("just") and it is determined at step S7 that there is no phase difference between the signals 10c and 13a ("just").

Then, the DLL circuit 19 ends the phase setting process so that the delay times thus obtained are set in the first and second variable delay circuits 1 and 2. The frequency dividing control circuit 17 sets the operation of the frequency dividing circuit 18 to the long-period mode at step S33. Then the first and second phase comparing circuits 5 and 6 wait for the next timing for phase comparison. At the time when it is determined there is no phase difference between the signals 10c and 13a, the DLL circuit 19 outputs the output signal having the predetermined phase relationship with the input clock signal.

If the step-down process occurs by the judgment of the timing generating circuit 7 at step S38, the second phase comparator circuit 6 informs, at the timing defined by the timing generating circuit 7, the first shift signal generating circuit 8 of the occurrence of the step-down process. In response to the above notification, the first shift signal generating circuit 8 supplies the first delay control circuit 3 with an instruction which the number of stages in the first variable delay circuit 1 to be decreased by one. In response to the above notification, the first delay control circuit 3 controls the first variable delay circuit 1 to reduce the number of stages by one at step S40. At this time, the second delay control circuit 4 sets the second variable delay circuit 2 to the maximum number n of stages at step S41. Hence, the DLL circuit 19 can perform the phase setting based on the delay time of one stage of the second variable delay circuit 2 even when the step-down process occurs in the first variable delay circuit 1.

The first and second phase comparator circuits 5 and 6 receives the signals 10c and 13a at step S24, and executes the phase comparing operation thereon at step S32 at the next timing for phase comparison defined by the frequency dividing circuit 18 which is operating in the short-period mode.

The DLL circuit 19 sequentially executes steps S21–S25, S32, S38 and S39 so that the number of stages in the second variable delay circuit 2 is reduced one by one until it is determined at step S25 that there is no phase difference between the signals 10c and 13a ("just") and it is determined at step S32 that there is no phase difference between the signals 10c and 13a ("just").

Then, the DLL circuit 19 ends the phase setting process so that the delay times thus obtained are set in the first and second variable delay circuits 1 and 2. Then, the frequency dividing control circuit 17 sets the operation of the frequency dividing circuit 18 to the long-period mode at step S33. Then, the first and second phase comparing circuits 5 and 6 wait for the next timing for phase comparison. At the time when it is determined there is no phase difference between the signals 10c and 13a, the DLL circuit 19 outputs the output signal having the predetermined phase relationship with the input clock signal. As has been described previously, the reference for judgment in the second phase comparator circuit 6 is set to the position corresponding to half the delay time equal to one stage of the first variable delay circuit 1.

Figure 15:
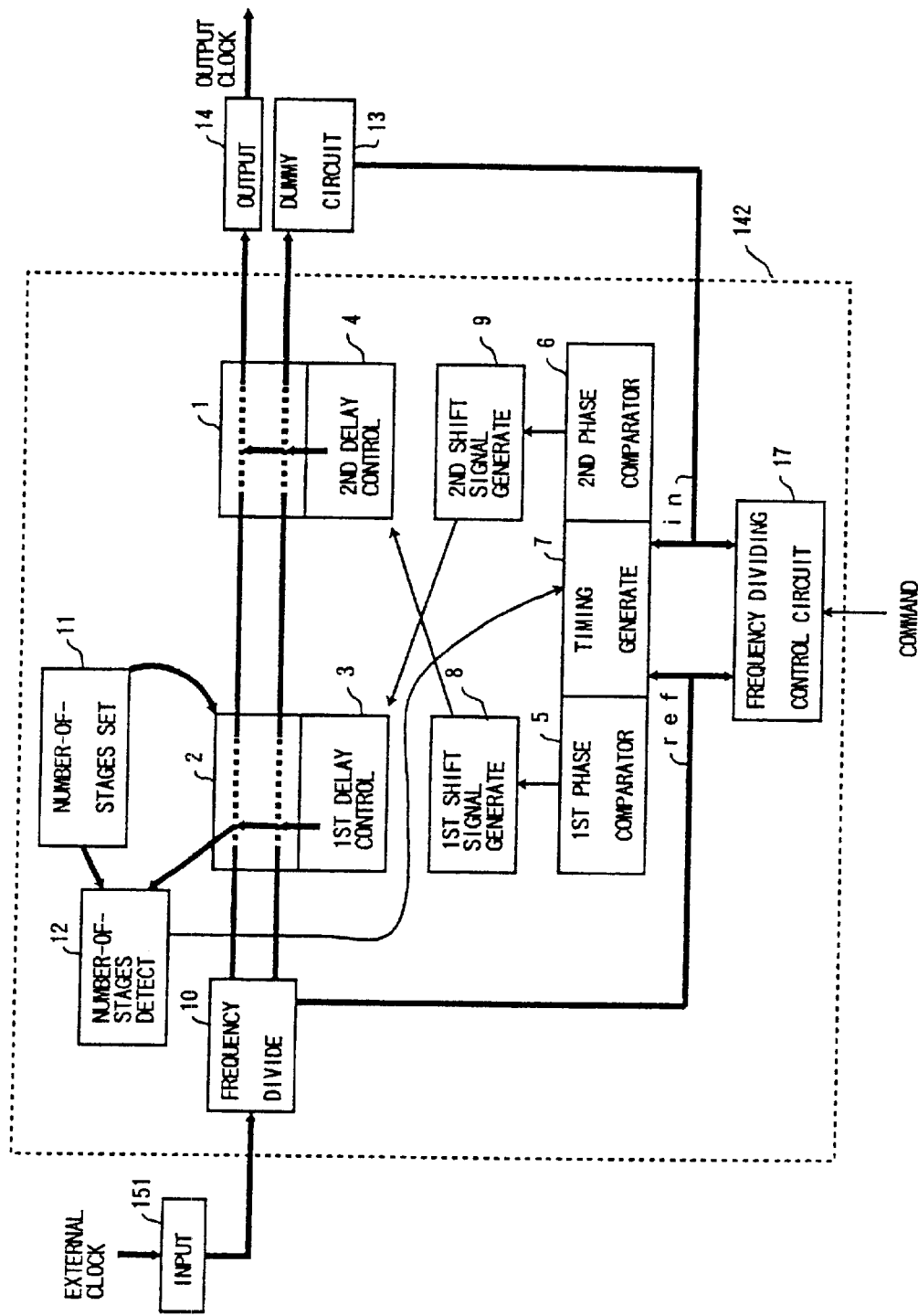
FIG. 15 is a block diagram of a variation of the structure shown in FIG. 9.

FIG. 15 is a block diagram of a DLL circuit 142, which is a variation of the DLL circuit 19 shown in FIG. 9. In the DLL circuit 142, the input clock signal applied thereto is delayed by the second variable delay circuit 2 and the first variable delay circuit 1 in this order.

More particularly, the DLL circuit 142 is made up of the first variable delay circuit 1, the second variable delay circuit 2, the first delay control circuit 3, the second delay control circuit 4, the first phase comparator circuit 5, the second phase comparator circuit 6, the timing generating circuit 7, the first shift signal generating circuit 8, the second shift signal generating circuit 9, the number-of-stages setting circuit 11, the number-of-stage detecting circuit 12, the frequency dividing control circuit 17, and the frequency divider 18. The second variable delay circuit 2 and the first variable delay circuit 1 serially delay the input clock signal so that the output clock signal has a predetermined phase relationship with the input clock signal. The individual structural elements shown in FIG. 15 are the same as corresponding those shown in FIG. 9. In the DLL circuit 142, the process to be executed at the time of power on and the phase setting process are the same as corresponding those of the DLL circuit 19, and a description thereof will be omitted.

Figure 16:
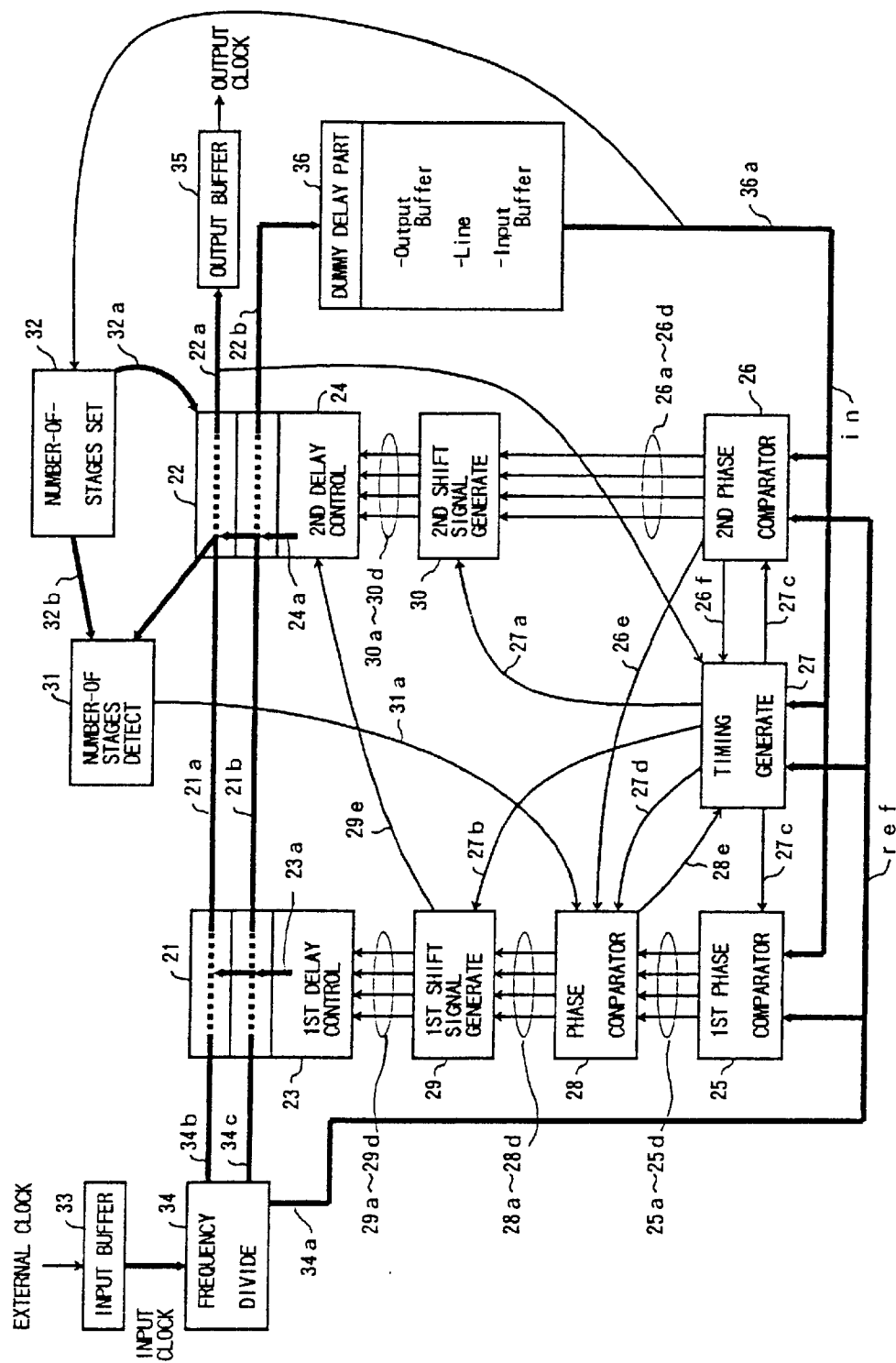
FIG. 16 is a block diagram of a semiconductor integrated circuit device having a DLL circuit according to the present invention.

FIG. 16 is a block diagram of a semiconductor integrated circuit device equipped with the DLL circuit of the present invention. The DLL circuit shown in FIG. 16 corresponds to the DLL circuit 16 shown in FIG. 8.

The semiconductor device shown in FIG. 16 includes a first delay part 21, a second delay part 22, a first control part 23, a second control part 24, a first phase comparator part 25, a second phase comparator part 26, a timing generating part 27, a phase control part 28, a first shift signal generating part 29, a second shift signal generating part 30, a number-of-stages detecting part 31, a number-of-stages setting part 32, an input buffer 33, a frequency divider 34, an output buffer 35 and a dummy delay part 36. An external clock signal applied to the input buffer 33 is delayed and output via the output buffer 35 so that the output signal thus obtained is in phase with the external clock signal.

The first delay part 21 functions as the first variable delay circuit, and stepwisely controls the delay time with a comparatively low precision equal to, for example, 200 ps by changing the number of stages of delay circuits provided therein.

The second delay part 22 functions as the second variable delay circuit, and is configured as shown in, for example, FIG. 4. The second delay part 22 stepwisely controls the delay time with a comparatively high precision by, for example, controlling the gate capacitance of at least one transistor under the control of the gate voltage. The second delay part 22 may be one of the configurations shown in FIGS. 5, 6 and 7.

The first control part 23 functions as the first delay control circuit, and determines the number of stages which should be set in the first delay part 21 with the low precision (200 ps, for example).

The second control part 24 functions as the second delay control circuit, and determines the delay time which should be set in the second delay part 22 with the high precision.

The first phase comparator part 25 functions as a part of the first phase comparator circuit, and compares, with the low precision of the first delay part 21, a reference signal obtained by dividing the frequency of the input clock signal at a given frequency dividing ratio with a signal having the delay time equal to the sum of the delay times of the input buffer 33, the first and second delay parts 21 and 22, the output buffer 35 and the delay times of the wiring lines interposed therebetween, and detects the phase difference therebetween.

The second phase comparator part 26 functions as the second phase comparator circuit, and performs the same comparing operation as described above with the high precision of the second delay part 22.

The timing generating circuit 27 functions as the timing generating circuit, and generates a write signal for writing of the phase differences respectively detected by the first and second phase comparator parts 25 and 26 and an enable signal which allows the delay times of the first and second delay parts 21 and 22 to be varied.

The phase control part 28 functions as another part of the first phase comparator circuit, and controls the step-up and step-down processes during the phase setting process.

The first shift signal generating part 29 functions as the first shift signal generating circuit, and controls, based on the phase difference detected by the first phase comparator part 25, the first control part 23 to increase or decrease the number of stages in the first delay part 21.

The second shift signal generating part 30 functions as the second shift signal generating circuits, and controls, based on the phase difference detected by the second phase comparator part 26, the second control part 24 to increase or decrease the number of stages in the second delay part 22.

The number-of-stages setting part 32 functions as the number-of-stages setting circuit, and determines the maximum number n of the second delay part 22.

The number-of-stages detecting part 31 functions as the number-of-stages detecting circuit, and detects the number of stages set in the second delay part 22. When the maximum or minimum number of stages is set in the second delay part 22, the number-of-stages detecting part 31 informs the phase control part 28.

The frequency divider 34 functions as the frequency dividing circuit, and frequency-divides the input clock signal so that timings for phase comparison can be defined.

The dummy delay part 36 delays its input signal by the delay time equal to the sum of the circuit delay times of the input buffer 33 and the output buffer 35 and the delay times of the wiring lines provided therebetween.

When electricity is supplied to the circuit shown in FIG. 16, the first delay part 21 is set to a predetermined number of stages on the basis of the circuit delay times tin, t1, t2 and tout of the input buffer 33, the first delay part 21, the second delay part 22 and the output buffer 35 and the delay time p of the wiring line from the input to the output. Hence, the initial setting operation executed at the time of power on can be simplified. The above predetermined number of stages in the first delay part 21 corresponds to the sum of tin, t1, t2, tout, tp and T where T is the delay time of the first delay part 21 other than the circuit delay time t1 thereof. The delay time equal to one stages of the first delay circuit 21 can be set beforehand by a command externally supplied.

The input buffer 33 receives the external clock signal, which is delayed by tin. The resultant clock signal is then input to the frequency divider 34 as the input clock signal. The frequency divider 34 supplies the first delay part 21 with a clock signal 34c of the same frequency as that of the input clock signal (the delay time of the frequency divider 34 is neglected for the sake of convenience). The first delay part 21 delays the clock signal 34c by the sum of t1 and T. The clock signal thus delayed is then supplied to the second delay part 22 as a clock signal 21a.

The second delay part 22 delays the clock signal 21a by t2, and supplies a resultant clock signal 22a to the output buffer 35. The number of stages in the second delay part 22 at the time of power on is set to zero, and there is no delay other than the circuit delay time t2. The clock signal 22a is delayed by tout in the output buffer 35, and is output as the output clock signal. This output clock signal lags behind the input clock signal by one cycle and is in phase therewith.

The maximum number n of stages in the second delay part 22 is not yet determined at the time of power on. Hence, the number-of-stages setting part 32 executes a process for determining the maximum number n of stages. In the above process, the number-of-stages setting part 32 calculates the delay time obtained when the clock signal has passed through an arbitrary number x of stages of the second part 22, and calculates the delay time obtained when the clock signal has passed through the (n+1) stages. The number-of-stages setting part 32 determines whether the delay time of one stage of the first delay part 21 is equal to or greater than the delay time equal to the n stages of the second delay part 22 but smaller than the delay time equal to the (n+1) stages. When the number-of-stages setting part 32 detects the value of x, it determines the value of x as being the maximum number n of stages of the second delay part 22. The above process is repeatedly carried out until the value of x which meets the above condition is detected. Then, the number-of-stages setting part 32 notifies the second delay part 22 of the maximum number n of stages.

A description will be given of the phase setting process of the device shown in FIG. 16 with reference to FIGS. 17 through 24 in addition to FIG. 10 (already described).

The external clock signal is delayed by tin in the input buffer 33 and is applied to the frequency divider 34. Then, the frequency divider 34 outputs the signal 34b to the first delay part 21 and outputs, as the reference signal "ref", the clock signal 34a to the first phase comparator part 25, the second comparator part 26 and the timing generating part 27 (step S1 shown in FIG. 10). At the time of power on, the frequency divider 34 is set so as to have a comparatively small frequency dividing ratio in order to increase the number of times for phase comparison. Hence, the first and second delay parts 21 and 22 can be set to the initial values at a high speed.

The first delay part 21 delays the signal 34b by the sum of t1 and T and thus outputs a resultant signal 21b. The second delay part 22 receives the signal 21b, which is delayed by t2 therein. Then, a resultant signal 22b is output to the dummy delay part 36, which delays the signal 22b by the sum of tin, tout and p, and outputs the signal 36a ("in") to be compared with the reference signal 34a (step S1).

Figure 17:
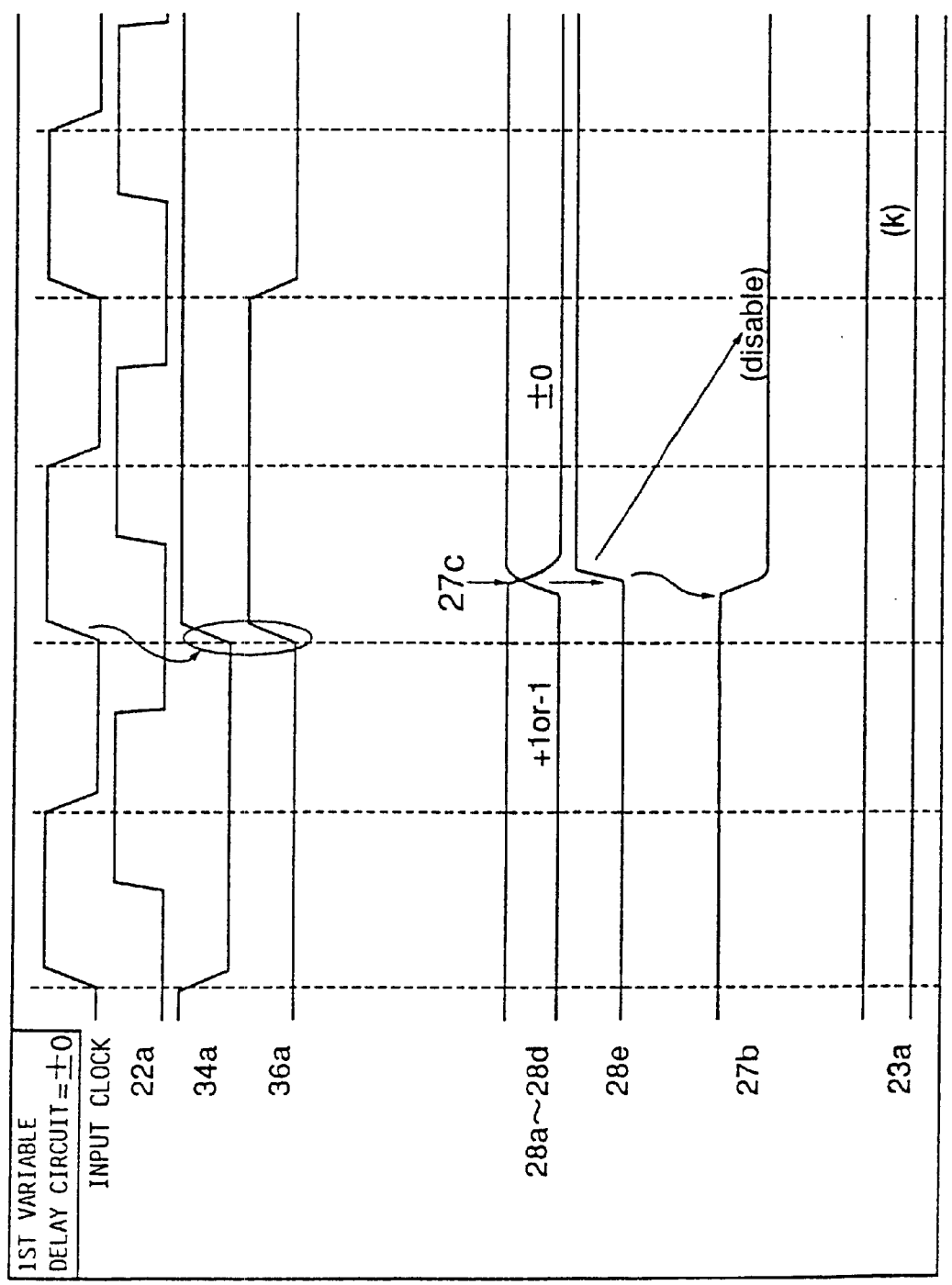
FIGS. 17, 18, 19, 20, 21, 22, 23 and 24 are respectively timing charts of the phase setting process.

As shown in FIG. 17, the first phase comparator part 25 compares, at the timing of the rising edge of the input clock signal, the signals 34a and 36a with each other (step S2). The above operation appears in each of FIGS. 18 through 24. When the first phase comparator part 25 is operating and the setting of the number of stages in the first delay part 21 is in progress, the second phase comparator part 26 is in the disabled state so that the amount of power consumed can be reduced.

A description will be given, with reference to FIGS. 16 and 17, of a case where the first phase comparator part 25 judges that there is no phase difference between the signals 36a and 34a ("just" at step S2).

The first phase comparator part 25 outputs, at the timing of a signal 27c generated by the timing generating circuit 27, signals 25a–25d, which indicate that there is no phase difference. The phase controller 28 receives the signals 25a–25d and sets a signal 28e to the high level, which shows no phase difference. The timing generating part 27 receives the signal 28e, and sets a signal 27b operating the first shift signal generating circuit 29 to the low level (disabled state). Hence, the first shift signal generating circuit 29 cannot be operated. Since the first control part 23 does not perform the setting of the number of stages in the first delay part 21, the signal 23a indicating the number of stages in the first delay part 21 maintains the value of the kth stage. Then, the delay setting process is ended. Next, the second phase comparator part 26 performs the phase comparing operation on the signals 34a and 36a (step S7).

Figure 18:
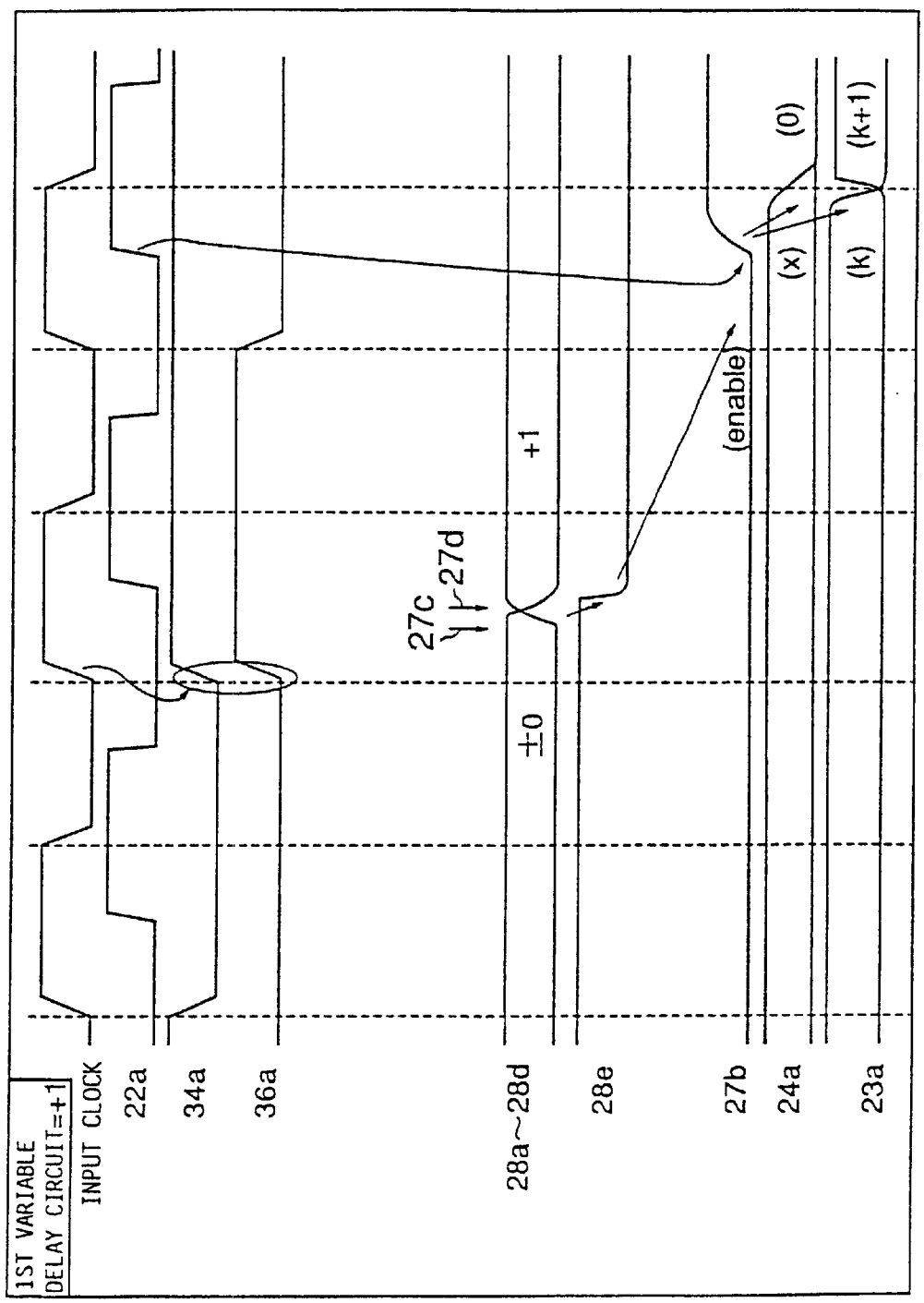

A description will be given, with reference to FIGS. 16 and 18, of a case where the first phase comparator part 25 judges that the signal 34a leads to the signal 36a ("+1" at step S2).

The first phase comparator circuit 25 outputs, at the timing of the signal 27c, supplies the phase control part 28 with the phase difference information formed by the signals 25a–25d. Then, the phase control part 28 sets the signal 28e to the low level so that a request for setting of the number of stages in the first delay part 21 is issued. Further, the phase control part 28 supplies, at the timing of the signal 27d, the first shift signal generating part 29 with signals 28a–28d forming information indicating that the signal 34a leads to the signal 36a. The timing generating part 27 receives the signal 28e and enables the signal 27b (high level) for enabling the first shift signal generating circuit 29 at the time when the second delay part 22 outputs the rising edge of the input clock signal immediately following the rising edge thereof to be subjected to the phase comparison. Hence, the first shift signal generating part 29 is enabled, and outputs signals 29a–29d to the first control part 23. The signals 29a–29d form information which causes the number of stages in the first delay part 21 to be increased by one. In response to the signals 29a–29d, the first control part 23 outputs the signal 23a, which causes the first delay part 21 to be set to the (k+1)th stage (step S3), as shown in FIG. 18.

Further, the first shift signal generating part 29 outputs a signal 29e, which indicates that the number of stages in the second delay part 22 should be set to zero (minimum number). The second control part 24 outputs a signal 24a, which sets the second delay part 22 to be set to the zeroth stage. Hence, the second delay part 22 is set to the zeroth stage (step S4).

The first phase comparator part 25 receives the signals 34a and 36a at step S1 and performs the phase comparing operation thereon at step S2 at the next timing for comparison defined by the frequency divider 34. The first phase comparator part 25 repeatedly executes the process of the steps S1 to S4 until it is judged that there is no phase difference between the signals 34a and 36a. When it is judged that there is no phase different ("just" at step S2), the phase comparing process is ended, and instead the second phase comparator part 26 initiates the phase comparing operation on the signals 34a and 36a (step S7).

Figure 19:
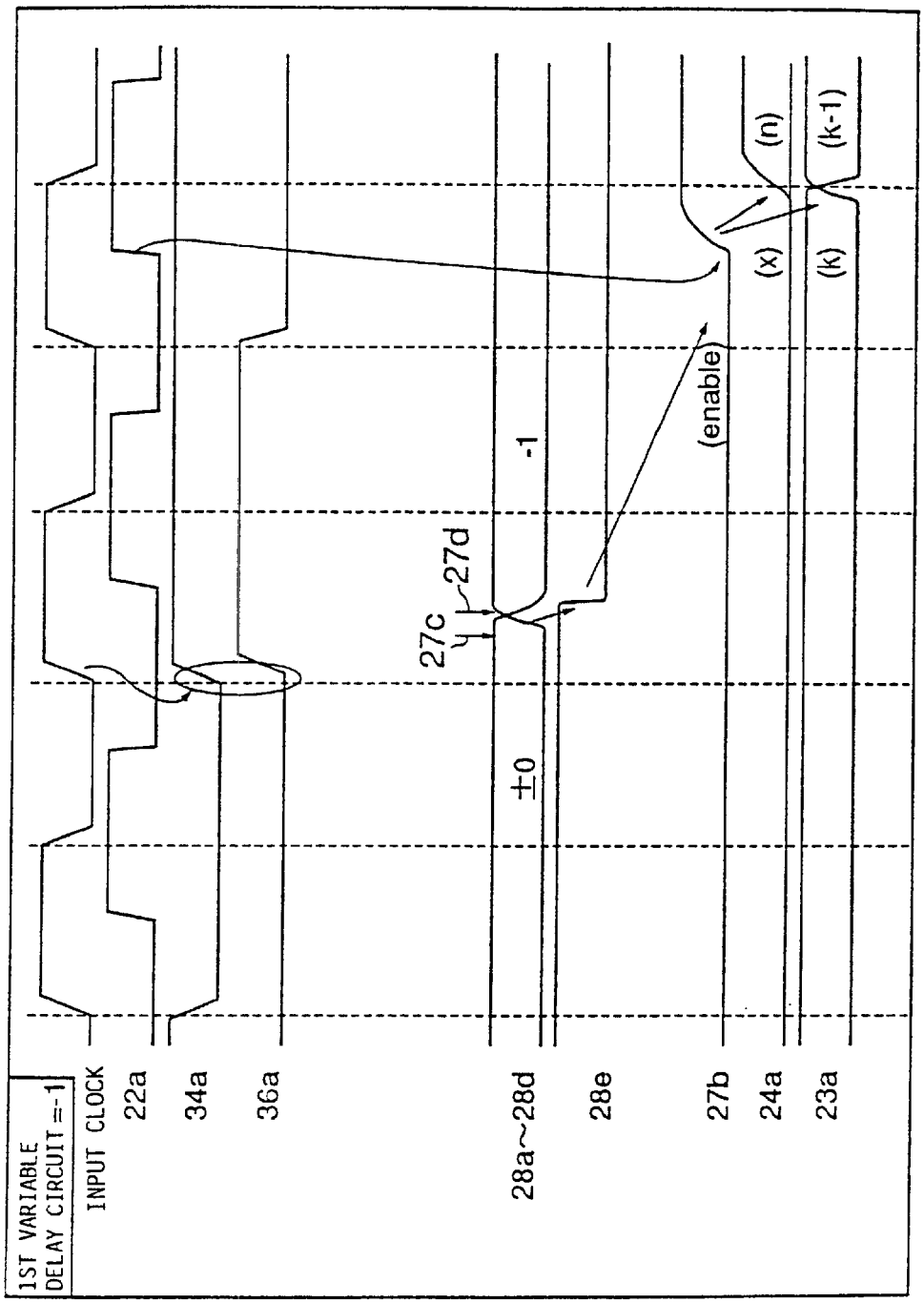

A description will be given, with reference to FIGS. 16 and 19 of a case where it is judged that the signal 36a leads to the signal 34a by the first phase comparator circuit 25 ("−1" at step S2).

The first phase comparator part 25 outputs, at the timing of the signal 27c, supplies the phase control part 28 with the phase difference information formed by the signals 25a–25d. Then, the phase control part 28 sets the signal 28e requesting the setting of the number of stages in the first delay part 21 to the low level, and further outputs, at the timing of the signal 27d, the signals 28a–28d forming the information indicating that the signal 36a leads to the signal 34a. The timing generating part 27 receives the signal 28e and enables the signal 27b (high level) for enabling the first shift signal generating circuit 29 at the time when the second delay part 22 outputs the rising edge of the input clock signal immediately following the rising edge thereof to be subjected to the phase comparison. Hence, the first shift signal generating part 29 is enabled, and outputs signals 29a–29d to the first control part 23. The signals 29a–29d form information which causes the number of stages in the first delay part 21 to be decreased by one. In response to the signals 29a–29d, the first control part 23 outputs the signal 23a, which causes the first delay part 21 to be set to the (k−1)th stage (step S5), as shown in FIG. 19.

Further, the first shift signal generating part 29 outputs the signal 29e, which indicates that the number of stages in the second delay part 22 should be set to n (maximum number). The second control part 24 outputs the signal 24a, which sets the second delay part 22 to be set to the nth stage. Hence, the second delay part 22 is set to the nth stage (step S6).

The first phase comparator part 25 receives the signals 34a and 36a at step S1 and performs the phase comparing operation thereon at step S2 at the next timing for comparison defined by the frequency divider 34. The first phase comparator part 25 repeatedly executes the process of the steps S1, S2, S5 and S6 until it is judged that there is no phase difference between the signals 34a and 36a. When it is judged that there is no phase different ("just" at step S2), the phase comparing process is ended, and instead the second phase comparator part 26 executes the phase comparing operation on the signals 34a and 36a (step S7).

The first phase comparator part 25 has a precision greater than the delay time equal to one stage of the first delay part 21 as has been described previously.

After the phase of the first delay part 21 is determined by the above-mentioned phase setting process by the first comparator part 25, the phase control part 28, the first shift signal generating part 29, the first control part 23 and the first delay part 21, the second phase comparator part 26 performs, at the timing of the rising edge of the input clock signal, the phase comparing operation on the signals 34a and 36a with the precision higher than that of the first phase comparator part 25 (step S7).

Figure 20:
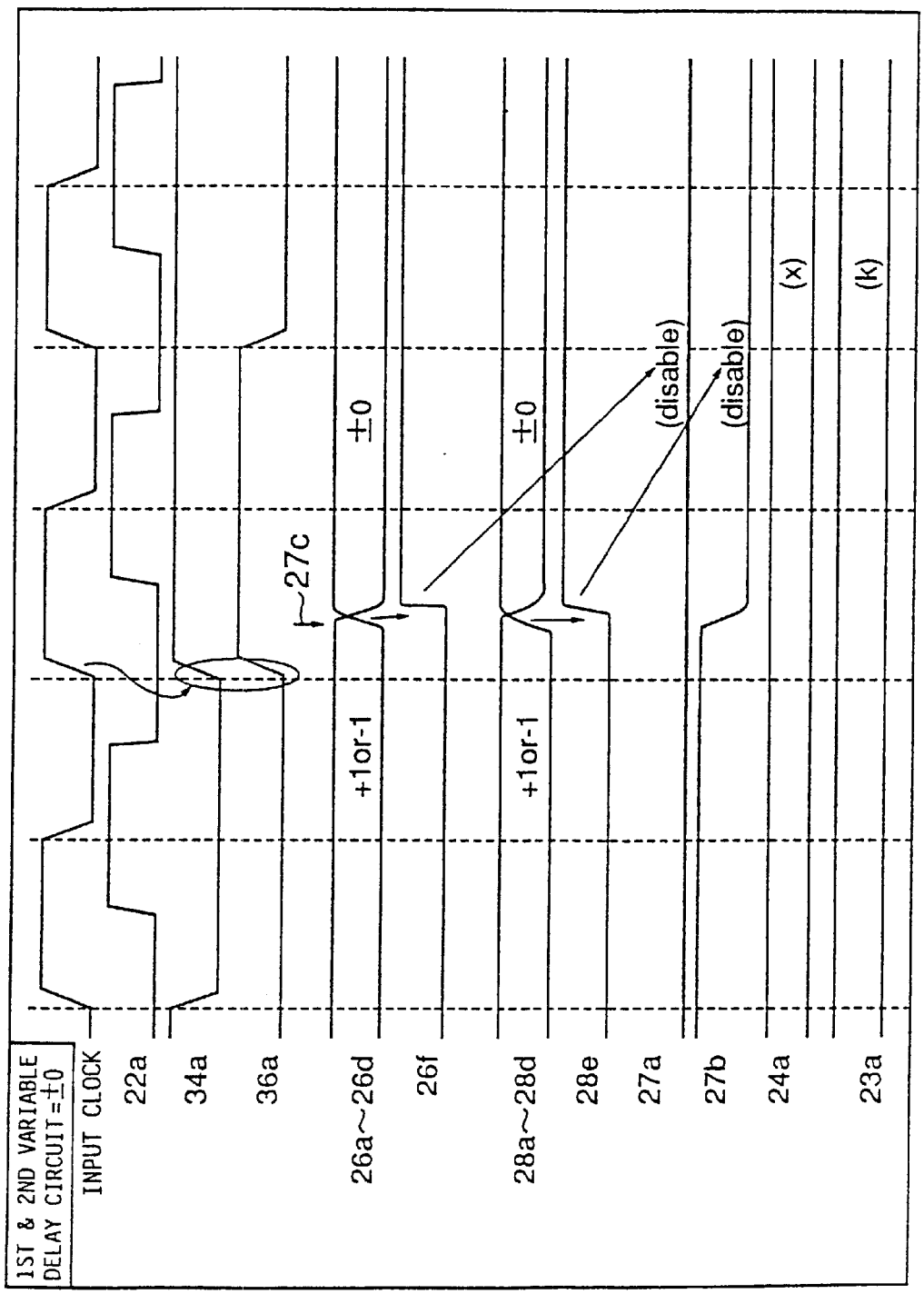

A description will be given, with reference to FIGS. 16 and 20, of a case where the second phase comparator part 26 judges that there is no phase difference between the signals 34a and 36a ("just" at step S7).

The second phase comparator part 26 supplies, at the timing of the signal 27c, the second shift signal generating part 30 with the signals 26a–26d forming information that there is no phase difference. Further, the second phase comparator part 26 sets a signal 26f indicating no phase difference to the high level. Then, the timing generating part 27 sets a signal 27a enabling the second shift signal generating part 30 to the low level (disabled state), so that the second shift signal generating part 30 is maintained in the disabled state. Hence, the second control part 24 does not perform the setting of the second delay part 22, and thus the signal 24a indicates the kth stage in the second delay part 22. Then, the delay setting process for th second delay part 22 is ended, and the first and second phase comparator parts 25 and 26 wait for the next timing for phase comparison. At the time when it is judged that there is no phase difference between the signals 34a and 36a, the external clock signal and the output clock signal are in phase.

If the second phase comparing part 26 judges that the signal 34a leads to the signal 36a ("+1" at step S7), the second phase comparator part 26 supplies, at the timing of the signal 27c, the second shift signal generating circuit 30 with the signals 26a–26d indicating that the signal 34a leads to signal 36a. Further, the second shift signal generating part 30 sets the signal 26f to the low level, which is applied to the timing generating circuit 27, and sets the signal 26e to the high level (the delay time is too short), which is applied to the phase control part 28. Then, the phase control part 28 determines whether the step-up process occurs (step S8). The step-up process occurs when the signal 31a indicates the maximum number n of stages in the second delay part 22 and the signal 26e shows that the delay time is too short.

A description will now be given, with reference to FIGS. 16 and 21, of a case where the phase control part 28 determines that the step-up process does not occur (NO at step S8).

Figure 21:
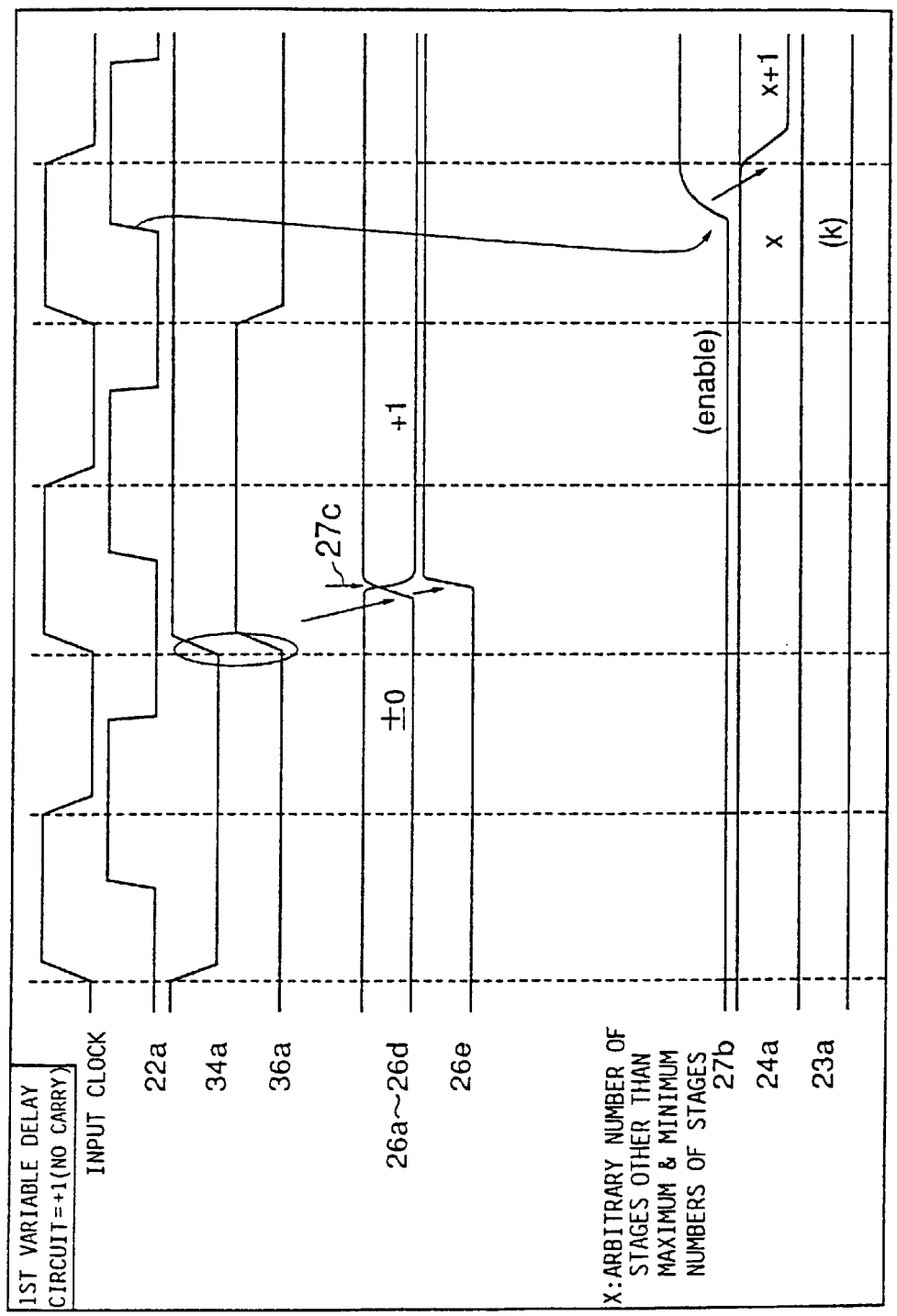

In the case shown in FIG. 21, the signal 26e shows that the delay time is too short, but the signal 31a does not indicate the maximum number of stages in the second delay part 22. Hence, the step-up process does not occur. Thus, the phase control part 28 sets the signal 28e to the high level so that the setting of the number of stages in the first delay part 21 is not requested.

The timing generating part 27 receives the signals 28e and 26f, and sets the signal 27a to the high level (enabled state) at the time when the second delay part 22 outputs the rising edge of the input clock signal immediately following the rising edge thereof to be subjected to the phase comparison. Hence, the second shift signal generating part 30 is enabled, and outputs signals 30a–30d to the second control part 24. The signals 30a–30d form information which causes the number of stages in the second delay part 22 to be increased by one. In response to the signals 30a–30d, the second control part 24 outputs the signal 24a, which causes the second delay part 22 to be set to the (k+1)th stage (step S9) with the precision higher than that of the first delay part 21, as shown in FIG. 18.

The first and second phase comparator parts 25 and 26 receive the signals 34a and 36a at step S1. Then, the first phase comparator part 25 perform the phase comparing operation on the received signals at step S2 at the next timing for comparison defined by the frequency divider 34. The steps S1, S2 and S7–S9 are repeatedly executed. The number of stages in the second delay part 22 is increased one by one until it is judged that there is no phase difference between the signals 34a and 36a by the first and second phase comparator parts 25 and 26 ("just" at step S7).

When the first and second phase comparator parts 25 and 26 respectively judge that there is no phase difference on the signals 34a and 36a, the phase setting process is ended and the delay times thus obtained are set in the firs and second delay parts 21 and 22. Then, the first and second phase comparator parts 25 and 26 wait for the next timing for phase comparison. At the time when it is judged that there is no phase difference between the signals 34a and 36a, the external clock signal and the output clock signal from the output buffer 35 are in phase.

A description will now be given, with reference to FIGS. 16 and 22, of a case where the step-up process occurs by the judgment of the phase control part 28 (YES at step S8).

Figure 22:
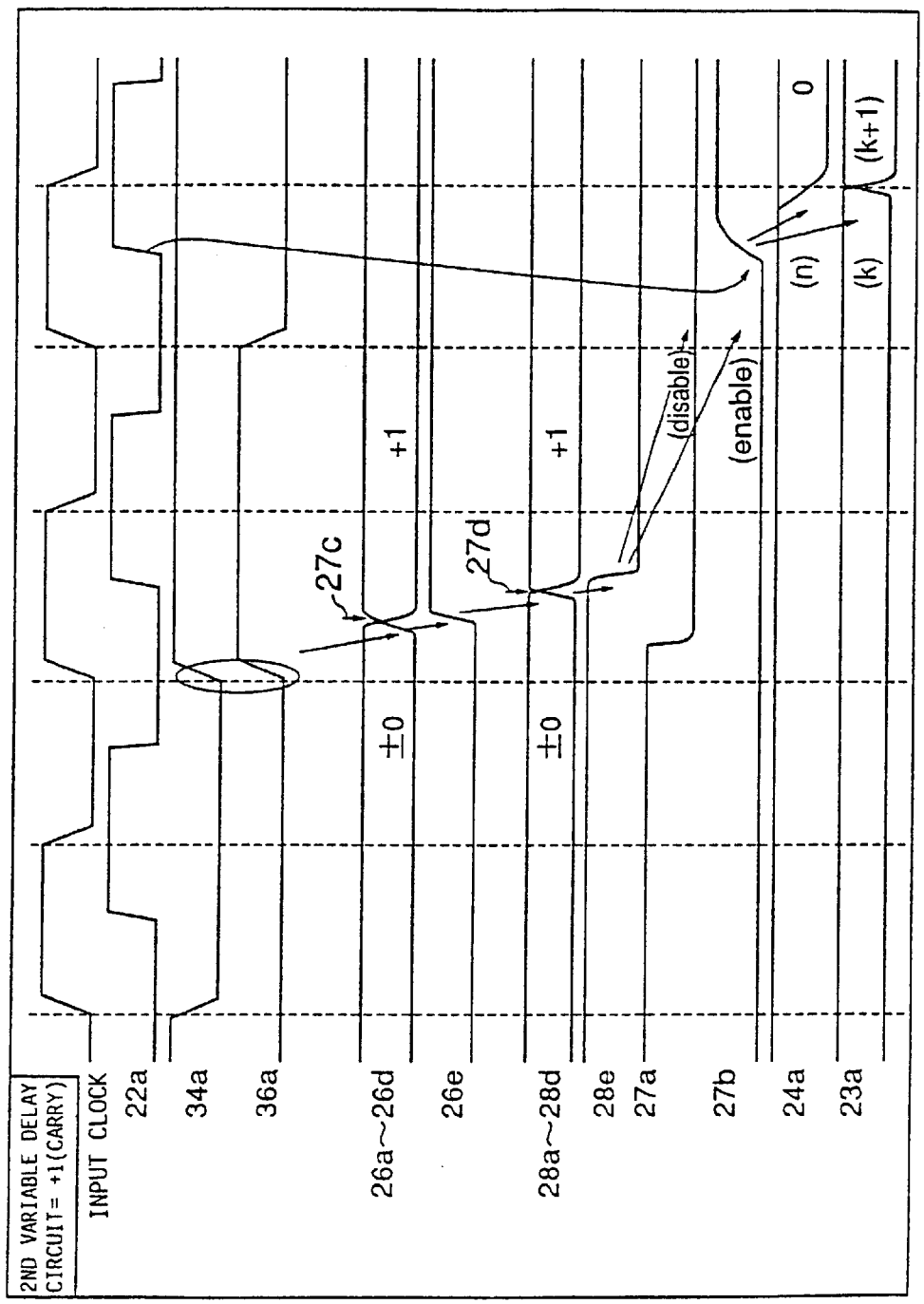

In the case shown in FIG. 22, the signal 26e shows that the delay time is too short, but the signal 31a indicates the maximum number of stages in the second delay part 22. Hence, the step-up process occurs. Thus, the phase control part 28 sets the signal 28e to the low level so that the setting of the number of stages in the first delay part 21 is requested. Further, the phase control part 28 outputs, at the timing of the signal 27d, the signals 28a–28d showing that the signal 34a leads to the signal 36a.

The timing generating part 27 receives the signals 28e and 26f, and sets the signal 27a to the low level (disabled state) and sets the signal 27b to the high level at the time when the second delay part 22 outputs the rising edge of the input clock signal immediately following the rising edge thereof to be subjected to the phase comparison. Hence, the second shift signal generating part 30 is disabled, while the first shift signal generating part 29 is enabled.

The first shift signal generating part 29 outputs signals 29a–29d to the first control part 23. The signals 29a–29d form information which causes the number of stages in the first delay part 21 to be increased by one. In response to the signals 29a–29d, the first control part 23 outputs the signal 23a, which causes the first delay part 21 to be set to the (k+1)th stage (step S10).

Further, the first shift signal generating part 29 outputs the signal 29e, which sets the number of stages in the second delay part 22 to zero (minimum number). The second control part 24 outputs the signal 24a, which sets the second delay part 22 to the zeroth stage, so that the second delay part 22 is set at the zeroth stage (step S11). Hence, it is possible to perform the phase setting based on the basis of the delay time equal to one stage of the second delay part 22.

The first and second phase comparator parts 25 and 26 receive the signals 34a and 36a at step S1. Then, the first phase comparator part 25 performs the phase comparing operation on the received signals at step S2 at the next timing for comparison defined by the frequency divider 34. The steps S1, S2 and S7–S9 are repeatedly executed. The number of stages in the second delay part 22 is increased one by one until it is judged that there is no phase difference between the signals 34a and 36a by the first and second phase comparator parts 25 and 26 ("just" at step S7).

When the first and second phase comparator parts 25 and 26 respectively judge that there is no phase difference on the signals 34a and 36a, the phase setting process is ended and the delay times thus obtained are set in the first and second delay parts 21 and 22. Then, the first and second phase comparator parts 25 and 26 wait for the next timing for phase comparison. At the time when it is judged that there is no phase difference between the signals 34a and 36a, the external clock signal and the output clock signal from the output buffer 35 are in phase.

If the second phase comparing part 26 judges that the signal 36a leads to the signal 34a ("−1" at step S7), the second phase comparator part 26 supplies, at the timing of the signal 27c, the second shift signal generating part 30 with the signals 26a–26d indicating that the signal 36a leads to signal 34a. Further, the second shift signal generating part 30 sets the signal 26f to the low level, which is applied to the timing generating circuit 27, and sets the signal 26e to the high level (the delay time is too long), which is applied to the phase control part 28. Then, the phase control part 28 determines whether the step-down process occurs (step S12). The step-down process occurs when the signal 31a indicates the minimum number (zero) of stages in the second delay part 22 and the signal 26e shows that the delay time is too long. In this case, the step-down process does not occur because the signal 31a does not indicate the minimum number of stages although the signal 26e indicates that the delay time is too long.

A description will now be given, with reference to FIGS. 16 and 23, of a case where the step-down process does not occur by the judgment of the phase control part 28.

Figure 23:
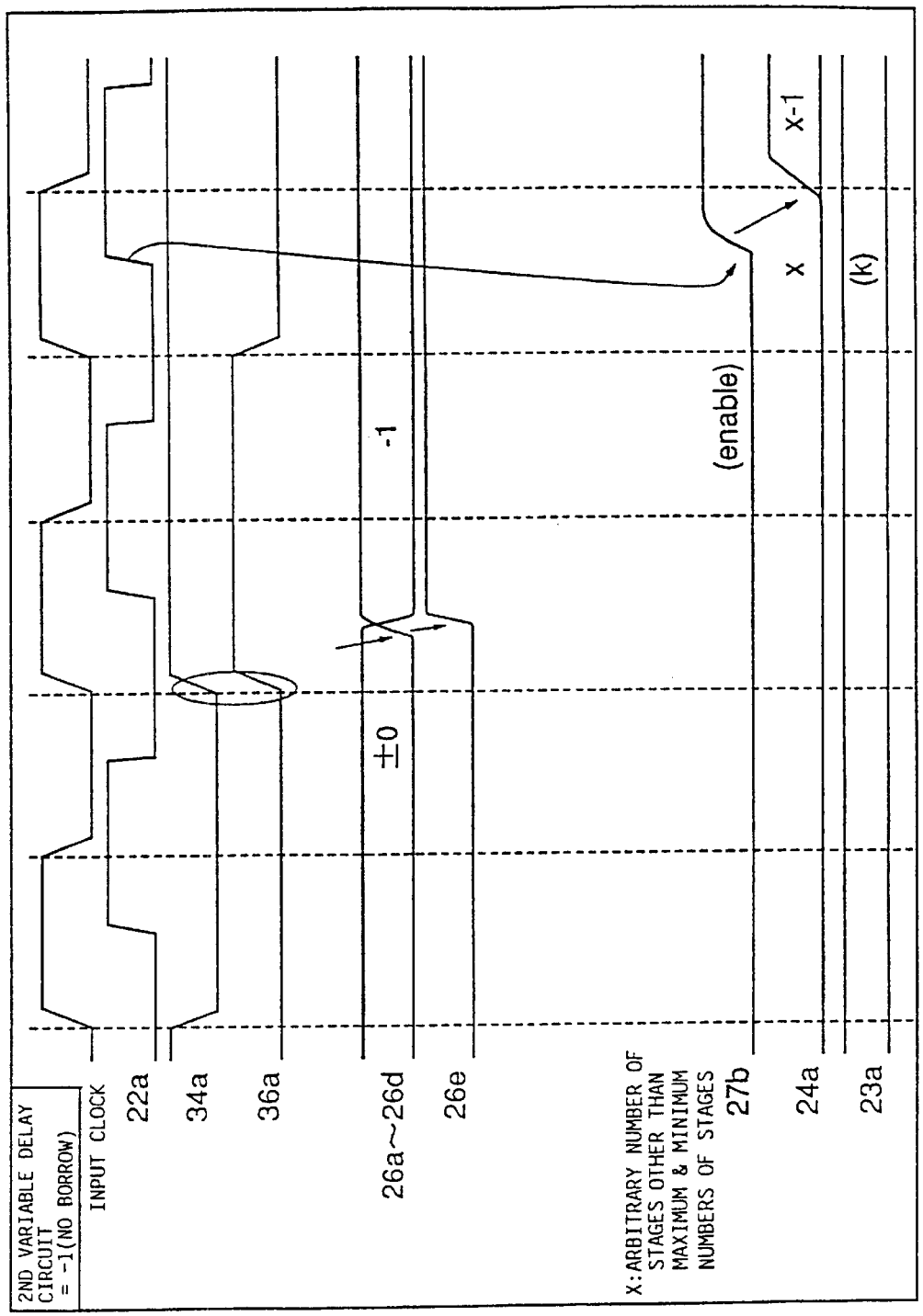

In the case shown in FIG. 23, the signal 26e shows that the delay time is too short, whereas the signal 31a does not indicate the minimum number of stages in the second delay part 22. Hence, the step-down process does not occur. Hence, the phase control part 28 sets the signal 28e to the high level so that the setting of the number of stages in the first delay part 21 is not requested.

The timing generating part 27 receives the signals 28e and 26f, and sets the signal 27a to the high level (enabled state), so that the second shift signal generating circuit 29 is enabled. Then, the second shift signal generating part 30 supplies the second control part 24 with the signals 30a–30d which causes the number of stages in the second delay part 22 to be decreased by one. Then, the second control part 24 outputs the signal 24a which causes the second delay part 22 to be changed from the xth stage to the (x−1)th stage. Hence, the number of stages of the second delay part 22 is decreased by one and is thus set to the (x−1)th stage with the precision higher than that of the first delay part 21.

The first and second phase comparator parts 25 and 26 receive the signals 34a and 36a at step S1. Then, the first phase comparator part 25 performs the phase comparing operation on the received signals at step S2 at the next timing for comparison defined by the frequency divider 34. The sequence of the steps S1, S2, S7, S12 and S13 is repeatedly executed. The number of stages in the second delay part 22 is decreased one by one until it is judged that there is no phase difference between the signals 34a and 36a by the first and second phase comparator parts 25 and 26 ("just" at step S7).

Then, the phase setting process is ended, and the delay times thus obtained are set in the first and second delay parts 21 and 22. The first and second phase comparator parts 25 and 26 wait for the next timing for phase comparison. At the time when it is judged that there is no phase difference between the signals 34a and 36a, the external clock signal and the output clock signal from the output buffer 35 are in phase.

A description will now be given, with reference to FIGS. 16 and 24, of a case where the step-down process occurs by the judgment of the phase control part 28 (YES at step S12).

Figure 24:
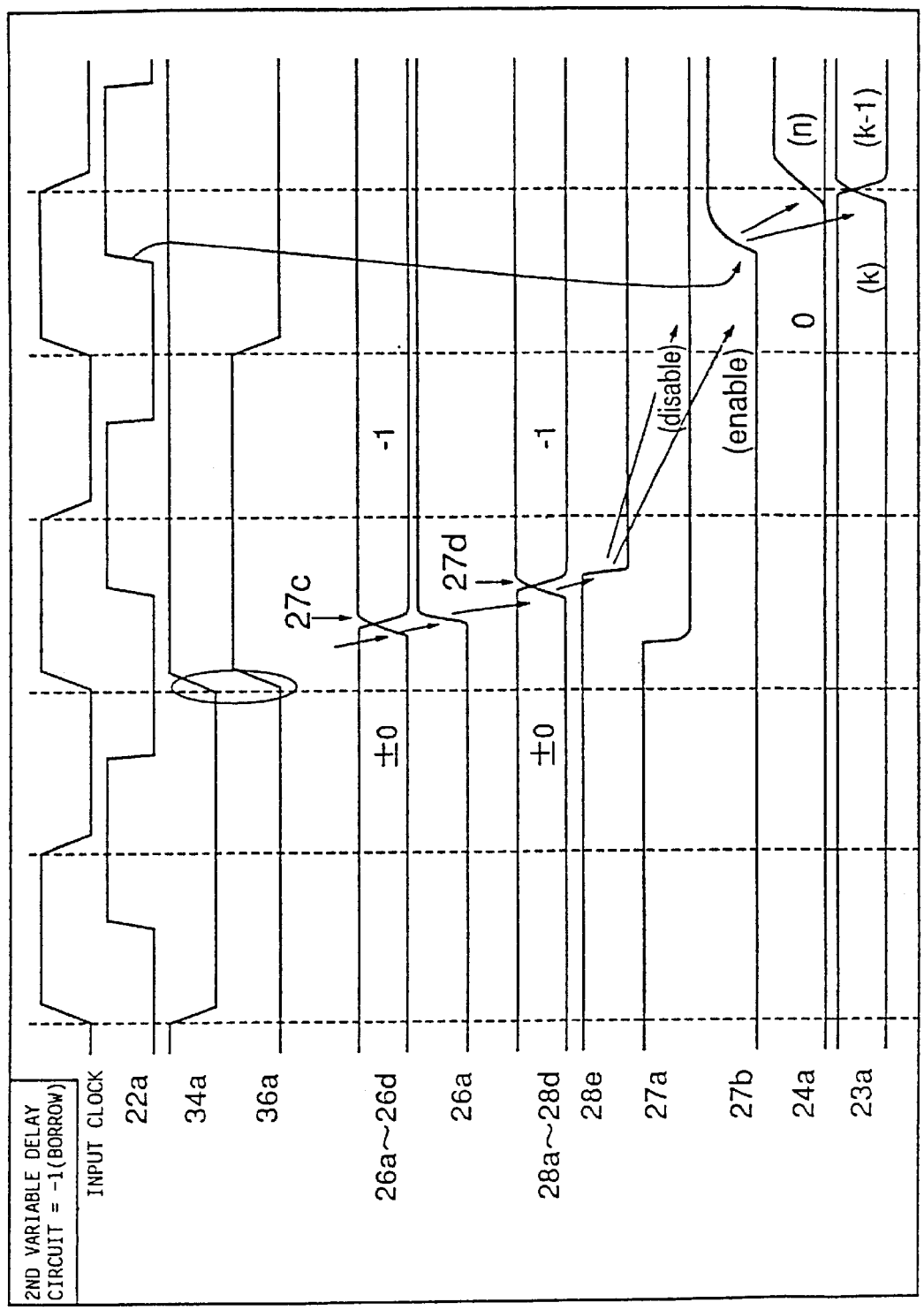

In the case shown in FIG. 24, the signal 26e shows that the delay time is too long, and the signal 31a indicates the minimum number of stages in the second delay part 22. Hence, the step-down process occurs. Thus, the phase control part 28 sets the signal 28e to the low level so that the setting of the number of stages in the first delay part 21 is requested. Further, the phase control part 28 outputs, at the timing of the signal 27d, the signals 28a–28d, which indicate that the signal 34a leads to the signal 36a.

The timing generating part 27 receives the signals 28e and 26f, and sets the signal 27a to the low level (disabled state) and sets the signal 27b to the high level (enabled state) at the time when the second delay part 22 outputs the rising edge of the input clock signal immediately following the rising edge thereof to be subjected to the phase comparison. Hence, the second shift signal generating part 30 is disabled, while the first shift signal generating part 29 is enabled.

The first shift signal generating circuit 29 supplies the first control part 23 with the signals 29a–29d, which causes the number of stages in the first delay part 21 to be decreased by one. Then, the first control part 23 outputs the signal 23a, which changes the setting of the first delay part 21 from the kth stage to the (k−1)th stage. Hence, the first delay part 21 is set at the (k−1)th stage (step S14).

Further, the first shift signal generating circuit 29 outputs the signal 29e, which indicates the setting of the second delay part 22 to the maximum number n of stages. The second control part 24 outputs the signal 24a, which causes the second delay part 22 to be set to the nth stage. Hence, the second delay part 22 is set to the nth stage (step S15). Hence, it is possible to perform the phase setting on the basis of the delay time equal to one stage of the second delay part 22 even if the step-down process in the first delay part 21 occurs.

The first and second phase comparator parts 25 and 26 receive the signals 34a and 36a at step S1. Then, the first phase comparator part 25 performs the phase comparing operation on the received signals at step S2 at the next timing for comparison defined by the frequency divider 34. The sequence of the steps S1, S2, S7, S12 and S13 is repeatedly executed. The number of stages in the second delay part 22 is decreased one by one until it is judged that there is no phase difference between the signals 34a and 36a by the first and second phase comparator parts 25 and 26 ("just" at step S7).

Then, the phase setting process is ended, and the delay times thus obtained are set in the first and second delay parts 21 and 22. The first and second phase comparator parts 25 and 26 wait for the next timing for phase comparison. At the time when it is judged that there is no phase difference between the signals 34a and 36a, the external clock signal and the output clock signal from the output buffer 35 are in phase.

If there is no need to increase or decrease the delay time in the phase comparing operations of the first and second phase comparator parts 25 and 26, the frequency divider 34 is controlled to increase the frequency dividing ratio in order to reduce the number of times that the phase comparing operations are repeatedly carried out. If the first phase comparator part 25 determines that the delay time should be increased or decreased and the second phase comparator part 26 determines that the delay time should be successively increased or decreased in the identical direction a plurality of number of times, the frequency divider 34 is controlled to reduce the frequency dividing ratio in order to increase the number of times that the phase comparing operations are repeatedly carried out. The number of times that the delay time is repeatedly increased or reduced in the identical direction can be set from the outside of the semiconductor device. The above control contributes to reducing the number of times that the phase comparing operations are carried out and reducing the power consumption.

Figure 25:
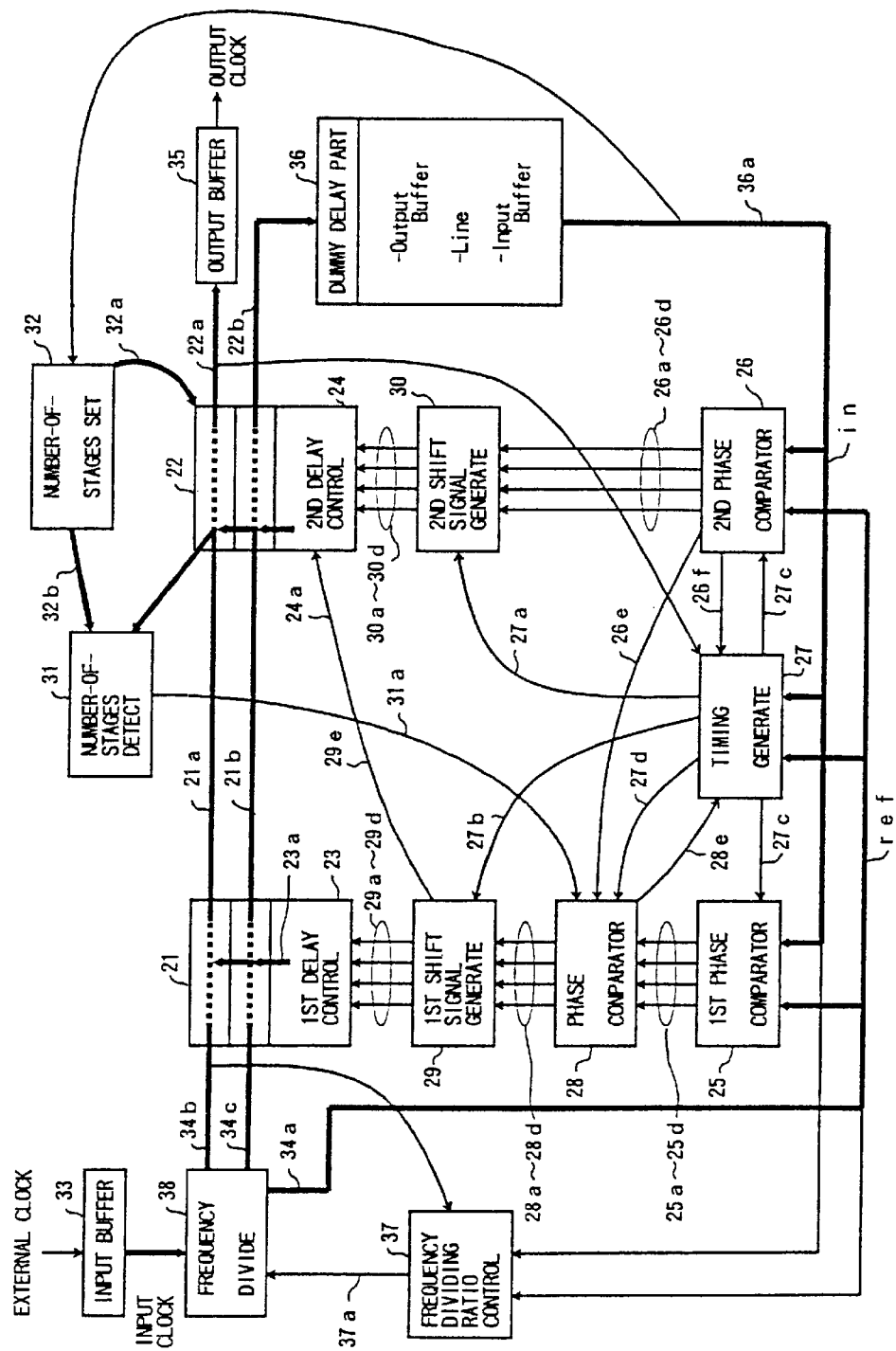
FIG. 25 is a block diagram of another structure of the semiconductor integrated circuit device.

FIG. 25 is a circuit diagram of a semiconductor integrated circuit device equipped with the variable delay circuit shown in FIG. 9. In FIG. 25, parts that are the same as those shown in FIG. 16 are given the same reference numbers.

The semiconductor device 25 is configured by adding a frequency dividing control part 37 to the structure shown in FIG. 16. The frequency dividing control part 37 functions as the third phase comparator circuit, and compares the signal 34a from the frequency divider 38 with the signal 36a. Then, the frequency dividing control part 37 supplies the frequency divider 38 with an instruction signal 37a, which changes the frequency dividing ratio on the basis of the predetermined condition so that the numbers of times of the first and second phase comparator parts 25 and 26 are increased or decreased. The operation of the frequency dividing control part 37 is the same as that of the frequency dividing control circuit 17 shown in FIG. 9 as has been described in FIG. 11, and thus a description thereof will be omitted. Further, the operations of the other parts shown in FIG. 25 are the same as those of the parts of the structure shown in FIG. 16, and thus a description thereof will be omitted here.

Figure 26:
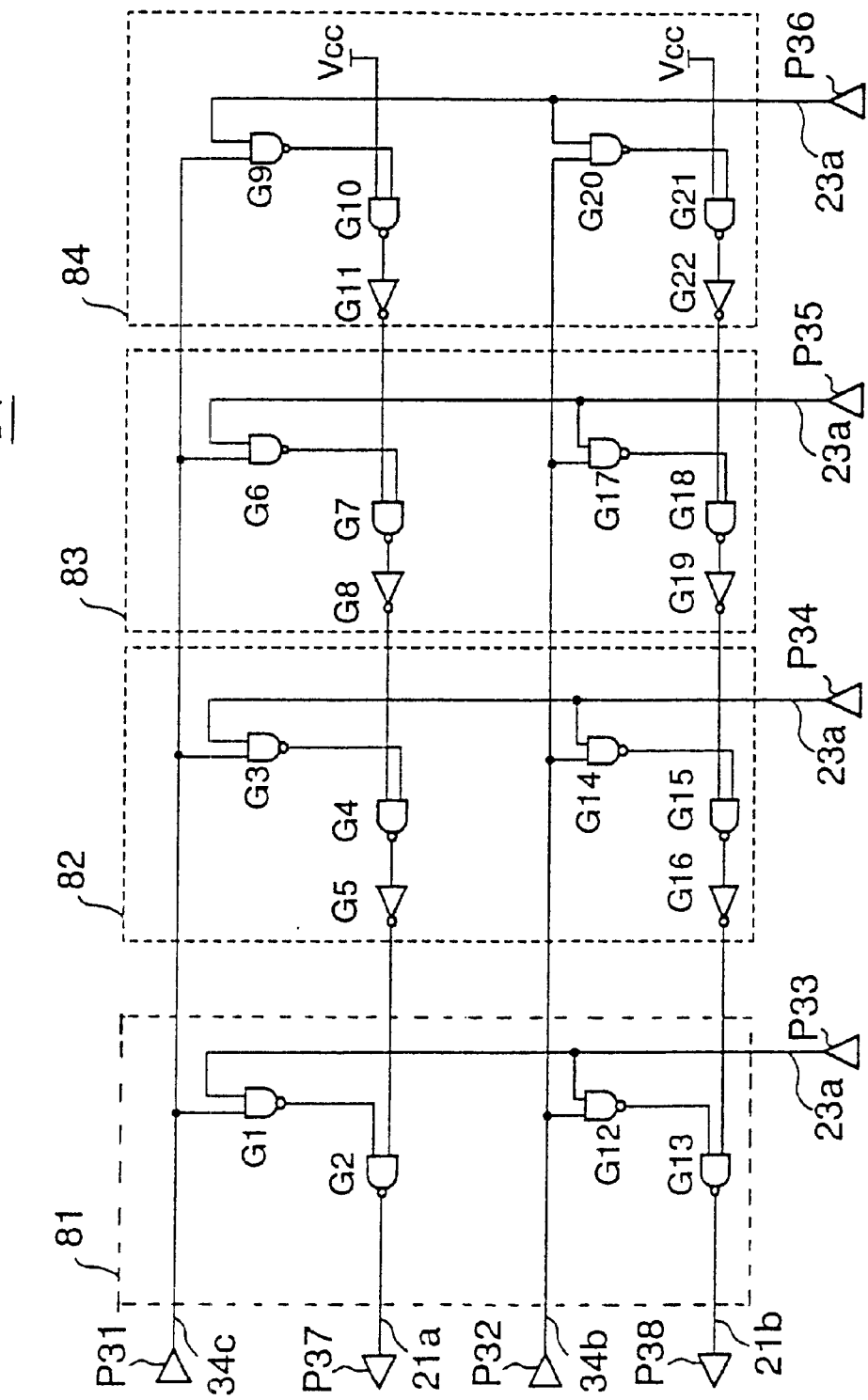
FIG. 26 is a circuit diagram of a first delay part.

FIG. 26 is a circuit diagram of the first delay part 21 shown in FIGS. 16 and 25.

The first delay part 21 has four stages of delay circuits, namely, first, second, third and fourth delay circuits, 81, 82, 83 and 84, which are connected to switch terminals P33, P34, P35 and P36. Signals applied to the switch terminals P33–P36 correspond to the signal 23a shown in FIGS. 16 and 25. A signal applied to an input terminal P31 corresponds to the signal 34c shown in FIGS. 16 and 25. A signal applied to an input terminal P32 corresponds to the signal 34b shown in FIGS. 16 and 25. A signal output from an output terminal P37 corresponds to the signal 21a shown in FIGS. 16 and 25. A signal output from an output terminal P38 corresponds to the signal 21b shown in FIGS. 16 and 25.

In the first delay part 21, the first delay circuit 81 includes gates G1, G2, G12 and G13. The second delay circuit 82 includes gates G3, G4, G5, G14, G15 and G16. The third delay circuit 83 includes gates G6, G7, G8, G17, G18 and G19. The fourth delay circuit 84 includes gates G9, G10, G11, G20, G21 and G22. When one of the switch terminals P33–P36 is set to the high level, the signals 34c and 34b are delayed by the corresponding delay time, and thus the delayed output signals 21a and 21b are obtained at the output terminals P37 and P38, respectively. The structure show in FIG. 26 has four stages of delay circuits. However, the first delay part 21 is not limited to the four-stage structure, but may employ an arbitrary number of delay circuits.

In the first delay circuit 81, the gates G1 and G12 are masked by applying the low-level signal to the switch terminal P33. Hence, the output signals obtained at the output terminals P37 and P38 are always at the low level irrespective of whether the other terminals of the gates G1 and G12 are high or low. The gates G1 and G12 are released from the masked state by applying the high-level signal to the switch terminal P33. When the signals applied to the other terminals of the gates G1 and G12 change to the high level and then low level, the output signals at the output terminals P37 and P38 are thus changed to the high level and then the low level. Hence, the delay time obtained from the input terminal P31 to the output terminal P37 is equal to two gates when the signal applied to the switch terminal P33 is at the high level.

In the second delay circuit 82, the gates G3 and G14 are masked by applying the low-level signal to the switch terminal P34. Hence, the output signals obtained at the output terminals P37 and P38 are always at the low level irrespective of whether the other terminals of the gates G3 and G14 are high or low. The gates G3 and G14 are released from the masked state by applying the high-level signal to the switch terminal P34. When the signals applied to the other terminals of the gates G3 and G14 change to the high level and then the low level, the output signals at the output terminals P37 and P38 are thus changed to the high level and then the low level. Hence, the delay time obtained from the input terminal P31 to the output terminal P37 is equal to four gates when the high-level signal is applied to the switch terminal P34.

The third delay circuit 83 and the fourth delay circuit 84 operate in the same manners as those of the second delay circuit 42. Hence, the delay time from the input terminal P31 to the output terminal P37 obtained when the high-level signal is applied to the switch terminal P35 is equal to six gates. Similarly, when the high-level signal is applied to the switch terminal P36, the delay time from the input terminal P31 to the output terminal P37 is equal to eight gates.

Hence, the first delay part 21 having the four-stage structure is capable of providing delay times which are stepwisely changed from the lower value equal to two gates to the upper value equal to eight gates.

Figure 27:
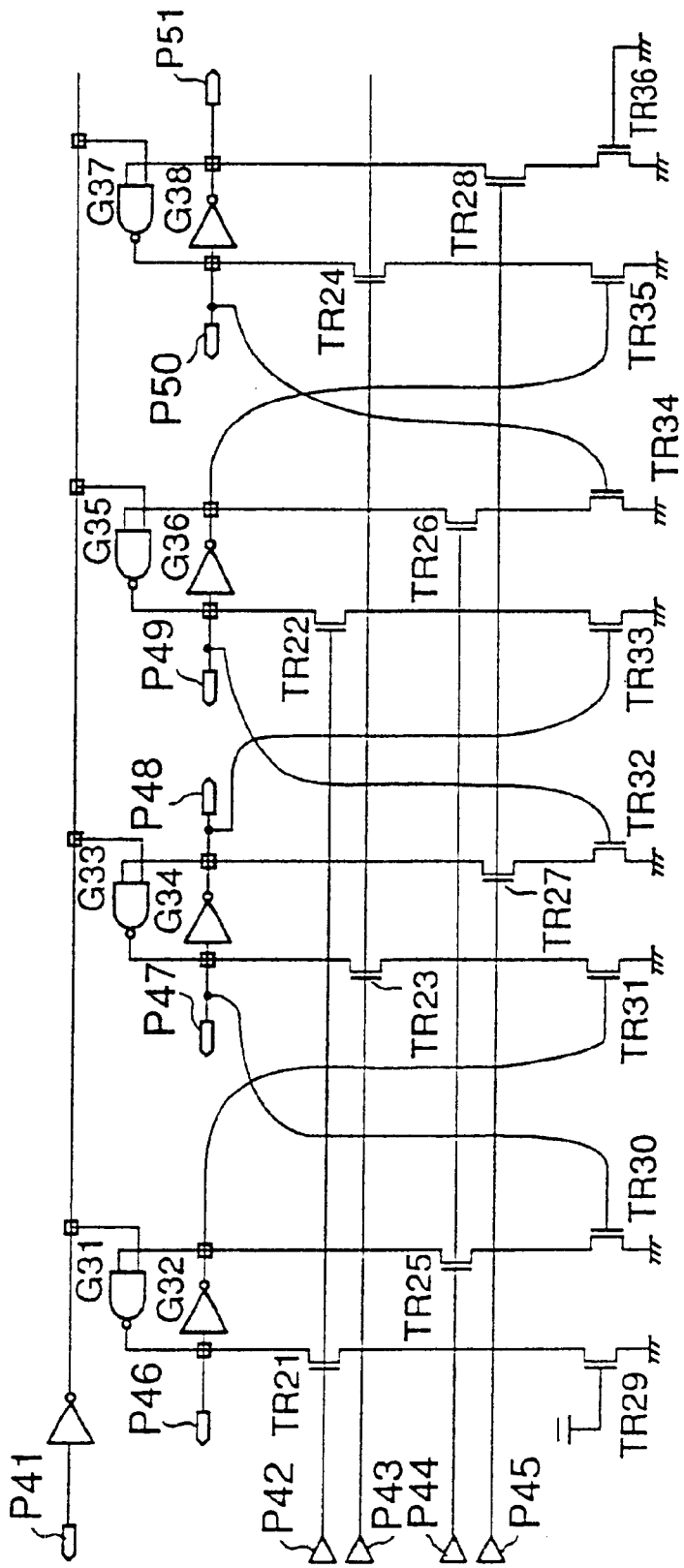
FIG. 27 is a circuit diagram of a first control part.

FIG. 27 is a circuit diagram of the first delay control part 23 shown in FIGS. 16 and 25. As shown, the first delay control part 23 includes gates G31–G38, and transistors TR21–TR28, and increases or decreases the number of stages of the first delay part 21 on the basis of the information concerning the phases from the first shift signal generating part 29. Signals applied to input terminals P42 to P45 correspond to the signals 29a through 29d shown in FIGS. 16 and 25, and output signals obtained at output terminals P46 to P51 correspond to the signal 23a shown in FIGS. 16 and 25.

The first control part 23 increases the number of stages by one if the signal 29a or 29b applied to the input terminal P42 or P43 is at the high level, and decreases the number of stages by one if the signal 29c or 29d applied to the input terminal P44 or P45 is at the low level. The first delay part 23 is not limited to the four-stage structure shown in FIG. 27, but has an arbitrary number of stages taking into account the number of stages of the first delay part 21.

Figure 28:
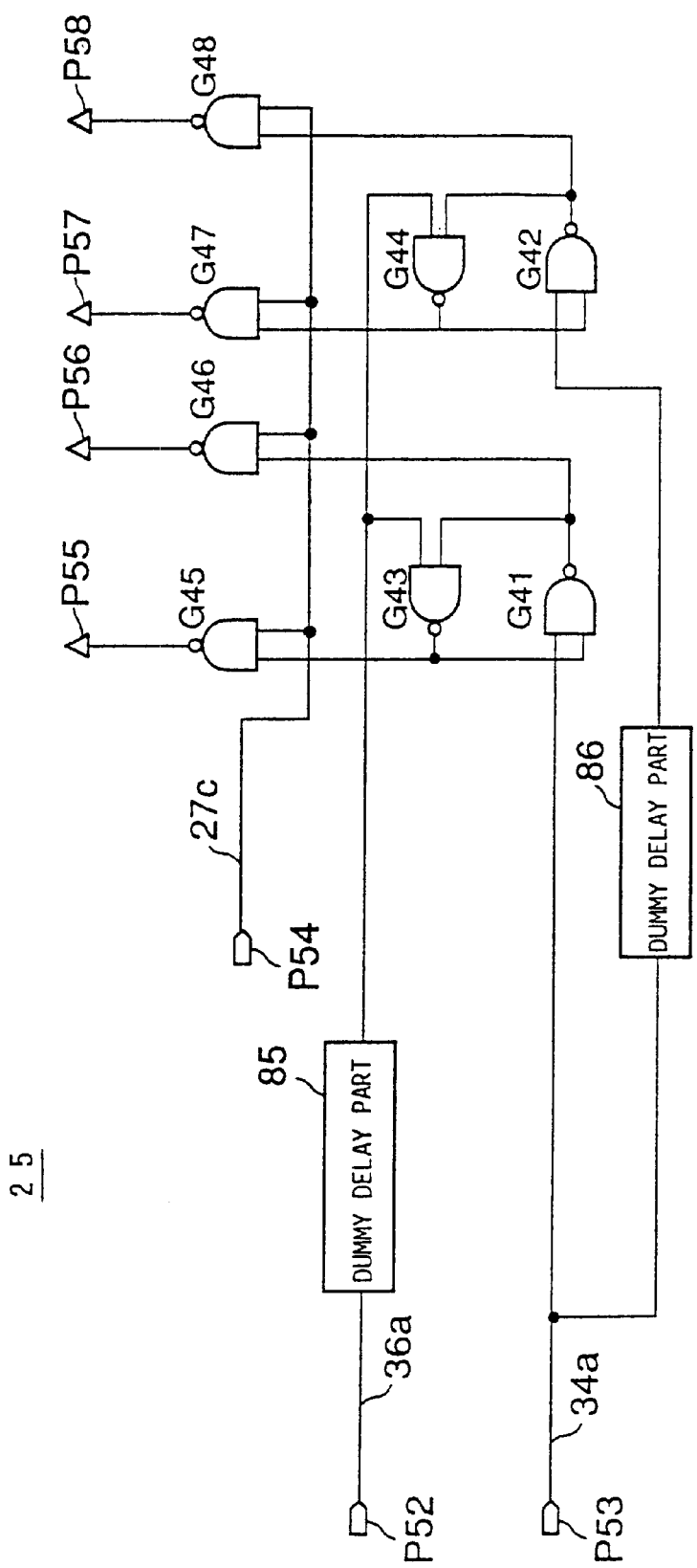
FIG. 28 is a circuit diagram of a first phase comparator part.

FIG. 28 is a circuit diagram of the first phase comparator part 25 shown in FIGS. 16 and 25. The first phase comparator part 25 shown in FIG. 28 includes a dummy delay circuit 85, a dummy delay circuit 86, and gates G41–G44. The dummy delay part 85 delays the signal applied to an input terminal P52 by a delay time equal to half the delay time equal to one stage of the first delay part 21. The dummy delay part 86 delays the signal applied to an input terminal P53 by half the delay time equal to one stage of the first delay part 21. The signal applied to the input terminal P52 corresponds to the signal 36a shown in FIGS. 16 and 25, and the signal applied to the input terminal P53 corresponds to the signal 34a shown therein. Further, the signal applied to the input terminal P54 corresponds to the signal 27c shown in FIGS. 16 and 25, and the signals output via the output terminals P55–P58 correspond to the signals 25a–25d shown in FIGS. 16 and 25.

The first phase comparator part 25 compares the phase of the signal 36a from the dummy delay part 26 input via te input terminal P52 with the phase of the signal 34a from the frequency devider 34 input via the input terminal P53. Wen the signal 27c from the timing generator 27 changes from the low level to the high level, the first phase comparator part 25 outputs, via the output terminals P55–P58, the information formed by the signals 25a–25d indicating the states of the phases. When the signals of the output terminals P55, P56, P57 and P58 are respectively at the high, low, high and low levels, the information indicates that the signal 36a leads to the signal 34a. When the signals of the output terminals P55, P56, P57 and P58 are respectively at the low, high, low and high levels, the information indicates that the signal 34a leads to the signal 36a. When the signals of the output terminals P55, P56, P57 and P58 are respectively at the low, high, low and high levels, the information indicates the signals 34a and 36a are in phase with the precision of the first phase comparator part 25.

If there is no phase difference between the rising edge of the signal 36a applied to the input terminal P52 and the rising edge of the signal 34a applied to the input terminal P53, the output signal of the dummy delay part 85 is delayed by half the delay time equal to one stage of the first delay part 21. Hence, the high-level signal is applied to the gate G43 ahead of the gate G41. At this time, the low-level signal is applied to the gate G41. Hence, the output signal of the gate G43 is high, and the output signal of the gate G41 is low. Then, at the timing when the signal 27c is applied to the input terminal P54 changes from the low level to the high level, the gate G45 outputs the low level and the gate G46 outputs the high level. The output signal of the dummy delay part 86 is delayed by half the delay time of one stages of the firt delay part 21. The high-level signal is input to the gate G44 ahead of the gate G42. At that time, the gate G42 is supplied with the low-level signal. The gate G42 outputs the high-level signal and the gate G44 outputs the low-level signal. At the timing when the input signal applied to the input terminal P54 changes from the low level to the high level, the gate G47 outputs the high-level signal and the gate G48 outputs the low-level signal. Hence, the outputs signals of the output terminals P55, P56, P57 and P58 are respectively low, high and high and low when there is not phase difference between the rising edge of the signal 36a and the rising edge of the signal 34a.

Similarly, if the signal 36a leads to the signal 34a by a time equal to or greater than half the delay time of one stage of the first delay part 21, the output signals of the output terminals P55, P56, P57 and P58 are respectively high, low, high and low. If the signal 34a leads to the signal 36a by a time equal to or greater than half the delay time of one stage of the first delay part 21, the output signals of the output terminals P55, P56, P57 and P58 are respectively low, high, low and high.

Figure 29:
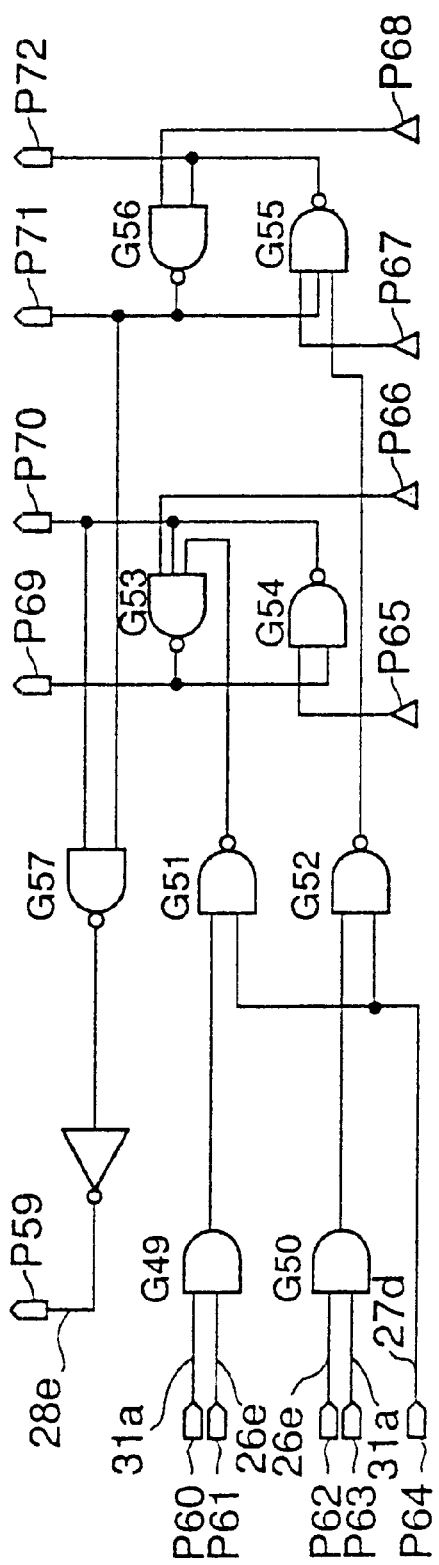
FIG. 29 is a circuit diagram of a phase control part.

FIG. 29 is a circuit diagram of the phase control part 28 shown in FIGS. 16 and 25.

The phase control part 28 includes gates G49–G57. Signals applied to input terminals P60 and P63 correspond to the signal 31a shown in FIGS. 16 and 25, and signals applied to input terminals P61 and P62 correspond to the signal 26e shown therein. Further, a signal applied to an input terminal P64 corresponds to the signal 27d shown in FIGS. 16 and 25, and signals applied to input terminals P65 to P68 correspond to the signals 25a–25d shown therein. Signals output via output terminals P69, P70, P71 and P72 correspond to the signals 28a–28d shown in FIGS. 16 and 25, and a signal output via an output terminal P59 corresponds to the signal 28e shown therein.

When the phase control part 28 receives the information indicating the state of the phases from the first phase comparator part 25, it sends the received information formed by the signals 28a–28d to the first shift signal generating part 29. If the step-up or step-down process occurs when the phase comparing process is executed by the second phase comparator part 26, the phase control part 28 supplies the first shift signal generating part 29 with the information concerning the step-up or step-down process formed by the signals 28a–28d.

The step-up process of the phase control part 28 occurs when the second delay part 22 has the maximum number of stages (when the signal 31a applied to the input terminal P60 is at the high level) and the second phase comparator part 26 detects a phase difference required to increase the number of stages (when the signal 26e applied to the input terminal P61 is at the high level). At that time, the gate G49 outputs the high-level signal and the gate G51 outputs the low-level signal at the timing defined by the timing generating part 27 (the signal 27d applied to the input terminal P64 is at the high level). Hence, the high-level and low-level signals are respectively output to the first shift signal generating part 29 via the output terminals P69 and P70.

The step-down process of the phase control part 28 occurs when the second delay part 22 has the minimum number of stages (when the signal 31a applied to the input terminal P63 is at the high level) and the second phase comparator part 26 detects a phase difference required to decrease the number of stages (when the signal 26e applied to the input terminal P62 is at the high level). At that time, the gate G50 outputs the high-level signal and the gate G52 outputs the low-level signal at the timing defined by the timing generating part 27 (the signal 27d applied to the input terminal P64 is at the high level). Hence, the low-level and high-level signals are respectively output to the first shift register generating part 29 via the output terminals P71 and P72.

When the first phase comparator part 25 shows that the signal 36a leads to the signal 34a (when the signals applied to the input terminals P65–P68 are respectively high, low, high and low), the phase control part 28 outputs the high-level, low-level, high-level and low-level signals via the output terminals P69 through P72. Also, when the signal 34a leads to the signal 36a (when the signals applied to the input terminals P65–P68 are respectively high, low, high and low), the phase comparator part 28 outputs the high-level, low-level, high-level and low-level signals via the output terminals P69 through P72. Even when the signals 34a and 36a are in phase with the precision of the first phase comparator part 25, the high-level, low-level, high-level and low-level signals are output via the output terminals P69 through P72.

Figure 30:
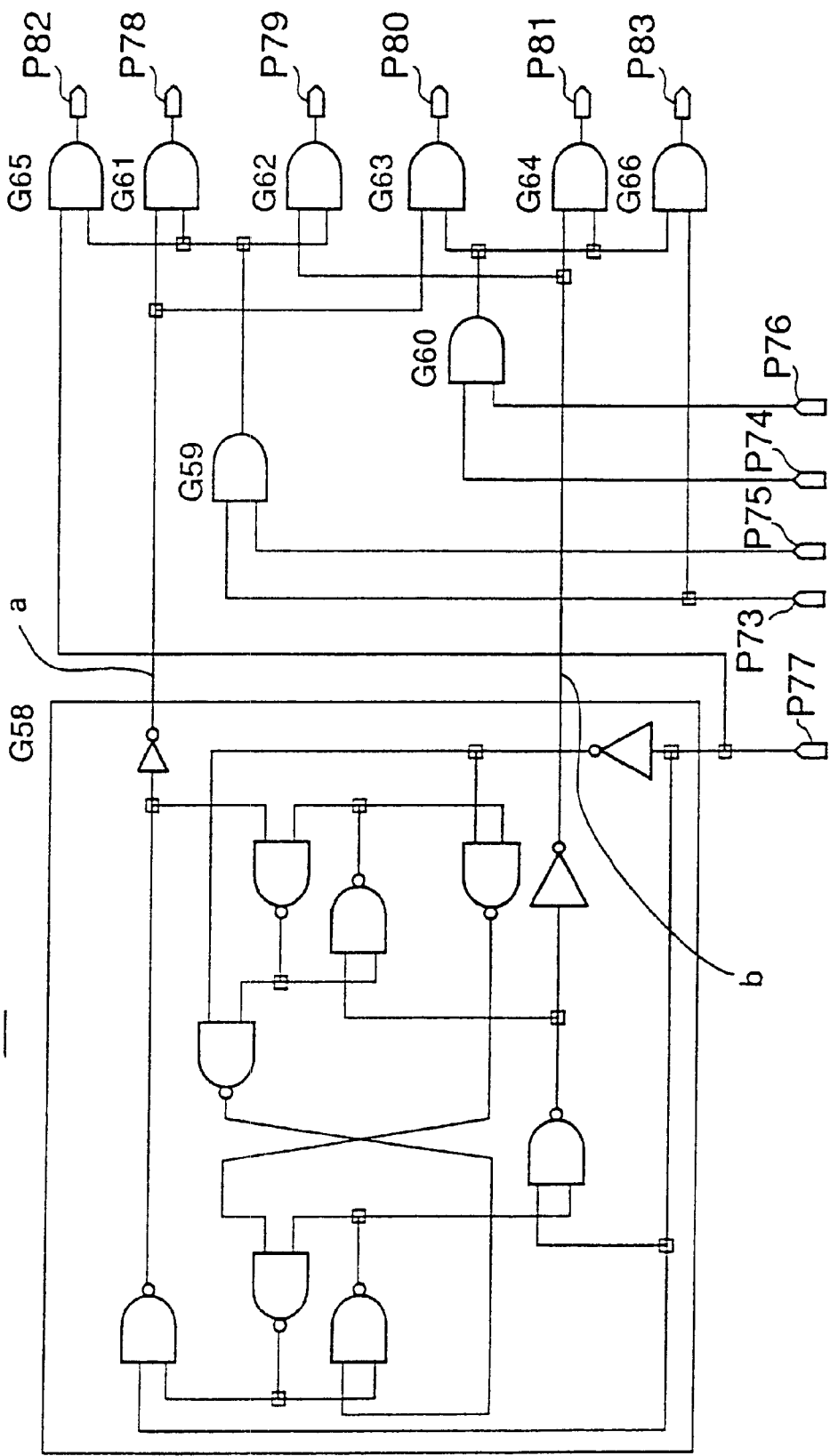
FIG. 30 is a first shift signal generating part.

FIG. 30 is a circuit diagram of the shift signal generating part 29 shown in FIGS. 16 and 25.

The first shift signal generating part 29 includes gates G58–G66, and supplies, based on the information indicating the states of the phases, the first control part 23 with information necessary for executing the increasing or decreasing control of the number of stages in the first delay part 21. Further, the first shift signal generating part 29 supplies the second delay part with information necessary to set the number of stages in the second delay part 22 to the maximum or minimum. Signals applied to input terminals P73 to P76 correspond to the signals 28a to 28d shown in FIGS. 16 and 25, and a signal applied to an input terminal P77 corresponds to the signal 27b shown in FIGS. 16 and 25. Signals output via output terminals P78, P79, P80 and P81 correspond to the signals 29a–d shown in FIGS. 16 and 25. Further, output signals output via output terminals P82 and P83 correspond to the signal 29e shown in FIGS. 16 and 25.

The first shift signal generating part 29 alternately switches enable signals a and b output from the gate G58 to the high (enabled state) and low levels each time when the enable signal 27b applied to the input terminal P77 from the timing generating part 27.

Hence, in the first shift signal generating part 29, one of the signals output via the output terminals P78–P81 is set to the high level by a logic operation implemented by the gates G59–G64 when the comparison result by the first phase comparator part 25 shows the signal 36a leads to the signal 34a (when the signals applied to the input terminals P73–P76 are respectively high, low, high and low) or vice versa (these signals are respectively high, low, high and low). If the output signal of the output terminal P78 or P79 is at the high level, the first control part 23 increases the number of stages in the first delay part 21. If the output signal of the output terminal P80 or P81 is at the high level, the first control part 23 decreases the number of stages in the first delay part 21 by one.

When the enable signal 27b applied to the input terminal P77 switches to the high level in the state in which the output signal of the gate G59 is at the high level, the number of first delay part 21 is increased by one, and the output signal of the gate G65 is switched to the high level. Hence, the signal 29e setting the second delay part 22 to the minimum number of stages is output via the output terminal P82. Further, when the enable signal 27b applied to the input terminal P77 switches to the high level in the state in which the output signal of the gate G60 is high, the number of stages of the first delay part 21 is decreased by one, and the output signal of the gate G66 is switched to the high level. Hence, the signal 29e setting the second delay part 22 to the maximum number of stages is output via the output terminal P83.

Figure 31:
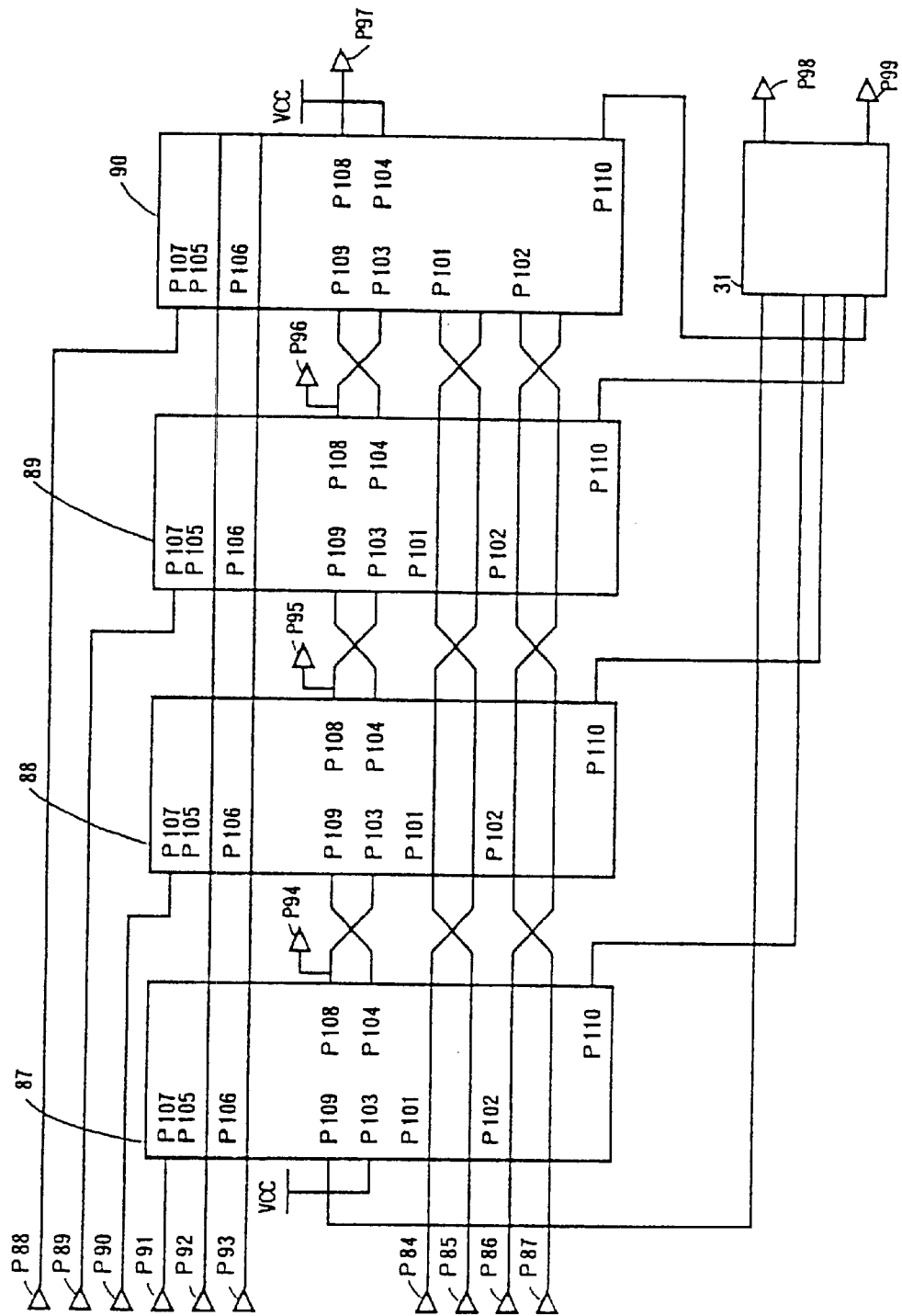
FIG. 31 is a circuit diagram of a first control part and a number-of-stages setting part.

FIG. 31 is a circuit diagram of the second control part 24 and the number-of-stages detecting part 31 shown in FIGS. 16 and 25.

Referring to FIG. 31, the second control part 24 is formed by four stages, namely, a first control circuit 87, a second control circuit 88, a third control circuit 89 and a fourth control circuit 90. Signals applied to input terminals P84 through P87 correspond to the signals 30a through 30d shown in FIGS. 16 and 25. Signals applied to input terminals P92 and P93 correspond to the signal 29e shown in FIGS. 16 and 25. Signals applied to input terminals P88 through P91 correspond to the signal 32a shown in FIGS. 16 and 25. Signals output via output terminals P94 through P97 correspond to the signal 24a shown in FIGS. 16 and 25.

The second control part 24 controls the number of stages of the second delay part 22 to be increased or decreased on the basis of the signals 30a–30d indicating the state of the phase from the second shift signal generating part 30 or the signal 29e indicating an increase or decrease in the number of stages of the first delay part 21. The second control part 24 increases the number of stages of the second delay part 22 by one when the signal applied to the input terminal P84 or P85 is at the high level, and alternatively decreases the number of stages thereof by one when the signal applied to the input terminal P86 or P87 is at the high level. Further, the second control part 24 sets the second delay part 22 to the maximum number of stages when the signal applied to the input terminal P92 is at the low level, and sets the second delay part 22 to the minimum number of stages when the signal applied to the input terminal P93 is at the high level.

The second control part 24 receives, from the number-of-stages setting part 32 via the input terminals P88–P91, the information 32a indicating the maximum number of stages in the second delay part 22. The number-of-stages setting part 32 sets any one of the signals output to the input terminals P88–P91 to the high level (the others are set to the low level) in the case where the second control part 24 has the four-stage structure shown in FIG. 31, and thus notifies the second control part 24 of the maximum number of stages in the second delay part 22. The first delay 21 is not limited to the four-stage structure shown in FIG. 27 but may an arbitrary number of stages in consistence with the number of stages of the second delay part 22.

Figure 32:
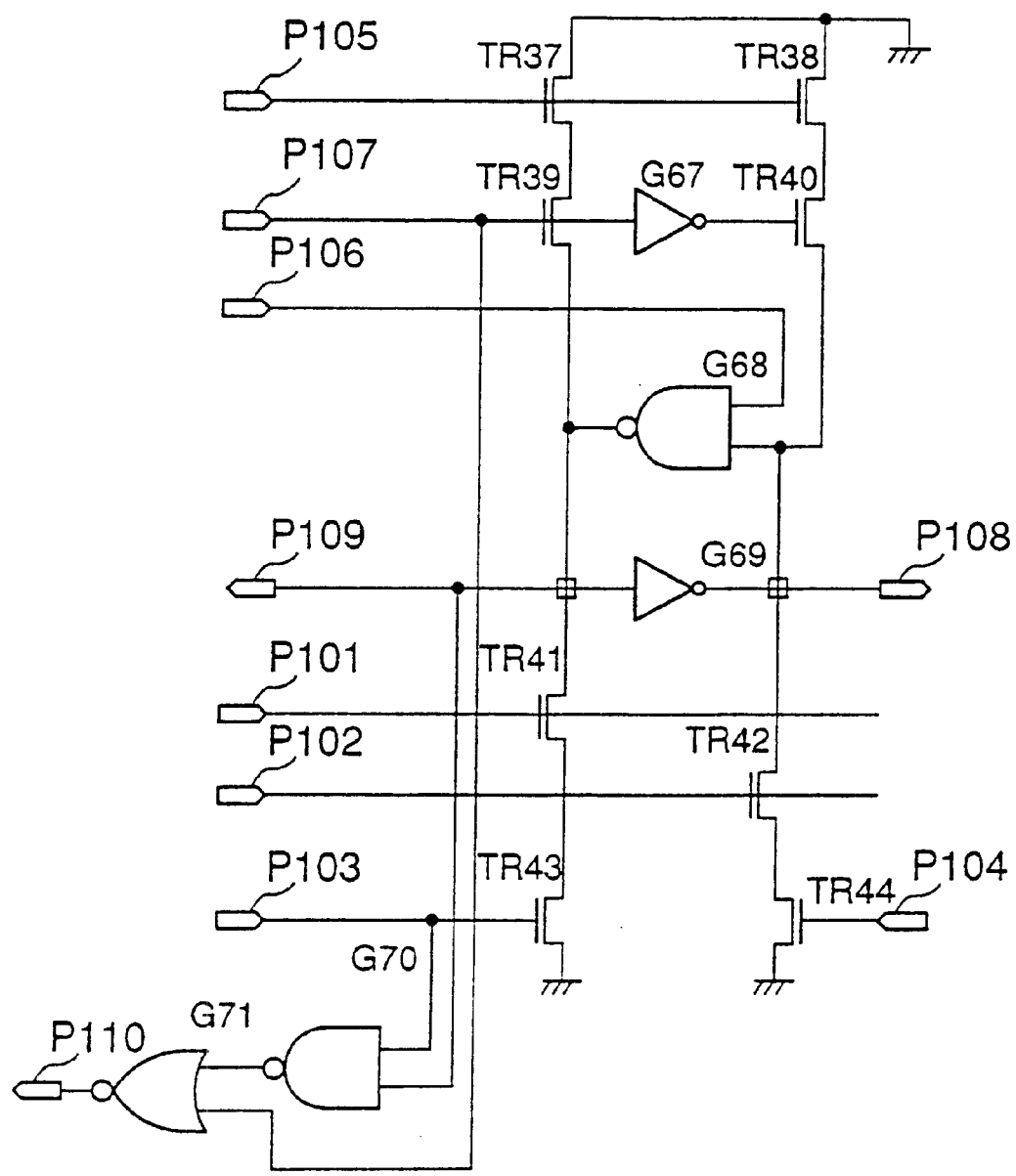
FIG. 32 is a circuit diagram of a control circuit.

As shown in FIG. 32, each of the control circuits shown in FIG. 31 is made up of gates G67–G69, and transistors TR37–TR40. When the number of stages in the first delay part 21 is increased, an input terminal P106 receives the low-level signal which sets the second delay part 22 to the minimum number of stages. Hence, the output signal of the gate G68 is switched to the high level, and thus the gate G69 outputs the low-level signal, which is applied to an output terminal P108 connected to the corresponding switch terminal of the second delay part 22.

When the number of stages in the first delay part 21 is decreased, an input terminal P105 receives the high-level signal which sets the second delay part 22 to the maximum number of stages. Then, the transistors T37 and T38 are turned ON. In this case, if the signal applied to an input terminal P107 is high, the transistor TR39 is ON. Thus, the gate G69 outputs the high-level signal, and the output terminal P108 connected to the corresponding switch terminal of the second delay part 22 is set to the high level. If the signal applied to the input terminal P107 is low, the transistor TR40 is ON. Thus, the output signal of the gate G68 is switched to the high level. Then, the gate G69 outputs the low-level signal, so that the output terminal P108 is set to the low level.

The number-of-stages detecting part 31 shown in FIG. 31 sets the signal 31a to the high level when the second delay part 22 is set to the minimum number of stages, and outputs the above high-level signal 31a to the phase control part 29 via an output terminal P98. Also, the number-of-stages setting part 31 sets the signal 31a to the high level when the second delay part 22 is set to the maximum number of stages, and outputs the above high-level signal 31a to the phase control part 28 via an output terminal P99. The signals output via the output terminals P98 and P99 correspond to the signal 31a shown in FIGS. 16 and 25.

Figure 33:
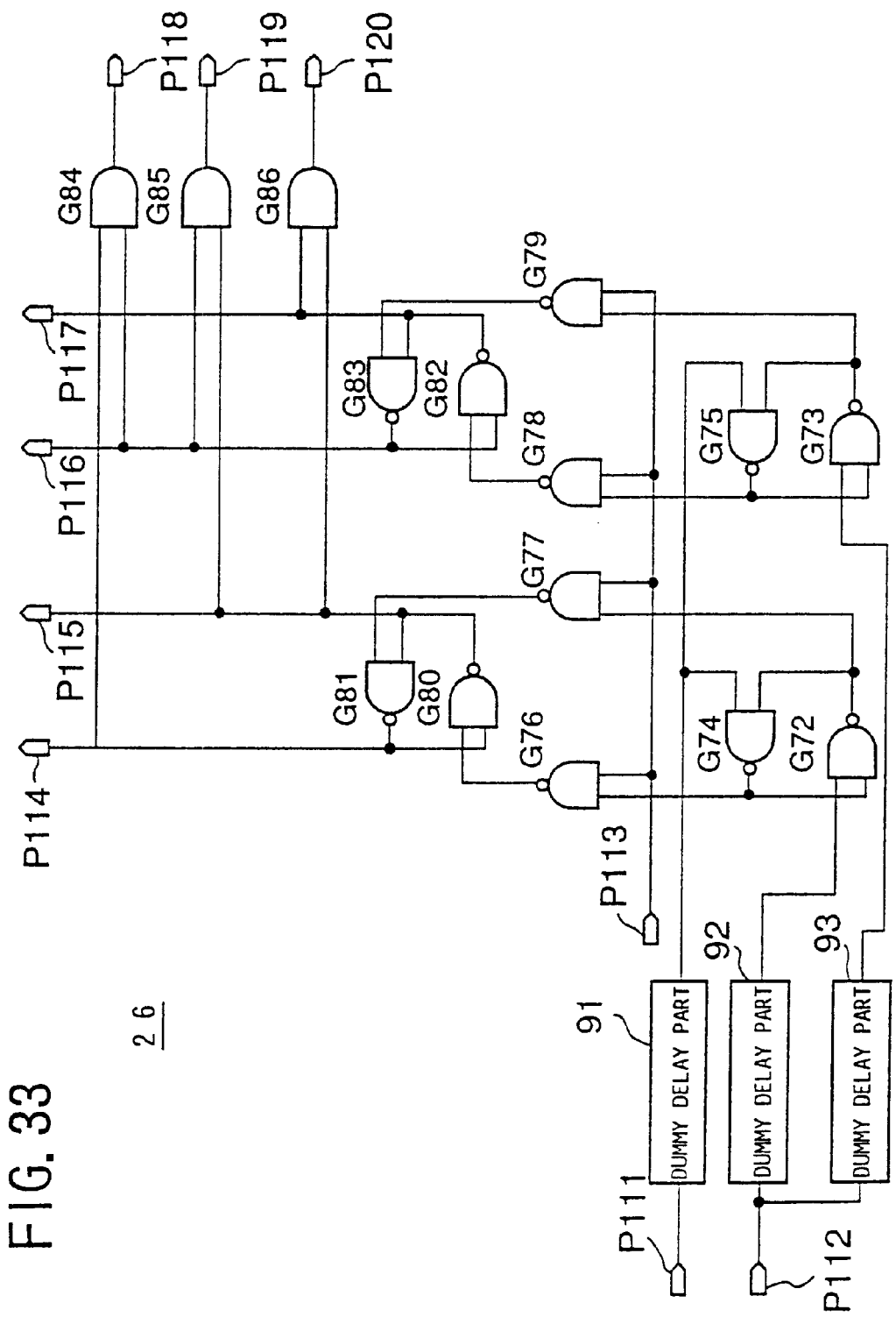
FIG. 33 is a circuit diagram of a second phase comparator part.

FIG. 33 is a circuit diagram of the second phase comparator part 26 shown in FIGS. 16 and 25.

The second phase comparator part 26 includes a dummy delay part 91, a dummy delay part 92, a dummy delay part 93, and gates G72–G86. The dummy delay part 91 delays the signal 36a applied to an input terminal Pill by a delay time equal to 1.5 times as long as one stage of the second delay part 22. The dummy delay part 82 delays the signal 34a applied to an input terminal P112 by a delay time equal to twice as long as one stage of the second delay part 22. The dummy delay part 93 delays the signal 34a applied to the input terminal P112 by a delay time as long as one stage of the second delay part 22. The signal applied to the input terminal P111 corresponds to the signal 36a shown in FIGS. 16 and 25, and the signal applied to the input terminal P112 corresponds to the signal 34a shown therein. Further, the signal applied to an input terminal P113 corresponds to the signal 27c shown in FIGS. 16 and 25. Signals output via output terminals P114–P117 correspond to the signals 26a–26d shown in FIGS. 16 and 25. A signal output via an output terminal P118 corresponds to the signal 26e shown in FIGS. 16 and 25, and a signal output via an output terminal P119 corresponds to the signal 26f shown therein. Further, a signal output via an output terminal P120 corresponds to the signal 26e shown in FIGS. 16 and 25.

The second phase comparator part 26 compares the signal 36a supplied from the dummy delay part 36 via the P111 with the signal 34a supplied from the frequency divider 34 or 38 via the input terminal P112. Then, the second phase comparator part 26 supplies the second shift signal generating part 30 with the signals 26a–26d showing the state of the phase via the output terminals P114–P117 when the signal 27c supplied from the timing generating part 27 via the input terminal P113. The state of the phase indicates that the signal 36a leads to the signal 34a when the output terminals P114, P115, P116 and P117 are high, low, high and low, respectively, and indicates that the signal 34a leads to the signal 36a when the output terminals P114, P115, P116 and P117 are low, high, low and high, respectively. When the output terminals P114, P115, P116 and P117 are low, high, low and high, respectively, the state of the phase indicates that the signals 34a and 36a are in phase with the precision of the second phase comparator part 26.

If there is no phase difference between the rising edge of the signal 36a applied to the input terminal P111 and the rising edge of the signal 34a applied to the input terminal P112, the output signal of the dummy delay part 92 leads to the output signal of the dummy delay part 91 by half the delay time of one stage of the second delay part 22. Hence, the gate G74 receives the high-level signal ahead of the gate G72. At this time, the gate G72 receives the low-level signal. Hence, the gate G74 outputs the low-level signal, and the gate G72 outputs the high-level signal. At the time when the potential of the input terminal P113 is changed from the low level to the high level, the gates G76 and G77 output the low-level and high-level signals, respectively. The output signal of the dummy delay part 91 leads to the output signal of the dummy delay part 93 by half the delay time of one stage of the second delay part 22. Hence, the high-level signal is applied to the gate G73 ahead of the gate G75. At that time, the low-level signal is applied to the gate G75. Hence, the gates G73 and G75 output the high-level and low-level signals, respectively. At the time when the potential of the input terminal P113 is changed from the low level to the high level, the gates G78 and G79 output the high-level and low-level, respectively. Hence, if there is no phase difference between the rising edge of the signal 36a applied to the input terminal P111 and the rising edge of the signal 34a applied to the input terminal P112, the output terminals P114, P115, P116 and P117 are respectively at the low, high, high and low levels.

If the signal 36a leads to the signal 34a by a time equal to or greater than half the delay time of one stage of the second delay part 22, the output terminals P114, P115, P116 and P117 are respectively at the high, low, high and low levels. If the signal 34a leads to the signal 36a by a time equal to or greater than half the delay time of one stage of the second delay part 22, the output terminals P114, P115, P116 and P117 are respectively at the low, high, low and high levels.

If the second phase comparator part 26 shows that there is a need to increase the number of stages of the second delay part by one (when the output terminals P114 and P116 are at the high level), the output of the gate G84 is switched to the high level, which is output via the output terminal P118. If the second phase comparator part 26 shows that there is a need to decrease the number of stages of the second delay part by one (when the output terminals P115 and P117 are at the high level), the output of the gate G86 is switched to the high level, which is output via the output terminal P120. If there is no phase difference (when the output terminals P114 and P116 are at the high level), the output signal of the gate G85 is switched to the high level, which is output via the output terminal P119.

Figure 34:
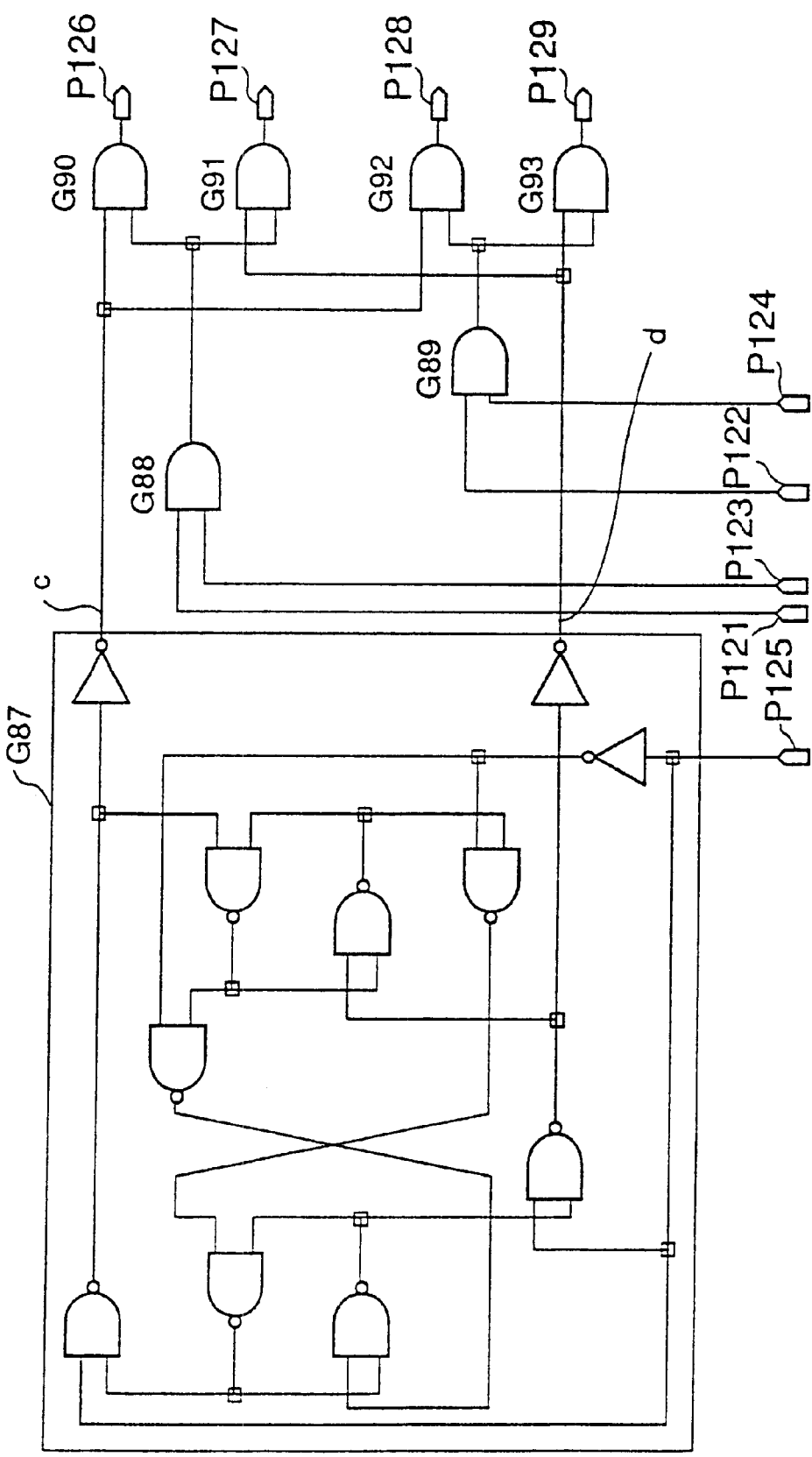
FIG. 34 is a circuit diagram of a second shift signal generating part.

FIG. 34 is a circuit diagram of the second shift signal generating part 30 shown in FIGS. 16 and 25.

Referring to FIG. 34, the second shift signal generating part 30 is made up of gates G87–G93, and supplies the second control part 24 with the information used to increase or decrease the number of stages of the second delay part 22 on the basis of the information indicative of the state of the phase and supplied from the second phase comparator part 26. Signals applied to input terminals P121–P124 correspond to the signals 26a–26d shown in FIGS. 16 and 25. A signal applied to an input terminal P125 corresponds to the signal 27a shown in FIGS. 16 and 25. Signals output via output terminals P126–P129 correspond to the signals 30a–30d shown in FIGS. 16 and 25.

The first shift signal generating part 29 alternatively set enable signals c and d from the gate G57 to the high level each time the potential of the input terminal P125 receiving the enable signal 27a from the timing generating part 27 switches from the low level (disabled state) to the high level (enabled state).

Hence, one of the output terminals P126–P129 of the second shift signal generating part 30 is set to the high level based on the logic of the gates G88–G93 in the case where the signal 36a leads to the signal 34a (when the potentials of the input terminals P121–P124 are respectively high, low, high and low) or the signal 34a leads to the signal 36a (when the potentials of the input terminals P121–P124 are respectively high, low, high and low). The second control part 24 increases the number of stages of the second delay part 22 by one if the output terminal P126 or P127 is at the high level, and decreases the number of stages by one if the output signal P128 or P129 is at the high level.

Figure 35:
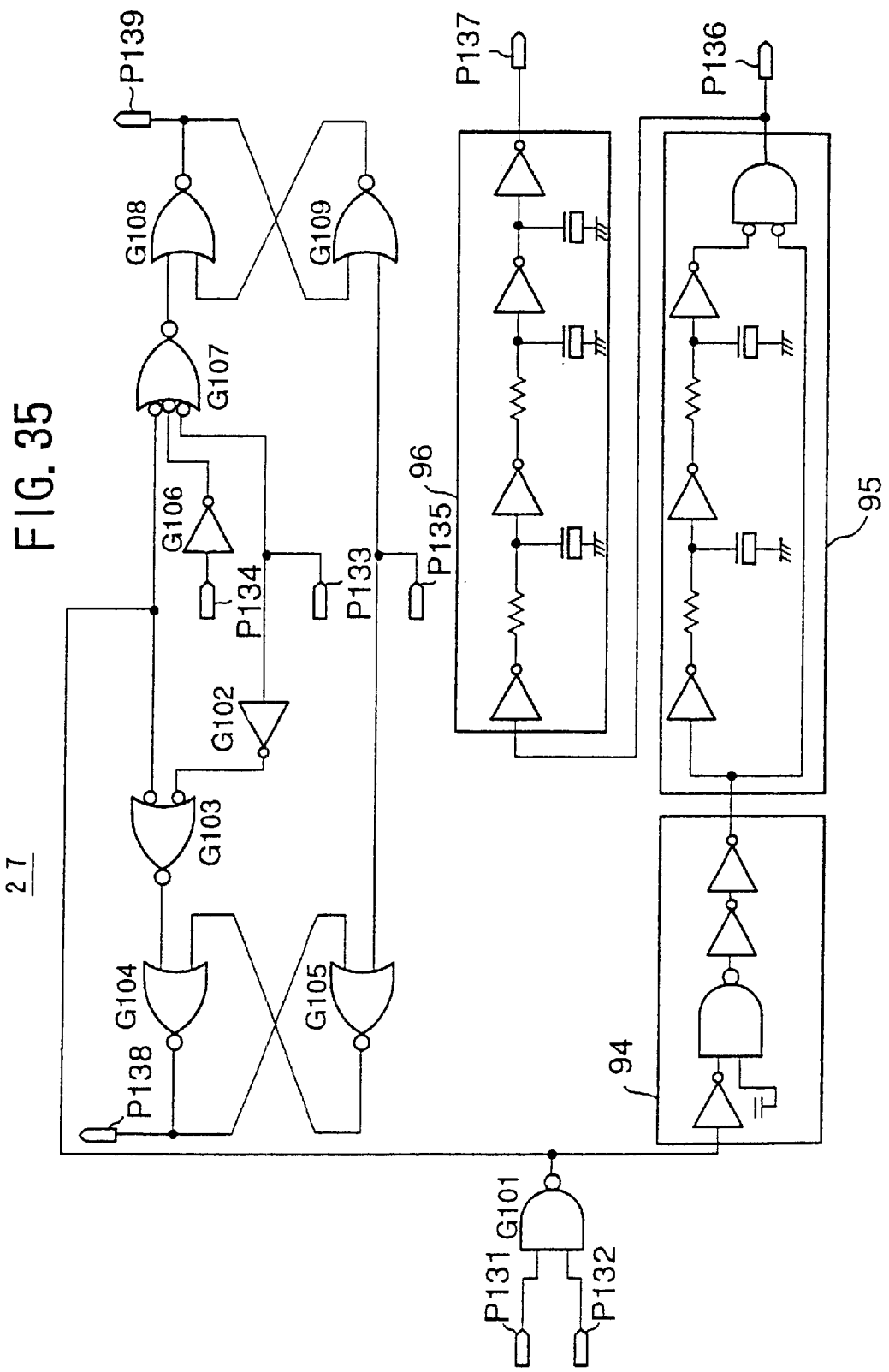
FIG. 35 is a circuit diagram of a timing generating part.
Figure 36:
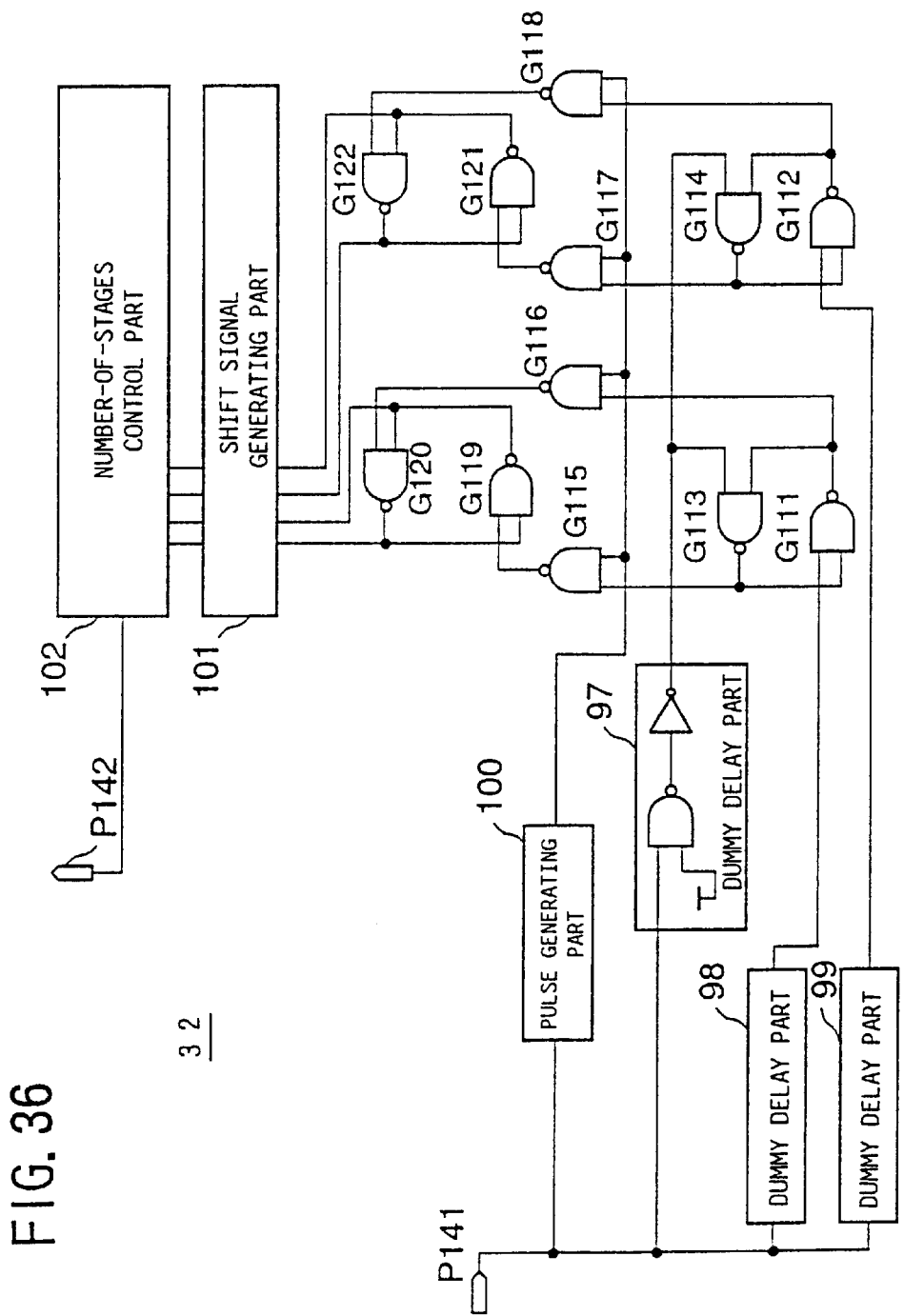
FIG. 36 is a circuit diagram of a number-of-stages setting part.

FIG. 35 is a circuit diagram of the timing generating part 27 shown in FIGS. 16 and 25.

Referring to FIG. 35, the timing generating part 27 includes a dummy delay part 94, a pulse generating part 95, a dummy delay part 96, and gates G101–G109. The dummy delay part 94 delays the input signal by a time equal to the time necessary to perform the phase comparing operations of the first and second phase comparator parts 25 and 26. The pulse generating part 95 generates a pulse signal. The dummy delay part 96 outputs the signal indicative of the state of the phase to the first shift signal generating part 29. A signal applied to an input terminal P131 corresponds to the signal 36a shown in FIGS. 16 and 25, and a signal applied to an input terminal P132 corresponds to the signal 34a shown therein. A signal applied to an input terminal P133 corresponds to the signal 28e shown in FIGS. 16 and 25, and a signal applied to an input terminal P134 corresponds to the signal 26f shown therein. A signal applied to an input terminal P135 corresponds to the signal 22a shown in FIGS. 16 and 25, and a signal output via an output terminal P136 corresponds to the signal 27c shown therein. A signal output via an output terminal P137 corresponds to the signal 27d shown in FIGS. 16 and 25, and a signal output via an output terminal P138 corresponds to the signal 27b shown therein. An output signal output via an output terminal P139 corresponds to the signal 27a shown in FIGS. 16 and 25.

The timing generating part 27 receives the signals 34a and 36a, and the gate G101 outputs the low-level signal to the dummy delay part 94 when the signals are both at the high level. The dummy delay part 94 delays the timing at which the signal is switched to the low level by the time necessary to perform the phase comparing operations of the first and second phase comparator parts 25 and 26. In response to the output signal of the dummy delay part 94, the pulse generating part 95 outputs the pulse signal 27c to the output terminal P136. In response to the signal 27c, the first phase comparator part 25 outputs the signals 25a–25d to the phase control part 28, and the second phase comparator part 26 outputs the signals 26a–26d to the second shift signal generating part 30.

The dummy delay part 96 receives the signal 27c and delays it by a given delay time. The resultant output signal 27d of the dummy delay part 96 outputs the output terminal P136. In response to the pulse of the signal 27d, the phase control part 28 outputs the signals 28a–28d to the phase control part 28.

The gate G103 of the timing generating part 27 outputs the low-level signal in a case where the output signal of the gate G101 is changed, when the first phase comparator part 25 performs the phase comparing operation, from the low level to the high level and the signal 28e from the phase comparator part 28 is at the low level (a case where there is a need to increase or decrease the number of stages of the first delay part 21). A flip-flop formed by the gates G104 and G105 outputs, via the output terminal P138, the high-level signal 27b, which enables the first shift signal generating part 29 at the timing of the next rising edge of the clock signal 22a.

The gate G107 of the timing generating part 27 outputs the low-level signal in a case where the output signal of the gate G101 is changed, when the second phase comparing part 26 performs the phase comparing operation, from the low level to the high level and the signal 28e outputs the high-level signal (a case where there is no need to increase or decrease the number of stages of the first delay part 21), and a case where the signal 26f from the second phase comparator part 26 is at the low level (a case where there is a need to increase or decrease the number of stages of the second delay part 22). Thus, a flip-flop formed by the gates G108 and G109 outputs, via the output terminal P139, the high-level signal 27a, which enables the second shift signal generating part 30 at the timing of the next rising edge of the clock signal 22a.

FIG. 32 is a circuit diagram of the number-of-stages setting part 32 shown in FIGS. 16 and 25.

Referring to FIG. 32, the number-of-states setting part 32 includes a dummy delay parts 97, 98 and 99, a pulse generating part 100, a shift signal generating part 101, and a number-of-stages control part 102 and gates G111–G112. A signal applied to an input terminal P141 corresponds to the signal 36a shown in FIGS. 16 and 25, and a signal output via an output terminal P142 corresponds to the signals 32a and 32b shown therein. The dummy delay part 97 delays the signal 36a applied to the input terminal P141 by a delay time equal to one stage of the first delay part 21. The dummy delay part 98 delays the signal 36a by a delay time equal to an arbitrary number n of stages of the second delay part 22. The dummy delay part 99 delays the signal 36a by a delay time equal to an arbitrary number (n+1) of stages of the second delay part 22. The pulse generating part 100 generates a pulse signal. The shift signal generating part 101 operates in the same manner as the second shift signal generating part 30. The number-of-stages control part 102 sets the maximum number of stages of the second delay part 22 on the basis of the output signal of the shift signal generating part 101.

The number-of-stages setting part 32 determines the maximum number n of stages of the second delay part 22 so that the delay time equal to one stage of the first delay part 21 is equal to or greater than the n stages of the second delay part 22 but is equal to or less than the (n+1) stages thereof.

If the output signal of the dummy delay part 98 has a delay time less than that of the output signal of the dummy delay part 97, the H-level signal is applied to the gate G111 ahead of the gate G113. At that time, the low-level signal is applied to the gate G113. Hence, the gates G111 and G113 output the low-level and high-level signals, respectively. At the time when the pulse signal generated by the pulse generating part 100 is changed from the low level to the high level, the gates G115 and G116 output the low-level and high-level signals, respectively. If the output signal of the dummy delay part 97 has a delay time less than that of the output signal of the dummy delay part 99, the high-level signal is applied to the gate G114 ahead of the gate G112, to which the low-level signal is applied at that time. Hence, the gates G114 and G112 output the low-level and high-level signals, respectively. At the time when the pulse signal generated by the pulse generating part 100 is changed from the low level to the high level, the gates G117 and G118 output the high-level and the low-level signals, respectively. In this gate, the output signals of the gates G120, G119, G122 and G121 are low, high, high and low, respectively. Hence, the delay time equal to one stage of the first delay part 21 is between the delay time equal to n stages of the second delay part 22 and (n+1) stages thereof. Hence, the maximum number of the second delay part 22 is set to n.

If the output signal of the dummy delay part 97 has a delay time less than that of the output signal of the dummy delay part 98, the high-level signal is applied to the gate G113 ahead of the gate G111, to which the low-level signal is applied at that time. Hence, the gates G113 and G111 output the low-level and high-level signals, respectively. At the time when the pulse signal generated by the pulse generating part 100 is changed from the low level to the high level, the gates G115 and G116 output the high-level and low-level signals, respectively. Since the output signal of the dummy delay part 97 has a delay time less than that of the output signal of the dummy delay part 99, the gates G114 and G112 output the low-level and high-level signals, respectively. At the time when the pulse signal of the pulse generating part 100 is changed from the low level to the high level, the gates G117 and G118 output the high-level and low-level signals, respectively. In this case, the output signals of the gates G120, G119, G122 and G121 are high, low, high and low, respectively. The delay time of one stage of the first delay part 21 is not placed between the delay time equal to n stages of the second delay part 22 and n+1 stages thereof. Hence, the shift signal generating part 101 supplies the number-of-stages control part 102 with the information which requests to decrease the number of stages of the second delay part 22 by one. Then, the number-of-stages control part 102 controls the switch terminals of the second delay part 22 so that the number of stages thereof is decreased by one. The above decreasing operation of the number-of-stages control part 22 is repeatedly carried out until the delay time of one stage of the first delay part 21 falls between the delay time equal to n stages of the second delay part 22 and n+1 stages thereof.

If the output signal of the dummy delay part 99 has a delay time less than that of the output signal of the dummy delay part 97, the output signals of the gates G120, G119, G122 and G121 are respectively low, high, low and high. The delay time of one stage of the first delay part 21 is not placed between the delay time equal to n stages of the second delay part 22 and n+1 stages thereof. Hence, the shift signal generating part 101 supplies the number-of-stages control part 102 with the information which requests to increase the number of stages of the second delay part 22 by one. Then, the number-of-stages control part 102 controls the switch terminals of the second delay part 22 so that the number of stages thereof is increased by one. The above increasing operation of the number-of-stages control part 22 is repeatedly carried out until the delay time of one stage of the first delay part 21 falls between the delay time equal to n stages of the second delay part 22 and n+1 stages thereof.

Figure 37:
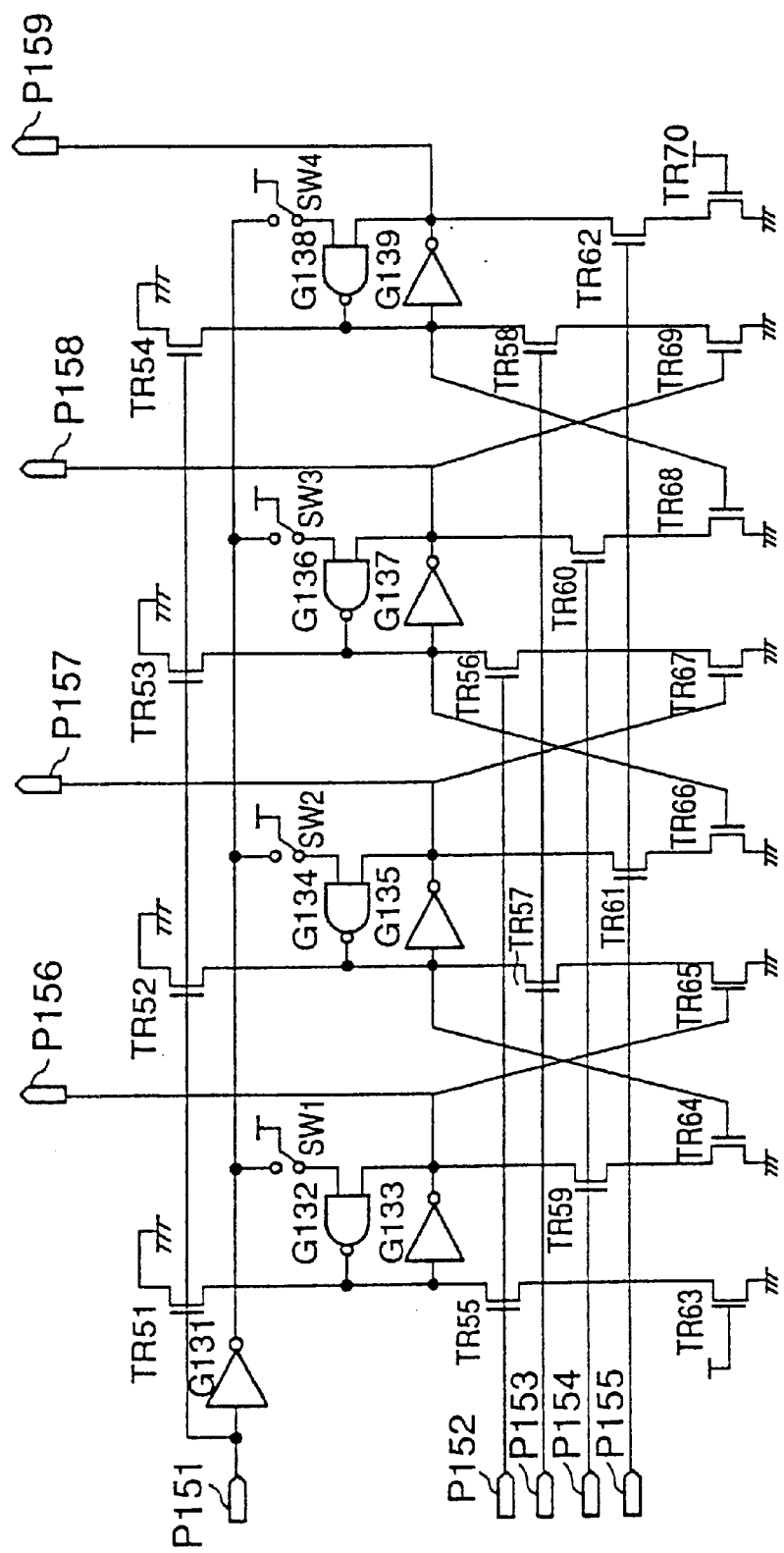
FIG. 37 is a circuit diagram of a number-of-stages control part.

As shown in FIG. 37, the number-of-stages control part 102 of the number-of-stages setting part 32 includes gates G131–G139, and transistors TR51–TR70. Based on the information indicating the state of the phase from the shift signal generating part 101, the number-of-stages control part 102 controls the number n of stages of the second delay part 22 so that it is between the delay time equal to n stages of the second delay part 22 and n+1 stages thereof.

At the time of power on, the first control part 23 turns ON the transistors TR51 to TR54 in response to the high-level signal applied to an input terminal P151, so that output terminals P156, P157, P158 and P159 are initialized to an initial setting value, which is the high level. Switches SW1–SW4 shown in FIG. 37 are turned on when the pulse signal applied to the input terminal P151 is returned to the low level from the high level. Then, if one of the signals applied to input terminals P152 and P153 by the shift signal generating part 101 is at the high level, the maximum number of stages of the second delay part 22 is increased by one. If one of the signals applied to input terminals P154 and P155 by the shift signal generating part 101 is at the high level, the maximum number of stages of the second delay part 22 is decreased by one. The number-of-stage control part 102 is not limited to four stages as shown in FIG. 37 but may have an arbitrary number of stages based on the number of stages of the first delay part 21.

Figure 38:
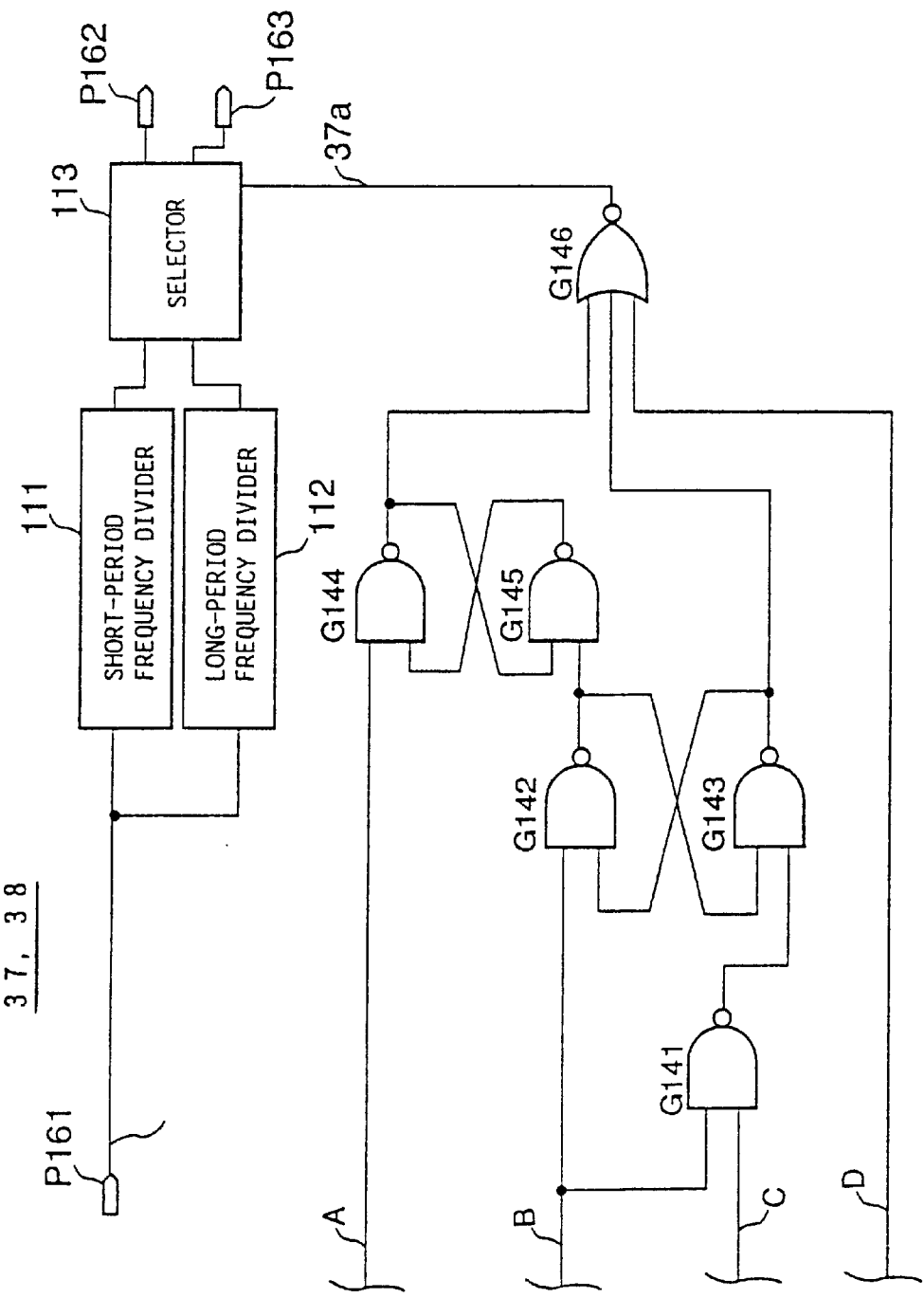
FIG. 38 is a circuit diagram of a frequency dividing control part.

FIG. 38 is a circuit diagram of an structure of the frequency divider 38 and the frequency dividing control part 37.

Referring to FIG. 38, the frequency divider 38 is made up of a short-period frequency divider 111 having a frequency dividing ratio of 4, and a long-period frequency divider 112 having a frequency dividing ratio of 256. Either the short-period frequency divider 111 or the long-period frequency divider 112 is selected on the basis of the signal 37b supplied from the frequency dividing control part 37. A signal applied to an input terminal P161 corresponds to the signal 37a shown in FIGS. 16 and 25, and a signal output via an output terminal P162 corresponds to the signal 34a shown therein. The circuit configuration shown in FIG. 38 employs the two different frequency dividers (the short-period and long-period frequency dividers), but may be implemented by any of various types of frequency divider.

The frequency dividing control part 37 is made up of gates G141–G146, to which signals A, B, C and D are applied as shown in FIG. 38. The control signal 37a to be supplied to the selector 113 depends on the values of the signals A–D. The selector 113 selects the output signal of the short-period frequency divider 111 when the output signal of the gate G146 is at the low level, and selects the output signal of the long-period frequency divider 112 when the output signal of the gate G146 is at the high level. The signal A is at the low level at the time of power on. The signal B is at the low level when there is no need to increase or decrease the number of stages of the second delay part 22 on the basis of the output of the second phase comparator part 26. The signal C is at the low level when there is no need to increase or decrease the number of stages of the first delay part 21 on the basis of the output of the first phase comparator part 25. The signal D is the clock signal 34c.

At the time of power on, the gate G144 outputs the high-level signal in response to the low-level pulse signal A. Thus, the gate G146 outputs the low-level signal, and the selector 113 of the frequency divider 38 selects the output signal of the short-period frequency divider 111.

When the signals B and C are set to the high level on the basis of the results of the phase comparing operations of the first and second phase comparing parts 25 and 26, the gate G144 outputs the low-level signal, and the gate G143 outputs the high-level signal. Thus, the gate G146 outputs the low-level signal, and the selector 113 of the frequency divider 38 selects the output signal of the short-period frequency divider 111.

If the results of the phase comparing operations of the first and second delay parts 21 and 22 show that there is no need to increase or decrease the numbers of stages of the first and second delay parts 21 and 22, the signals B and C are switched to the low level. Hence, the gates G144 and G143 output the low-level signals, and then the gate 146 outputs the high-level signal. Thus, the selector 113 of the frequency divider 38 selects the output signal of the long-period frequency divider 112.

FIGS. 39 through 44 show power supply systems which can be employed in the semiconductor integrated circuit device of the present invention.

Figure 39:
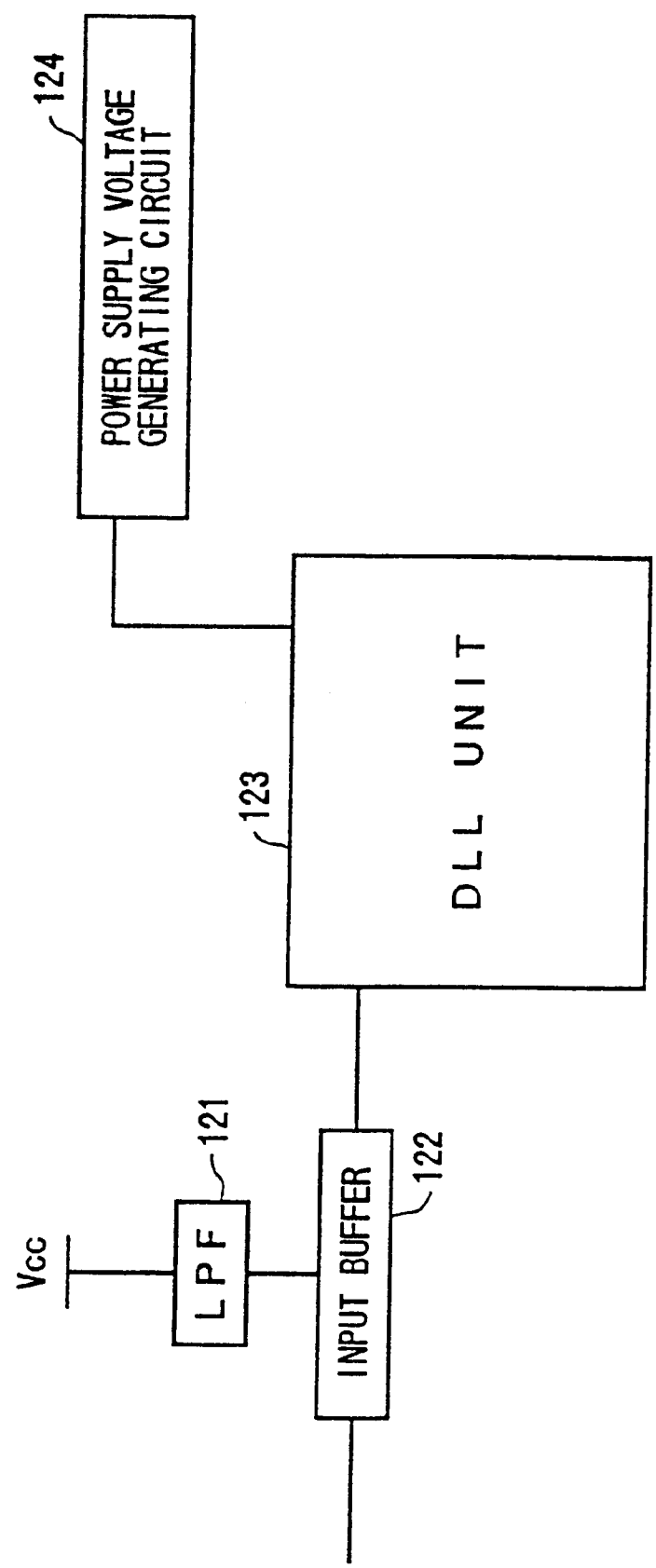
FIGS. 39, 40, 41, 42, 43 and 44 are respectively block diagrams of power supply systems applicable to the semiconductor integrated circuit device according to the present invention.

The power supply system shown in FIG. 39 has a low-pass filter (LPF) 121 via which an input buffer 122 is coupled to a power supply Vcc. Hence, noise which may be contained in the external clock can be eliminated, and a signal having a level which can stably be interfaced with an internal circuit can be generated. Such a signal can be used as an external clock, which can be applied to a DLL unit 123 having the phase control function. The semiconductor integrated circuit device has a power supply voltage generating circuit 124, which steps down an external power supply voltage. A resultant step-down voltage is used to drive the DLL unit 123. Hence, the internal circuit of the semiconductor device can stably be supplied with electricity.

Figure 40:
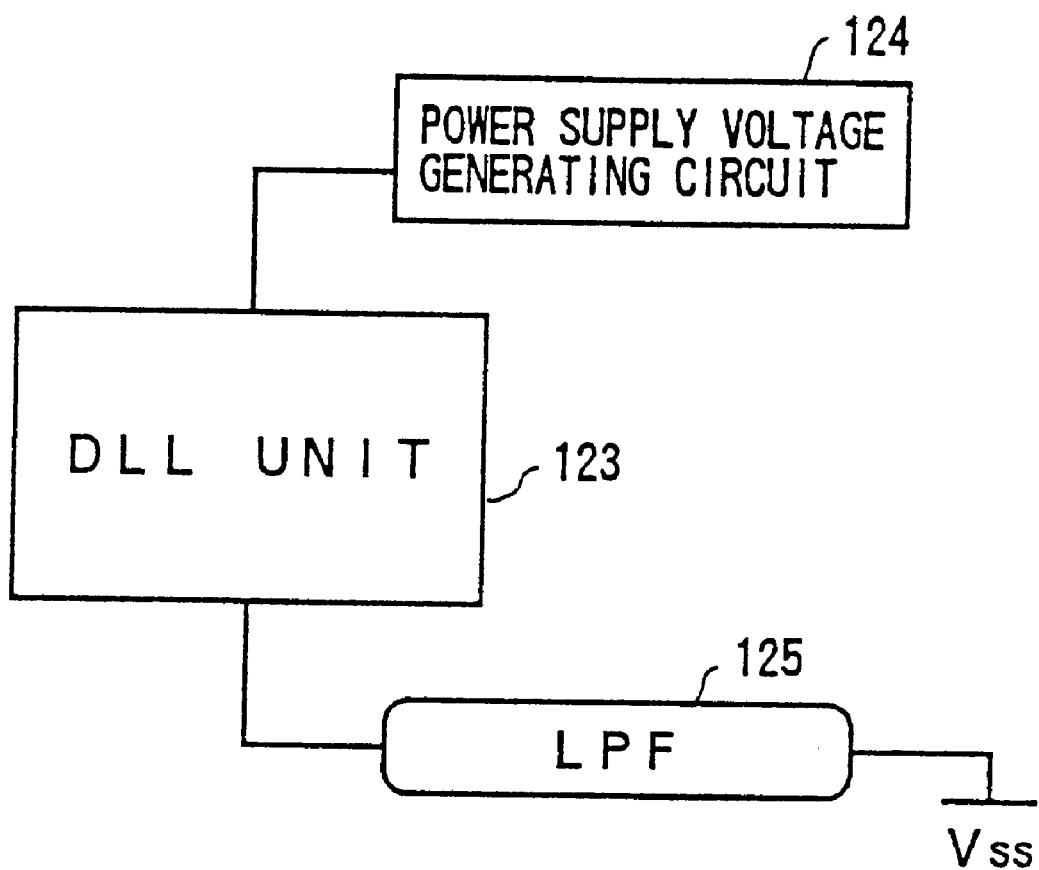
Figure 41:
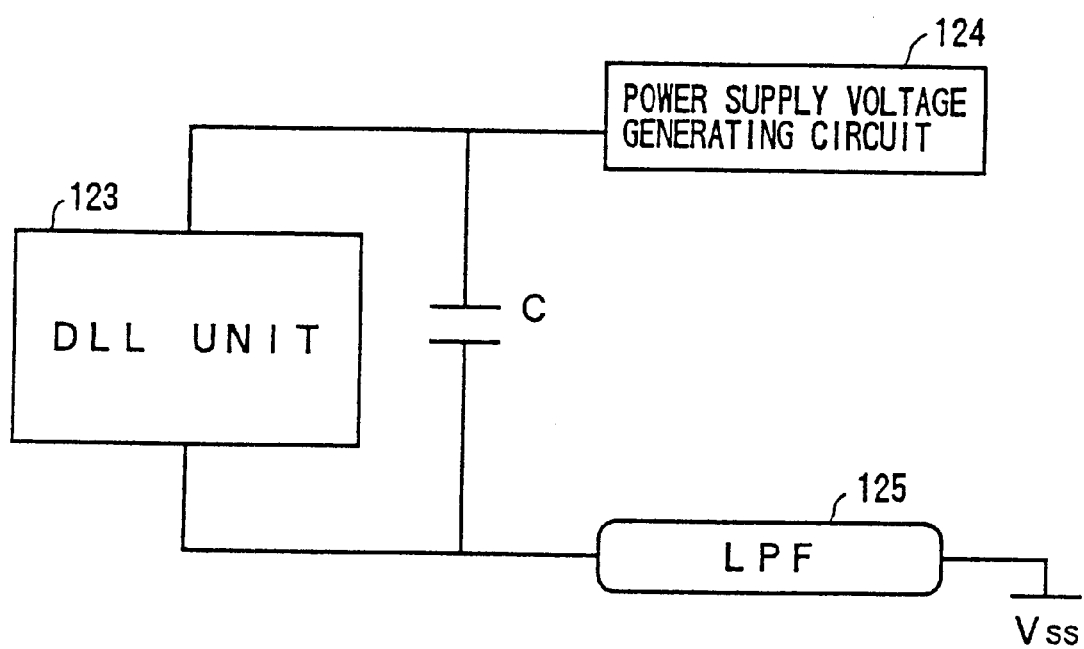

The power supply system shown in FIG. 40 has a low-pass filter (LPF) 125, via which the DLL unit 123 is grounded. The power supply system shown in FIG. 41 employs a capacitor C provided between the output terminal of the power supply voltage generating circuit 124 and the input terminal of the low-pass filter 125. The power supply systems shown in FIGS. 40 and 41 are capable of more stably supplying the internal circuit with electricity.

Figure 42:
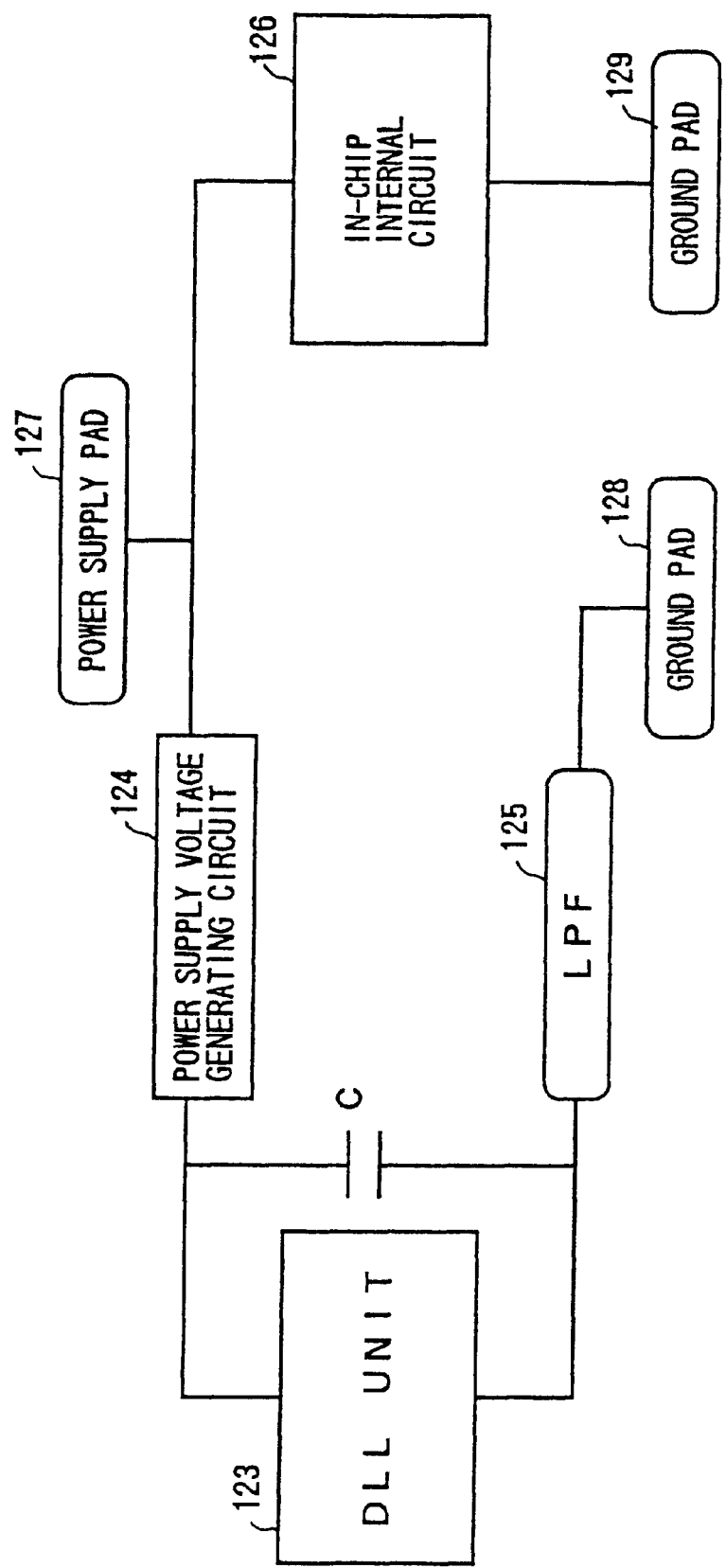
Figure 43:
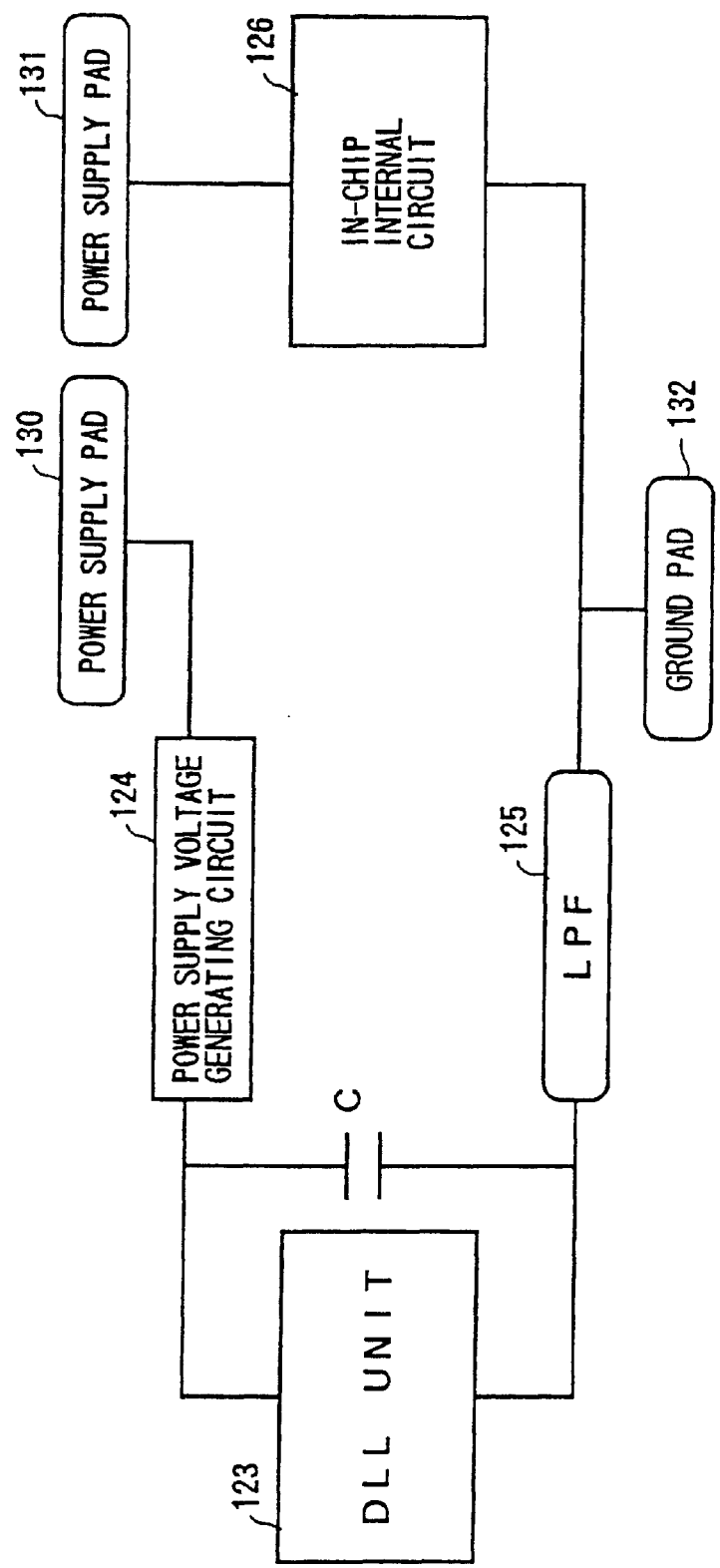
Figure 44:
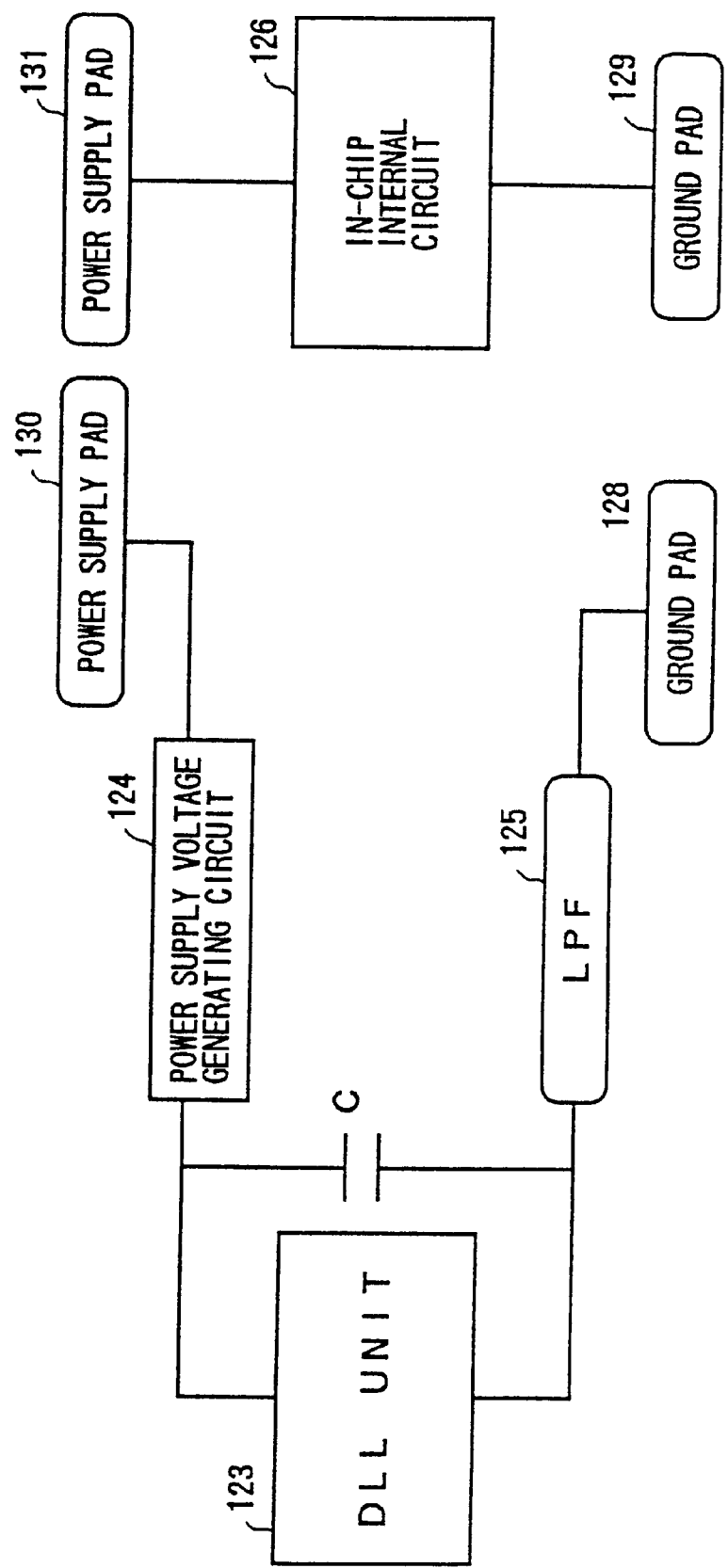

The power supply system shown in FIG. 42 has an arrangement in which a ground pad 128 for grounding the low-pass filter 125 is provided separately from a ground pad 129 for grounding an in-chip internal circuit 126. A power supply pad 127 is commonly provided to supply the circuits 124 and 126 with electricity. The power supply system shown in FIG. 43 has an arrangement in which a power supply pad 130 for supplying the power supply voltage generating circuit 124 with electricity is provided separately from a power supply pad 131 for supplying the in-chip internal circuit 126 other than the DLL unit 123 with electricity. Further, a ground pad 132 is commonly provided to the circuits. The power supply system shown in FIG. 44 has an arrangement in which the pads 128 and 130 for the DLL unit 123 are provided separately from the pads 129 and 131 for the in-chip internal circuit 126. The power supply systems shown in FIGS. 42 through 44 can interrupt noise from the in-chip internal circuit 126 and the stability of power supply can further be facilitated.

The present invention is not limited to the specifically disclosed embodiments, and variations and modifications may be made without departing from the scope of the present invention.

What is claimed is:

1. A semiconductor integrated circuit device comprising:
   a first variable delay circuit receiving an input clock signal and having first delay circuits each capable of delaying an input signal, the first variable delay circuit having a plurality of stages of said first delay circuits;
   a second variable delay circuit, coupled to the first delay circuit and outputting an output clock signal, wherein the second delay circuit has second delay circuits, each having a signal delay function having a precision higher than that of the first variable delay circuit, the second variable delay circuit having a plurality of stages of said second delay circuits;
   first and second phase comparator circuits respectively performing phase comparing operations on the input clock signal and the output clock signal with respective precisions of the first and second variable delay circuits;
   first and second delay control circuits respectively controlling delay times of the first and second variable delay circuits on the basis of results of the phase comparing operations; and
   a number-of-stages setting circuit determining a number of stages of the second variable delay circuit on the basis of a first delay time obtained when the input clock signal passes through n stages of the second variable delay circuit and a second delay time obtained when the input clock signal passes through n+1 stages thereof.

2. The semiconductor integrated circuit device as claimed in claim 1, wherein the number-of-stages setting circuit determines the number of stages so that a delay time equal to one stage of the first variable delay circuit is equal to or greater than the first delay time but equal to or less than the second delay time.

3. The semiconductor integrated circuit device as claimed in claim 1, wherein the first and second variable delay circuits are connected in this order or vice versa.

4. The semiconductor integrated circuit device as claimed in claim 1, wherein:
   the first and second delay control circuits control the first and second variable delay circuits to increase the number of stages of the first variable delay circuit by one and decrease the delay time of the second variable delay circuit in a case where there is a need to provide a delay time exceeding a maximum delay time of the second variable delay circuit; and
   the first and second delay control circuits control the first and second variable delay circuits to decrease the number of stages of the first variable delay circuit by one and increase the delay time of the second variable delay circuit in a case where there is a need to provide a delay time less than a minimum delay time of the second variable delay circuit.

5. The semiconductor integrated circuit device as claimed in claim 1, wherein the delay time of one stage of the first variable delay circuit is adjusted by an external command.

6. The semiconductor integrated circuit device as claimed in claim 1, wherein a time equal to the precision of the first phase comparator circuit is longer than the delay time of one stage of the first variable delay circuit.

7. The semiconductor integrated circuit device as claimed in claim 1, wherein the first phase comparator circuit has a reference for varying the delay time, said reference being located within a range equal to one stage of the first variable delay circuit, said period starting from a rising edge of one of the input and output clock signals.

8. The semiconductor integrated circuit device as claimed in claim 1, wherein the second phase comparator circuit has a reference for varying the delay time, said reference being located within a range equal to one stage of the second variable delay circuit, said period starting from a rising edge of one of the input and output clock signals.

9. The semiconductor integrated circuit device as claimed in claim 1, further comprising a timing generating circuit which defines a timing for the phase comparing operations of the first and second phase comparator circuits.

10. The semiconductor integrated circuit device as claimed in claim 1, further comprising first and second shift signal generating circuits which generate first and second shift signals which instruct the first and second delay control circuits to vary the delay times of the first and second variable delay circuits on the basis of results of the phase comparing operations by the first and second phase comparator circuits.

11. The semiconductor integrated circuit device as claimed in claim 1, wherein the first and second shift signal generating circuits instruct the first and second delay control circuits to vary the delay times at respective timings.

12. The semiconductor integrated circuit device as claimed in claim 1, further comprising a frequency dividing circuit which frequency-divides an external clock signal so that a reference signal used in the phase comparing operations by the first and second phase comparator circuits can be generated.

13. The semiconductor integrated circuit device as claimed in claim 12, wherein the frequency dividing circuit has a frequency dividing ratio which is increased when the results of the phase comparing operations of the first and second phase comparator circuits show that there is no need to vary the delay times of the first and second variable delay circuits and which is decreased when the result of the phase comparing operation of the first phase comparator circuit shows that there is a need to vary the delay time of the first variable delay circuit.

14. The semiconductor integrated circuit device as claimed in claim 12, wherein the frequency dividing circuit has a frequency dividing ratio which is decreased when the result of the phase comparing operation of the second phase comparator circuit shows there is a need to vary the delay time of the second variable delay circuit and change the number of stages thereof in an identical direction a plurality of number of times.

15. The semiconductor integrated circuit device as claimed in claim 14, wherein said plurality of number of times is set by an external command.

16. The semiconductor integrated circuit device as claimed in claim 1, further comprising:
a frequency dividing circuit which frequency-divides an external clock signal; and
third phase comparator circuit comparing the external clock signal with a clock signal from the first or second variable delay circuit and instructing the frequency dividing circuit to successively change a frequency dividing ratio on the basis of a result of a phase comparing operation of the third phase comparator circuit.

17. The semiconductor integrated circuit device as claimed in claim 16, wherein the third phase comparator circuit instructs the frequency dividing circuit to increase the frequency dividing ratio when the third phase comparator circuit judges that there is no need to vary the delay times of the first and second variable delay circuits.

18. The semiconductor integrated circuit device as claimed in claim 16, wherein the third phase comparator circuit instructs the frequency dividing circuit to decrease the frequency dividing ratio when the third phase comparator circuit judges that there is a need to vary the delay times of the first and second variable delay circuits.

19. The semiconductor integrated circuit device as claimed in claim 16, wherein the third phase comparator circuit instructs the frequency dividing circuit to decrease the frequency dividing ratio when the third phase comparator circuit judges that there is a need to vary the delay times of the first and second variable delay circuits and successively change the number of stages thereof in an identical direction a plurality of number of times.

20. The semiconductor integrated circuit device as claimed in claim 19, wherein said plurality of number of times is set by an external command.

21. The semiconductor integrated circuit device as claimed in claim 12, wherein the frequency dividing circuit has a frequency dividing ratio which is decreased at the time of power on.

22. The semiconductor integrated circuit device as claimed in claim 1, wherein the first variable delay circuit has a predetermined delay time at the time of power on.

23. The semiconductor integrated circuit device as claimed in claim 1, wherein the second phase comparator circuit stops operating while the number of stages of the first variable delay circuit is being adjusted on the basis of the result of the phase comparing operation of the first phase comparing circuit.

24. The semiconductor integrated circuit device as claimed in claim 1, further comprising an input circuit outputting an internal clock signal synchronized with an external clock signal, the internal clock signal being applied to an internal circuit of the semiconductor integrated circuit device.

25. The semiconductor integrated circuit device as claimed in claim 24, further comprising a low-pass filter via which electricity is supplied to the internal circuit.

26. The semiconductor integrated circuit device as claimed in claim 1, further comprising a power supply voltage generating circuit which steps down an external power supply voltage, a resultant step-down voltage being applied to a DLL circuit having the first and second variable delay circuits, the first and second phase comparing circuits, the first and second delay control circuits and the number-of-stages setting circuit.

27. The semiconductor integrated circuit device as claimed in claim 26, further comprising a low-pass filter via which the DLL circuit is grounded.

28. The semiconductor integrated circuit device as claimed in claim 27, further comprising a capacitor connected in parallel with the DLL circuit.

29. The semiconductor integrated circuit device as claimed in claim 27, further comprising a pad for making an external connection to the low-pass filter, so that the low-pass filter is grounded via said pad.

30. The semiconductor integrated circuit device as claimed in claim 26, further comprising a pad specifically used to supply external electricity to the power supply voltage generating circuit.

31. The semiconductor integrated circuit device as claimed in claim 27, further comprising a first pad specifically provided for grounding the power supply voltage generating circuit and a second pad specifically provided for grounding the low-pass filter.

* * * * *